(12) United States Patent
Noguchi et al.

(10) Patent No.: US 7,592,666 B2
(45) Date of Patent: Sep. 22, 2009

(54) SEMICONDUCTOR MEMORY

(75) Inventors: Mitsuhiro Noguchi, Yokohama (JP); Akira Goda, Yokohama (JP); Masayuki Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/850,408

(22) Filed: May 21, 2004

(65) Prior Publication Data
US 2005/0006696 A1 Jan. 13, 2005

(30) Foreign Application Priority Data
Jun. 4, 2003 (JP) ............................. 2003-160118

(51) Int. Cl.
*H01L 29/792* (2006.01)

(52) U.S. Cl. ............... 257/324; 257/326; 257/E29.309; 257/E21.423; 438/216; 438/287; 365/184; 365/185.33

(58) Field of Classification Search ........................ None
See application file for complete search history.

(56) References Cited

U.S. PATENT DOCUMENTS

| 5,286,994 | A |   | 2/1994  | Ozawa et al. ............... 257/411 |
| 5,844,270 | A | * | 12/1998 | Kim et al. .................. 257/315 |
| 5,981,404 | A | * | 11/1999 | Sheng et al. ................ 438/791 |
| 6,040,995 | A |   | 3/2000  | Reisinger et al. ........ 365/185.18 |
| 6,137,718 | A |   | 10/2000 | Reisinger ............... 365/185.03 |
| 6,445,030 | B1 |  | 9/2002  | Wu et al. .................. 257/315 |
| 6,469,343 | B1 | * | 10/2002 | Miura et al. ................ 257/324 |
| 6,839,278 | B1 | * | 1/2005  | Lee et al. ............... 365/185.17 |
| 6,885,060 | B2 | * | 4/2005  | Nomoto et al. ............. 257/324 |
| 2003/0042558 | A1 | * | 3/2003 | Noguchi et al. ............. 257/406 |
| 2003/0232507 | A1 | * | 12/2003 | Chen ......................... 438/763 |

FOREIGN PATENT DOCUMENTS

| JP | 5-82795     | 4/1993 |
| JP | 10-247692   | 9/1998 |
| JP | 11-008325   | 1/1999 |
| JP | 11-40682    | 2/1999 |
| JP | 2002-009181 | 1/2002 |
| JP | 2003-078043 | 3/2003 |

OTHER PUBLICATIONS

G. Pacchioni, et al., Physical Review B, vol. 64, pp. 155201-1-155201-7, "Electronic Structure of the Paramagnetic Boron Oxygen Hole Center in B-Doped $SiO_2$", 2001.

* cited by examiner

*Primary Examiner*—Andy Huynh
*Assistant Examiner*—Hoang-Quan T Ho
(74) *Attorney, Agent, or Firm*—Oblon, Spivak, McClelland, Maier & Neustadt, P.C.

(57) ABSTRACT

A semiconductor memory having an electrically writable/erasable memory cell includes a first gate insulating layer made from a compound containing silicon and oxygen; a first charge-storage layer being in contact with the first gate insulating layer made from a silicon nitride film, a silicon oxynitride film, or an alumina film; a second insulating layer thicker than the first gate insulting layer; a second charge-storage layer being in contact with the second insulating layer; a third insulating layer thicker than the first gate insulating layer being in contact with the second charge-storage layer; and a control electrode upon the third insulating layer.

6 Claims, 39 Drawing Sheets

SEMICONDUCTOR MEMORY

CROSS REFERENCE TO RELATED APPLICATIONS

This application is based upon and claims the benefit of priority from prior Japanese Patent Application P2003-160118 filed on Jun. 4, 2003 the entire contents of which are incorporated by reference herein.

BACKGROUND OF THE INVENTION

1. Field of the Invention

The present invention relates to a semiconductor memory, which has insulating layers and charge storage layers that improve erasure characteristics of a memory cell having insulating layers and charge storage layers, while achieving even higher integration.

2. Description of the Related Art

A nonvolatile semiconductor memory such as electrically erasable programmable read-only memory (EEPROM) or the like has been developed. With such kind of memory, charges injected from a channel into a charge storage electrode via an insulating layer, due to tunneling current, are stored as digital information. The change in a metal-oxide semiconductor memory cell transistor (MOSFET) conductance that corresponds to the quantity of that charge is measured, and information is read out. Particularly, there has been extensive research due to the fact that metal-oxide-nitride-oxide-semiconductor (MONOS) memory is a memory that uses a nitride (SiN) film as a charge storage layer. Such a charge storage layer is used where there is a possibility that the programming operation or the erasure operation can be implemented at a lower voltage than, for example, memory using a floating gate made from polysilicon.

In this case, MONOS memory, for example, as described in U.S. Pat. Nos. 6,137,718 and 6,040,995 has a structure stacked in the order of a semiconductor substrate, a silicon oxide film (first silicon oxide film) through which charges are intended to pass, a silicon nitride film (charge storage layer), a silicon oxide film (second silicon oxide film), which blocks currents from flowing between the silicon nitride film and a polysilicon region, and the polysilicon region.

However, with conventional MONOS memory, since the difference in the second silicon oxide film thickness and the first silicon oxide film thickness is small, the electrons of the control electrode are injected into the charge storage layer upon erasure that utilizes injection of holes from the semiconductor substrate into the charge storage layer. Accordingly, since a large erasure voltage increases the quantity of the injected electrons in the control electrode to be almost equivalent to the quantity of the injected holes, there was a problem where the erasure threshold voltage would not become lower than a specific value, that is, would not sufficiently decrease. Therefore, there was a difficult problem of sufficiently securing isolation of the programming threshold voltage and the erasure threshold voltage.

In addition, in the case of injecting holes using the current passing through the first silicon oxide film as the tunneling current, there was a problem where, due to an increase in the quantity of the injected electrons that pass through the second silicon oxide film, the increase in the quantity of the positive charges in the charge storage layer was reduced, resulting in a longer erasure time.

Furthermore, Japanese Laid-Open Patent Application No. Hei 5-82795 and U.S. Pat. No. 5,286,994 provide a structure in which the charge storage layer is assumed to be a multi-layered stacked layer, where the film thickness becomes thicker as the charge storage layer is farther from the first gate insulating layer. Specific conditions for the structure and film thickness of the film that blocks currents from flowing between the silicon nitride film and the polysilicon region, and the problem that electrons of the control electrode are injected into the charge storage layer upon erasure are not disclosed in the above-described patent documents. Moreover, Japanese Laid-Open Patent Application No. Hei 11-40682 discloses an example where the second insulating layer is a stacked layer configured with a silicon nitride film subjected to thermal oxidation, and a deposited silicon oxide film. The application also does not disclose specific conditions for the structure and film thickness regarding how to form the stacked layer relative to the problem that electrons of the control electrode are injected into the charge storage layer upon erasure.

The experimental fact that the inventers discovered a charge centroid position in the erase saturation state using a band structural diagram of the MONOS structure has already been disclosed in Japanese Laid-open Patent Application No. 2003-078043.

In addition, the fact that doping boron to an insulating layer including SiO permits the insulating layer function as an acceptor (electron trap), having negative charges is reported in G. Pacchioni and M. Vezzoli, "Electronic structure of the paramagnetic boron oxygen hole center in B-doped $SiO_2$,", Physical Review B, Vol. 64, pp. 155201-155207, for example.

As described above, with the conventional MONOS memory cell structure, if the erasure voltage was increased to carry out high-speed erasure operations, there was the problem of insufficient reduction in the erasure threshold voltage. Furthermore, there was a problem where due to an increase in the quantity of the injected electrons that pass through the second silicon oxide film, the quantity of positive charge in the charge storage layer was reduced, resulting in a longer erasure time.

SUMMARY OF THE INVENTION

An aspect of the present invention inheres in a semiconductor memory with an electrically writable/erasable memory cell having a gate insulating layer including: (a) a first gate insulating layer, which is made from a compound containing at least silicon and oxygen; (b) a first charge storage layer, which is being in contact with the first gate insulating layer, and is made from a silicon nitride film, a silicon oxynitride film, or an alumina film; (c) a second insulating layer, which is thicker than the first gate insulating layer; (d) a second charge storage layer, which is being in contact with the second insulating layer; (e) a third insulating layer, which is being in contact with the second charge storage layer, and is thicker than the first gate insulating layer; and (f) a control electrode, which is formed upon the third insulating layer.

Another aspect of the present invention inheres in a semiconductor memory with an electrically writable/erasable memory cell having a gate insulating layer including: (a) a first gate insulating layer, which is made from a compound containing at least silicon and oxygen; (b) a first charge storage layer, which is being in contact with the first gate insulating layer, and is made from a silicon nitride film, a silicon oxynitride film, or an alumina film; (c) a second insulating layer having a film thickness of more than 3 nm, (d) a second charge storage layer, which is being in contact with the second insulating layer; (e) a third insulating layer having a film thickness of more than 3 nm, which is being in contact with the second charge storage layer; and (f) a control electrode, which is formed upon the third insulating layer.

A further aspect of the present invention inheres in a semiconductor memory with an electrically writable/erasable memory cell having a gate insulating layer including: (a) a first gate insulating layer, which is made from a compound containing at least silicon and oxygen; (b) a first charge storage layer, which is being in contact with the first gate insulating layer, and is made from a silicon nitride film, a silicon oxynitride film, or an alumina film; (c) a second insulating layer, (d) a fourth insulating layer, which is being in contact with the second insulating layer, where the maximum volume density of boron is greater than the maximum volume density of boron in the second insulating layer; (e) a third insulating layer, which is being in contact with the fourth insulating layer, where the maximum volume density of boron is lower than the maximum volume density of boron in the fourth insulating layer; and (f) a control electrode which is formed upon the third insulating layer.

DETAILED DESCRIPTION OF THE EMBODIMENTS

Embodiments of the present invention are described in detail forthwith while referencing the drawings. A characteristic point of the embodiments is that with a memory cell having insulating layers and charge storage layers, a region is arranged at the top of the insulating layers for storing negative charges, where a metal-oxide-nitride-oxide-nitride-oxide-semiconductor (MONONOS) structure for reducing the erasure threshold voltage in a memory having silicon nitride films is implemented. It should be noted that in the structure of the embodiments of the present invention, the insulating layers are stacked relative to a conventional metal-oxide-nitride-oxide-semiconductor (MONOS) structure, and is called a "MONONOS" structure from a structural characteristic point of view. The present invention provides a semiconductor memory, which has a characteristic memory cell structure having insulating layers and charge storage layers that allow high-speed erase operation and reduction in the erasure threshold value.

First Embodiment

Figure 1:
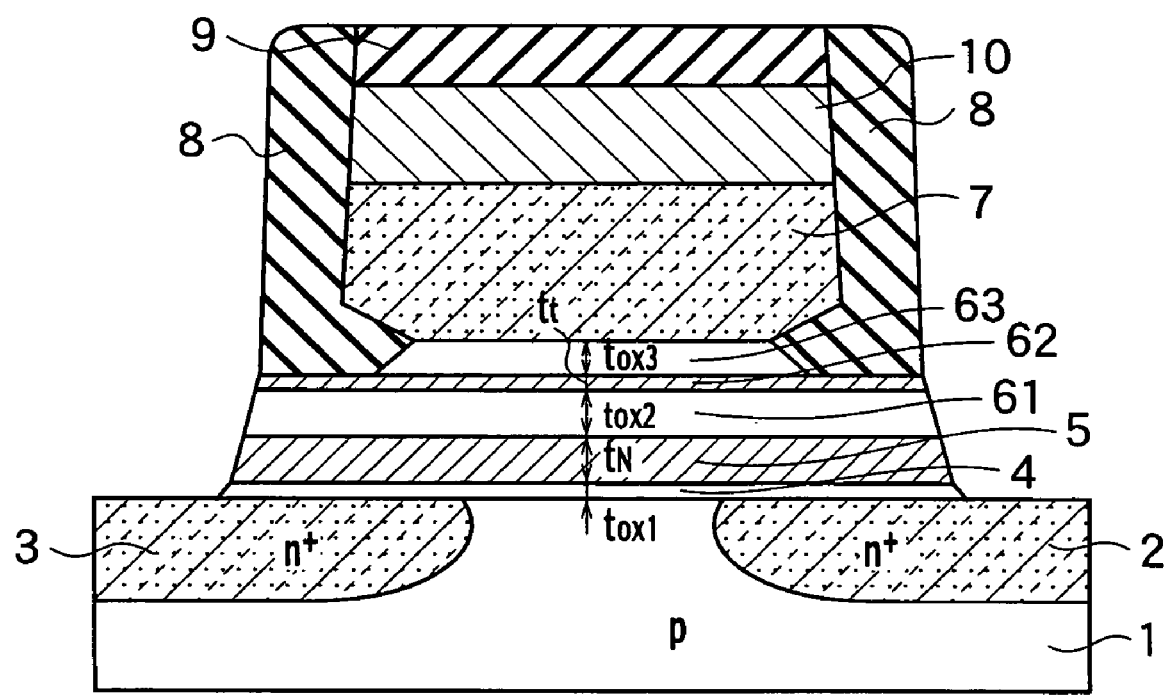
FIG. 1 shows a schematic cross-sectional structure of a semiconductor memory according to a first embodiment of the present invention.

FIG. 1 shows an exemplary structure of a semiconductor memory according to the first embodiment of the present invention. The structure of this embodiment has a feature that, in comparison with a conventional example, has a second charge storage layer 62, for storing negative charges injected from a gate and is arranged in a portion of a second insulating layer corresponding to reference numeral 6 in FIG. 3. In FIG. 1, a first gate insulating layer 4, which is, for example, made from a silicon oxide film or an oxynitride film having a thickness of 0.5 nm to 10 nm, is formed on a p-type silicon semiconductor region 1 where the boron or indium impurity concentration is between $10^{14}$ cm$^{-3}$ and $10^{19}$ cm$^{-3}$, for example. In this case, $t_{ox1}$ denotes the thickness of the flat portion of the first gate insulating layer 4, and $\in_{ox1}$ denotes a dielectric constant of the first gate insulating film. In addition, a first charge storage layer 5 having a thickness of 3 nm to 20 nm, which is made from a silicon nitride film, a silicon oxynitride film, or an alumina film, for example, is formed on the top side of the first gate insulating layer 4. In this case, $t_N$ denotes the thickness of the flat portion of the first charge storage layer 5, and $\in_N$ denotes the dielectric constant of the first charge storage film. Upon this is stacked a first block insulating layer (second insulating layer) 61 having a thickness of 3 nm to 30 nm, which is made from a silicon oxide film, an oxynitride film, an alumina ($Al_2O_3$) film, a zirconium silicon oxide film (ZrSiO film), a hafnium silicon oxide film (HfSiO film), a zirconium silicon oxynitride film (ZrSiON film), or a hafnium silicon oxynitride film (HfSiON film), for example. In this case, $t_{ox2}$ denotes the thickness of the flat portion of the first block insulating layer (second insulating layer) 61, and $\in_{ox2}$ denotes the dielectric constant of the first block insulating film. In addition, a second charge storage layer 62 which is, for example, made from a silicon nitride film or a silicon oxynitride film, is formed with a thickness of 0.5 nm to 10 nm. In this case, $t_t$ denotes the thickness of the flat portion of the second charge storage layer 62, and $\in_t$ denotes the dielectric constant. Upon this is further stacked a second block insulating layer (third insulating layer) 63 having a thickness of 3 nm to 30 nm, which is made from a silicon oxide film, an oxynitride film, an $Al_2O_3$ film, a ZrSiO film, an HfSiO film, a ZrSiON film, or an HfSiON film, for example. In this case, $t_{ox3}$ denotes the thickness of the flat portion of the second block insulating layer (third insulating layer) 63, and $\in_{ox3}$ denotes the dielectric constant of the second block insulating film. In this case, the first block insulating layer 61 functions so as to block electrons stored in the second charge storage layers 62 from flowing into the first charge storage layer 5 when under an erasing stress. The erasing stress means a high-voltage stress applied at an erasure mode of operation. In this case, it is possible to reduce the amount of electric current that flows through the first block insulating layer 61 and second block insulating layer 63 to be less than the amount of electric current that flows through the first gate insulating layer 4 by making the first block insulating layer 61 and the second block insulating layer 63 thicker than the first gate insulating layer 4, which is made from a silicon oxide film or oxynitride film. Therefore, the first block insulating layer 61 and the second block insulating layer 63 are ideal for preventing charges leaking from the second charge storage layer 62. Moreover, if the first block insulating layer 61 and the second block insulating layer 63 are made from either a silicon oxide film or an oxynitride film, by making both thicknesses greater than 3 nm, Fowler-Nordheim (FN) current may be made to flow instead of direct tunneling current in the case where the programming or the erasure electric field is applied when charge carriers are electrons, and an amount of conducting current is preferably kept low. In this case, with the silicon oxide film or the oxynitride film, the height of the barrier for holes at the end of the silicon semiconductor valence band is at least 1 eV higher than the height of the barrier for conduction electrons at the end of the silicon semiconductor conduction band. Therefore, it is possible to make conduction electron current flow as almost all of the current that flows through the silicon oxide film or the oxynitride film by making the film thickness greater than 3 nm. Accordingly, the first block insulating layer 61 and second block insulating layer 63, which are made from either a silicon oxide film or an oxynitride film, are preferable since by making both thicknesses greater than 3 nm, negative charges, not holes, may flow as the current when applying the programming or the erasure electric field, and electrons, or negative charges may be selectively stored in the second charge storage layer 62. In addition, the second charge storage layer 62 functions so as to store electrons when erasing high voltage stress is applied, and to make the electric field of the second block insulating layer 63 upon erasure to be smaller than the electric field of the first block insulating layer 61. In addition, the electron affinity of the first block insulating layer 61 or the second block insulating layer 63 must be smaller than that of the second charge storage layer 62. That is the height of the barrier of the second charge storage layer 62 for the conduction electrons must be lower in order to prevent the charges from flowing out from the second charge storage layer 62. This allows the desirable electron affinity relationship by making the oxygen composition of the first block insulating layer 61 and the second block insulating layer 63 to be greater than that of the second charge storage layer 62, when the first block insulating layer 61 and the second block insulating layer 63 are either a silicon oxide film or an oxynitride film, and the second charge storage layer 62 is a silicon oxynitride film. Similarly, it is possible to prevent the charges from flowing out from the first charge storage layer 5 by making the oxygen composition of the first block insulating layer 61 or the first gate insulating layer 4 greater than that of the first charge storage layer 5, when the first block insulating layer 61 and the first gate insulating layer 4 are either a silicon oxide film or an oxynitride film, and the first charge storage layer 5 is a silicon oxynitride film.

A control electrode 7 is formed having a thickness of 10 nm to 500 nm, which is doped with boron (B), arsenic (As), or phosphorus (P) in the impurity concentration range of $1\times10^{19}$ $cm^{-3}$ to $1\times10^{21}$ $cm^{-3}$. In this case, when boron is doped to the control electrode 7, making the boron concentration less than $1\times10^{20}$ $cm^{-3}$ desirably prevents anomalous diffusion of the boron into the silicon oxide film, and stabilizes threshold voltages for simultaneously formed PMOS electric field transistors. In addition, making the boron concentration of the control electrode 7 more than $1\times10^{19}$ $cm^{-3}$ avoids depletion of the control electrode 7 and reduction of the effective electric field over ONONO stacked layers. Therefore, it is desirable for preventing increases in erase time.

In addition, when the silicon oxide film or the silicon oxynitride film is used as the first gate insulating layer 4, because the height of the barrier for the holes is higher than the height of the barrier for the electrons, the layer must be made thinner for the tunneling phenomenon to occur, where at least a thin film of less than 3.5 nm is needed in order to obtain sufficient hole-tunneling current for erasure. Accordingly, in order to inject the holes from the p-type silicon semiconductor region 1 into the first charge storage layer 5 by using the direct tunneling phenomenon, it is desirable that the thickness $t_{ox1}$ of the flat portion of the first gate insulating layer 4 be limited to less than 3.5 nm.

Furthermore, a metal-lined layer 10 having a thickness of 10 nm to 500 nm, which is made from, for example, tungsten silicide (WSi) or nickel silicide (NiSi), molybdenum silicide (MoSi), titanium silicide (TiSi), cobalt silicide (CoSi), tungsten (W), or aluminum (Al), may be formed on this control electrode 7. The control electrode 7 is made from a polysilicon, where a plurality of the control electrode 7 are connected together with low resistance by the metal-lined layer 10.

In addition, an insulating layer 9 having a thickness of 5 nm to 500 nm, which is made from a silicon nitride film or a silicon oxide film, for example, is formed on that metal-lined layer 10. Furthermore, a sidewall insulating layer 8 having a thickness of 2 nm to 200 nm, which is made from a silicon nitride film or a silicon oxide film, for example, is formed on both sides of the control electrode 7. Electrical isolation between the control electrode 7 and a source region 2 or a drain region 3 can be achieved by the sidewall insulating layers 8 and the insulating layer 9. Electrical isolation between the control electrode 7 and contacts CBL or CSL can be achieved by the sidewall insulating layers 8 and the insulating layer 9. Electrical isolation between the control electrode 7 and a top-side wiring layer, such as bit lines 36, is preserved by the sidewall insulating layers 8 and the insulating layer 9. In addition, it is possible to reduce damage at the sides of the control electrode 7 due to ion implantation by performing n-type ion implantation in order to create the source region 2 and the drain region 3 provided between the sidewall insulating layers 8. It should be noted that the contacts and the top-side wiring layer are not considered principal structural components of this embodiment, and are therefore omitted in the drawings. It should be noted that in this embodiment, in order to reduce the threshold voltage range from increasing due to variation in the programming and the erasure electric fields, it is desirable that the insulating layers 4, 5, 61, 62, and 63 are formed with a uniform film thickness extending from the boundary of the p-type silicon semiconductor region 1 and the source region 2 to the boundary of the p-type silicon semiconductor region 1 and the drain region 3.

Moreover, the source region 2 and the drain region 3 are formed respectively so as to sandwich a region being in contact with the p-type silicon semiconductor substrate 1 and the first gate insulating layer 4. EEPROM memory cells, which contain a quantity of charge stored in the first charge storage layer 5 as information, are configured with such source region 2, drain region 3, first charge storage layer 5, and control electrode 7, and their gate length is 0.01 μm to 0.5 μm. Such source region 2 and drain region 3 are formed through a diffusion or ion implantation method at a depth between 10 nm to 500 nm so that the surface concentration of, for example, phosphorus, arsenic, or antimony is $10^{17}$ cm$^{-3}$ to $10^{21}$ cm$^{-3}$.

It should be noted that the source region 2 and the drain region 3 described above are mnemonic names corresponding to the source region and drain region of a metal-oxide semiconductor field-effect transistor (MOSFET); one of the regions is called a drain, and the other a source since they are formed symmetrically. Generally, these regions may also be called a "first terminal region" and a "second terminal region". In this case, for example, if the source region 2 is given as the "first terminal region", the drain region 3 is the "second terminal region".

Figure 2:
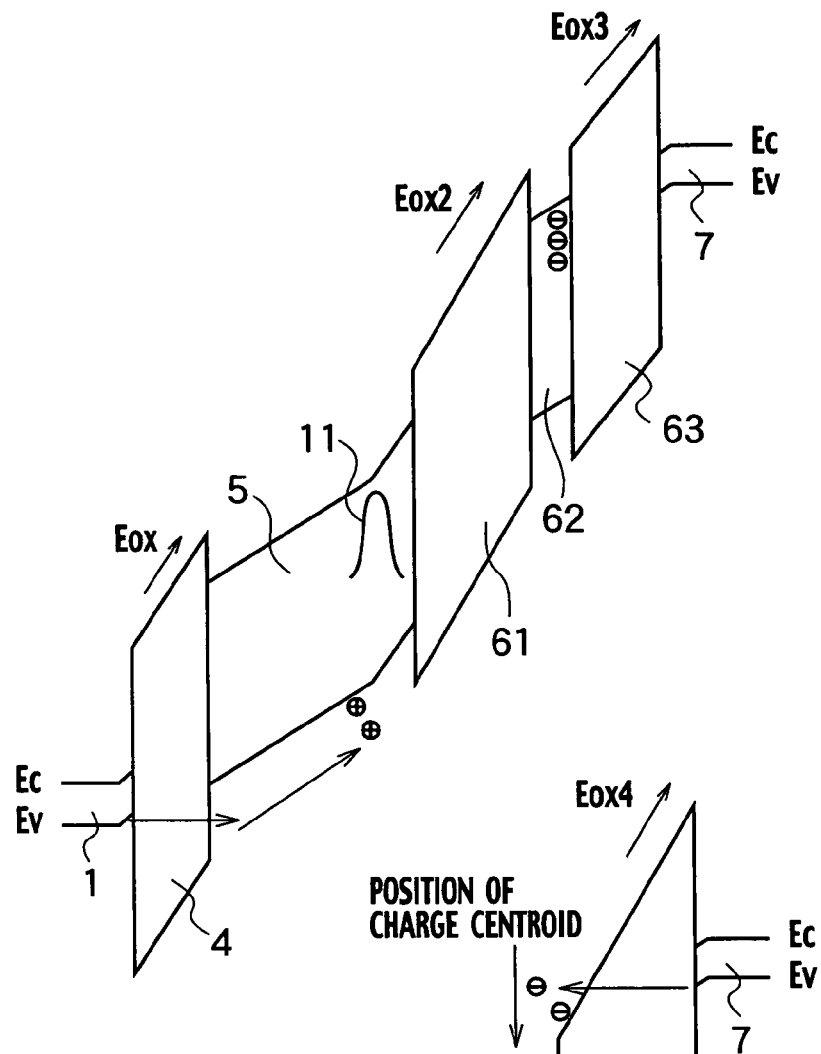
FIG. 2 is a band structural diagram upon erasure, which occurs on a p-type silicon semiconductor region 1, more specifically, under the conditions where electrons are injected from a control electrode 7 with the semiconductor memory according to the first embodiment of the present invention.

FIG. 2 shows a band diagram upon erasure, which occurs on the p-type silicon semiconductor region 1. More specifically, FIG. 2 shows the band diagram of a semiconductor memory, according to the first embodiment of the present invention, under the conditions where electrons are injected from the control electrode 7. Ev represents the energy level of the valence band, and Ec represents the energy level of the conduction band. In addition, before describing the band diagram of this structure, the fact that the inventers discovered a charge centroid position in the erase saturation state is described using the band structural diagram of the MONOS structure shown in FIG. 3. This experimental fact is described in Japanese Laid-open Patent Application No. 2003-078043, discussed above. We newly discovered that similar results can be obtained even if the film thickness parameters, such as the film thickness of the first charge storage layer 5 or of the block insulating layer 6, are varied. Moreover, we newly discovered that similar results can be obtained even if the value of the control gate voltage upon erasure state is changed. Furthermore, we newly discovered that the charge centroid position differs during the programming operation and the erase saturation operation. These features are particularly disclosed.

Figure 3:
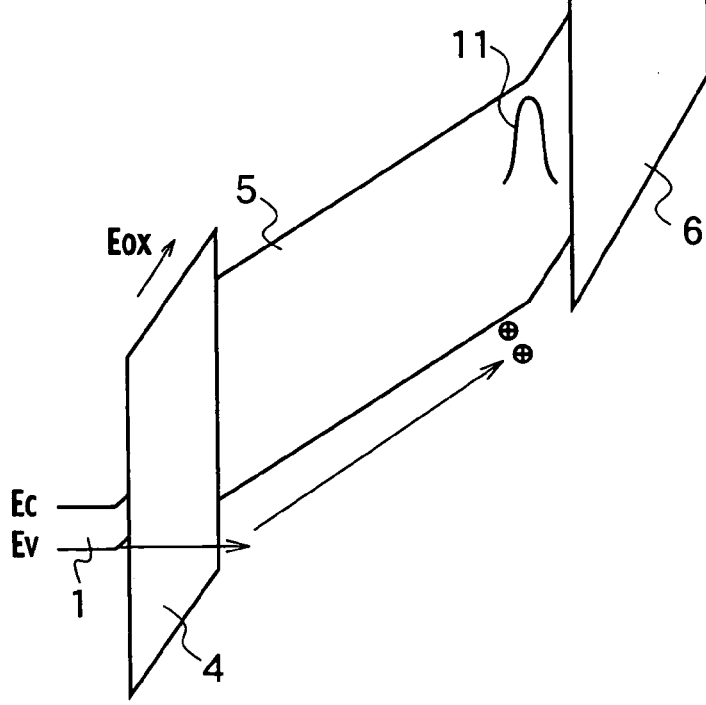
FIG. 3 is a band structural diagram of a MONOS structure upon erasure.

FIG. 3 shows a band structural diagram of a MONOS memory upon erasure, which has a structure where the portions of the first block insulating layer (second insulating layer) 61, the second charge storage layer 62, and the second block insulating layer 63 of FIG. 2 are replaced with a block insulating layer 6. It should be noted that in this case, $t_{ox4}$ denotes the thickness of the flat portion of the block insulating layer 6, and $\in_{ox4}$ denotes the dielectric constant for the silicon oxide film. In FIGS. 2 and 3, reference numeral 11 indicates a schematic charge distribution stored in the charge storage layer 5; and shows the case where the band is of a downwardly convex shape when erasure is sufficiently performed and the holes are stored. Naturally, such shape is not needed for the stored charge distribution, and the position of the charge centroid is important in the following discussion.

Figure 4:
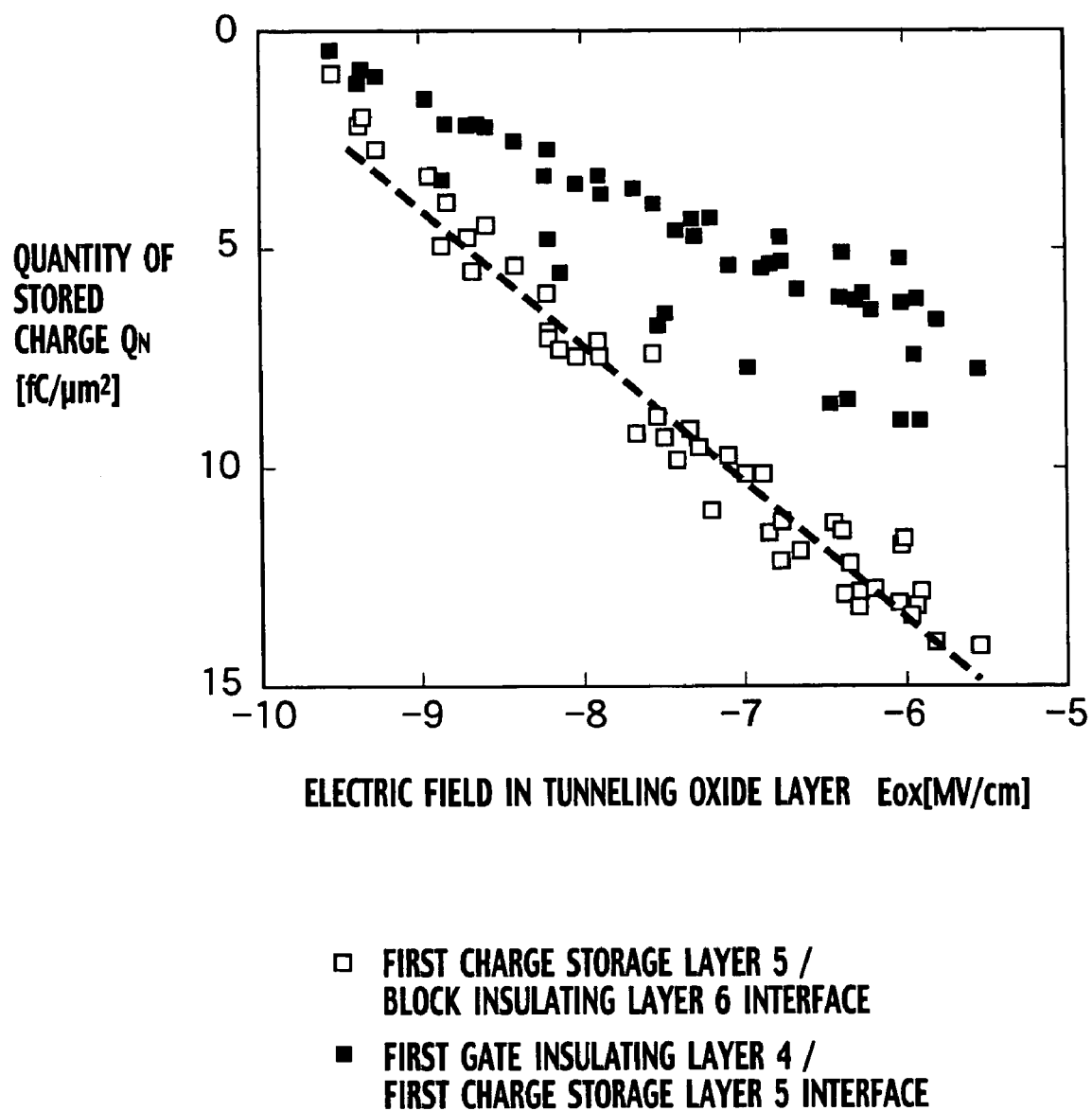
FIG. 4 shows the relationship between the erasure electric field and the quantity of stored charge.
Figure 5:
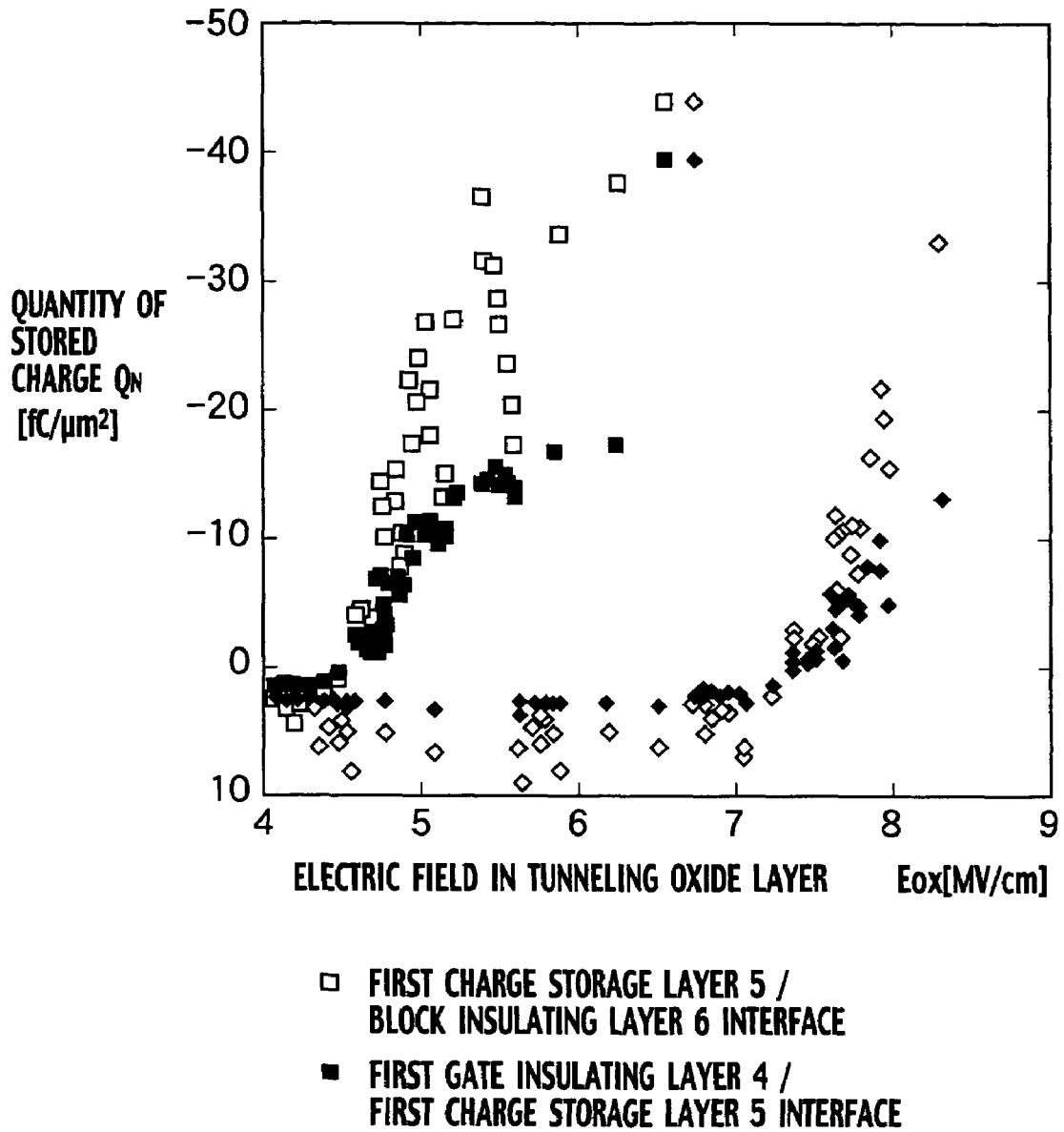
FIG. 5 shows the relationship between the programming electric field and the quantity of stored charge.

FIGS. 4 and 5 show the experimental results of the relationship between the quantity of stored charge $Q_N$ and the electric field $E_{ox}$ of a tunneling oxide layer. The quantity of the charge and the electric field are measured at the interface between the first charge storage layer 5 and the block insulating layer 6, and at the interface between the first gate insulating layer 4 and the block insulating layer 6, respectively. The experimental results were obtained where, for example, voltages from 7 V to 15 V are applied to the p-type semiconductor region 1 in the reverse direction and forward direction, respectively, the source region 2 and the drain region 3 are floated, and the erase pulse time is set to one second when the voltage of the control electrode 7 is set to 0 V. Alternatively, the source region 2, the drain region 3, and the p-type silicon semiconductor region 1 may be set to 0 V, and the voltage of the control electrode 7 may be set from −15 V to −7 V, for example. In this case, the holes from the p-type silicon semiconductor region 1 pass through the first gate insulating layer 4 and are injected as a result of the direct tunneling phenomenon. Here, under the conditions where electrons are injected from the control electrode 7 as a result of the FN tunneling phenomenon, the inventers discovered that the quantity of the stored charge $Q_N$ is given as a unique linear function to the electric field $E_{ox}$ to be applied to the first gate insulating layer 4 upon saturation of the erasure threshold voltage. This determination was made by approximating the position of the stored charge centroid to the interface between the block insulating layer 6 and the first charge storage layer 5 in the MONOS structure of FIG. 3. More specifically, it has been discovered that similar results can be obtained even when the film thickness parameters, such as the film thickness of the first charge storage layer 5 or the film thickness of the block insulating layer 6, or the voltage of the control gate upon erasure is changed within the range where the film thickness of the block insulating layer 6 is greater than 5.2 nm. It should be noted that in the following description, a sign is given for the electric field so that the direction of the positive voltage applied to the control electrode 7 relative to the p-type silicon semiconductor region 1 is defined as positive.

Here, an equation for deriving $E_{ox}$ and $Q_N$ from experimental data in an erased state is given. The following equation (1) is given upon erasure while referencing FIG. 3 where $V_{PP}$ denotes the voltage of the control electrode 7 relative to the p-type silicon semiconductor region 1 upon erasure, $Q_N$ denotes the quantity of charge stored in the first charge storage layer 5, $C_1$ denotes capacitance per unit area between the charge centroid of $Q_N$ and control electrode 7, $\Phi_s$ denotes the surface band bending upon erasure (downward bending is defined as positive in FIG. 2), and $V_{FBi}$ denotes the flat band voltage of the control electrode 7 in the case of $Q_N=0$.

$$V_{PP}=t_{\mathit{eff}}\times E_{ox}+V_{FBi}+\Phi_s-Q_N/C_1 \quad (1)$$

Here, $Q_N$ is sufficiently greater than the absolute value of the quantity of charge trapped in the interface level between the p-type silicon semiconductor region 1 and the first gate insulating layer 4. This may naturally be satisfied in the memory cells. The $t_{\mathit{eff}}$ in equation (1) denotes an effective film thickness of the ONO film in the MONOS memory equivalent to the silicon oxide film thickness, and equation (2) is established.

$$t_{\mathit{eff}}/\in_{ox}=t_{ox1}/\in_{ox1}+t_N/\in_N+t_{ox4}/\in_{ox4} \quad (2)$$

Here, $V_{FB}$ is given as the flat band voltage measured without band bending in the p-type silicon semiconductor region 1 after erasure, $\in_{ox}$ denotes the dielectric constant of the silicon oxide film, and $E_{ox}$ is 0 based on Gauss' theorem. Therefore the following equation is established from equation (1).

$$QN=-C_1\times(V_{FB}-V_{FBi}) \quad (3)$$

In addition, $E_{ox}$ is given by the following equation (4) based on equations (1) and (3).

$$E_{ox}=(V_{PP}-V_{FBi}-\Phi_s+Q_N/C_1)/t_{\mathit{eff}}=(V_{PP}-V_{FB}-\Phi_s)/t_{\mathit{eff}} \quad (4)$$

$Q_N$ and $E_{ox}$ may be found from the above equations (3) and (4).

FIG. 4 shows the relationship between $Q_N$ and $E_{os}$ during saturation of the threshold voltage upon erasure. Symbols ■ refer to the case where the charge center centroid position is set at the interface between the first gate insulating layer 4 and the first charge storage layer 5; and symbols □ refer to the case where the charge center centroid position is set at the interface between the first charge storage layer 5 and the block insulating layer 6. In addition, $t_N$ is varied between 6.4 nm and 15.9 nm; and $t_{ox4}$ is varied between 5.2 nm and 10.0 nm. In addition, $t_{ox1}$ is controlled so as to lie in the range between 2.58 nm and 2.63 nm. Furthermore, a silicon nitride film is used as the first charge storage layer 5, and a silicon oxide film is used as the first gate insulating layer 4 and the block insulating layer 6. As is apparent from FIG. 4, there is less variation between each point in the case where the position of the charge center centroid is placed at the interface between the first charge storage layer 5 and the block insulating layer 6. Furthermore, in this case, it is discovered at this time that $Q_N$ may be uniquely expressed by a linear function of $E_{ox}$. More specifically, given $Q_N$ in units of [C/m$^2$] and $E_{ox}$ in units of [V/m], $Q_N$ may be expressed as $Q_N$=3.1×10$^{-11}$× $E_{ox}$+3.21×10$^{-2}$. It should be noted that in the case where the erasure threshold voltage is being saturated, it is proven that this relationship may be expressed by the same linear function for erase pulses of 10 [ms] to 1[s].

Next, given that $E_{ox4}$ denotes the electric field of the block insulating layer 6 and $\in_{ox4}$=$\in_{ox1}$, the following equation is established.

$$E_{ox4}=E_{ox}-Q_N/(\in_o \times \in_{ox4})=0.10 \times E_{ox}-9.30\times10^8 \quad (5)$$

In equations (1) through (4), if the centroid position of the quantity of stored charge $Q_N$ is placed at the interface between the first block insulating layer (second insulating layer) 61 and the first charge storage layer 5 in the case where electron injection occurs from the control electrode 7 into the first charge storage layer 5 upon erasure, $C_1$ may be expressed as $\in_{ox}\times\in_{ox4}/t_{ox4}$ where $\in_o$ denotes the permittivity in vacuum. If the centroid position of $Q_N$ is placed at the interface between the first gate insulating layer 4 and the first charge storage layer 5 in the case where electron injection occurs from the control electrode 7 into the first charge storage layer 5 upon erasure, $C_1$ may be expressed as $\in_o/(t_N/\in_N+t_{ox4}/\in_{ox4})$ where $\in_{ox}$ denotes the dielectric constant of the silicon oxide film. In addition, $V_{FBi}$ denotes the difference between the Fermi energy of the p-type silicon semiconductor region 1 and the Fermi energy of the control electrode 7, which is approximately −1 V on the control electrode 7 made from the n-type doped polysilicon relative to the p-type silicon semiconductor region 1, or approximately 0 V on control electrode 7 made from the p-type doped polysilicon relative to the p-type silicon semiconductor region 1. To be more precise, the value of $V_{FBi}$ may be found through calculation from the impurity densities of the p-type silicon semiconductor region 1 and the control electrode 7. Furthermore, the surface band bending $\Phi_s$ upon erasure may be considered as approximately 0 V since the electric field is applied to the storage side of the p-type silicon semiconductor region 1. Accordingly, $E_{ox}$, $Q_N$, and $E_{ox4}$ may all be experimentally found by using equations (3) through (5).

According to equation (5), the amount of change in $E_{ox4}$ relative to the amount of change in $E_{ox}$ is at most approximately 10%. This is because electron current that flows through the first block insulating layer (second insulating layer) 61 is an FN tunneling current with extremely strong dependency on the electric field. In contrast, the hole current that flows through the first gate insulating layer 4 is a direct tunneling current having less dependency on the electric field than the FN tunneling current. Accordingly, even if a hot-hole current is used as the hole current that flows through the first gate insulating layer 4, the phenomenon where $E_{ox4}$ only slightly varies becomes more remarkable since the hot-hole current has even less dependency on the electric field applied to the insulating layer than the tunneling current. In addition, as is apparent from equation (5), if $Q_N$ may be uniquely determined from $E_{ox}$, and there is a linear relationship, $E_{ox4}$ may also be uniquely determined from $E_{ox}$.

Next, FIG. 5 shows a relationship between the quantity of stored charge $Q_N$ and $E_{ox}$ having the same structure as that used in FIG. 4 upon programming, namely upon electron injection. Cases are shown where programming pulse time $\tau_p$ is 1 s and 100 μs when the voltages of the p-type silicon semiconductor region 1, the source region 2, and the drain region 3 are 0 V, and the voltage of the control electrode 7 is between 7 V and 15 V. In this case, electrons are injected passing through the first gate insulating layer 4 from a carrier inversion layer, which is formed on the p-type silicon semiconductor region 1, the source region 2, and the drain region 3 primarily as a result of the FN tunneling phenomenon. It should be noted that the surface band bending $\Phi_s$ upon programming may be considered to be approximately 1 V since an electric field is applied to the p-type silicon semiconductor region 1 until strong inversion occurs. Accordingly, $E_{ox}$, $Q_N$, and $E_{ox4}$ upon programming may all be experimentally found by using equations (3) through (5). According to the drawings, upon programming, that is, if electrons pass through the first gate insulating layer 4 so as to be injected into the first charge storage layer 5, the model that is regarded as having a charge centroid position placed at the interface between the first gate insulating layer 4 and the first charge storage layer 5 varies less than the model that has a charge centroid position placed at the interface between the first charge storage layer 5 and the block insulating layer 6, and may be more thoroughly described. The inventors have discovered and disclosed herein the fact that the charge centroid varies upon erase saturation and upon programming.

From the above, it may be considered that the stored charge centroid exists in the vicinity of the interface on the side where electrons are injected during electron injection. Accordingly, with the band structural diagram of FIG. 2, the erasure flat band voltage $V_{FB}$ may be determined as follows if electrons are injected from the control electrode 7 into the second charge storage layer 62.

$$V_{FB}=V_{FBi}-Q_N/C_1+(t_{ox2}+t_t\times\in_{ox2}/\in_t)\times E_{ox2}+t_{ox3}\times E_{ox3} \quad (6)$$

Here, $E_{ox2}$ denotes the electric field in the first block insulating layer 61, and $E_{ox3}$ denotes the electric field in the second block insulating layer 63. In addition, given that $Q_t$ denotes the surface concentration of charge stored in the second charge storage layer (fourth insulating layer) 62, equation (6) is modified as follows using Gauss' theorem $\in_o$ $$\varepsilon_o \times \varepsilon_{ox2} E_{ox2} = Q_t + \varepsilon_o \times \varepsilon_{ox3} E_{ox3} \cdot V_{FB} = \quad (7)$$

$$V_{FBi} - Q_N/C_1 + (t_{ox2} + t_t \times \varepsilon_{ox2}/\varepsilon_t) \times Q_t/(\varepsilon_o \times \varepsilon_{ox2}) +$$

$$(t_{ox2} \times \varepsilon_{ox3}/\varepsilon_{ox2} + t_t \times \varepsilon_{ox3}/\varepsilon_t + t_{ox3}) \times E_{ox3}$$

According to equation (7), under the conditions where the electric field $E_{ox3}$ in the second block insulating layer 63 is constant, when $Q_t$ is negative, that is, more electrons are stored in the second charge storage layer (fourth insulating layer) 62, the further the erasure flat-band voltage $V_{FB}$ may be lowered. In this case, it is possible to lower the saturated erasure threshold voltage for the term $Q_t$, that is, for $(t_{ox2}+t_t\times\in_{ox2}/\in_t)\times Q_t/(\in_o\times\in_{ox2})$ by making the thickness of the stacked first block insulating layer 61, the second charge storage layer 62, and the second block insulating layer 63 of FIG. 2, which is equivalent to the silicon oxide film thickness ($t_{ox2} \times \varepsilon_{ox3}/\varepsilon_{ox2} + t_t \times \varepsilon_{ox3}/\varepsilon_t + t_{ox3}$), to be equal to the thickness of the block insulating layer 6 that is equivalent to the silicon oxide film thickness ($t_{ox4}/\varepsilon_{ox4}$). This is because, according to the relational expression between $E_{ox4}$ and $E_{ox}$ described in FIG. 4 and equation (5), the fact is disclosed where by making $t_{ox}$, $E_{ox}$, and $Q_N$ be equal in FIG. 2 and FIG. 3, and making the electric field $E_{ox3}$ of the block insulating layer 6 being in contact with the control electrode 7 be equal to $E_{ox4}$ independent of the film thicknesses of the first charge storage layer 5 and the block insulating layer 6, and independent of the control gate erasure voltage $V_{pp}$ under the conditions where the erasure threshold voltage is saturated, it is possible to obtain the electric field condition that causes saturation. For example, according to FIG. 5, if the silicon nitride film is used as the second charge storage layer 62, it is possible to store as much as $Q_t$ of approximately 10 fC/μm². Furthermore, for example, given that thickness $t_{ox2}$ of the flat portion of the first block insulating layer 61 is 5 nm and thickness $t_t$ of the flat portion of the second charge storage layer 62 is 5 nm in the case where a silicon oxide film is used as the first block insulating layer 61 and the second block insulating layer 63, and a silicon nitride layer is used as the second charge storage layer 62, the erasure threshold voltage may be set to $(t_{ox2} + t_t \times \varepsilon_{ox2}/\varepsilon_t) \times Q_t/(\varepsilon_o \times \varepsilon_{ox2})$ ~2.2 V so as to be further negative in comparison with that for the structure of FIG. 3. Furthermore, according to equation (7), if the effective oxide film thicknesses ($t_{ox2} \times \varepsilon_{ox3}/\varepsilon_{ox2} + t_t \times \varepsilon_{ox3}/\varepsilon_t + t_{ox3}$) of the first block insulating layer 61 and the second block insulating layer 63 are constant, $V_{FB}$ preferably becomes even lower by making $t_{ox2}$ thicker than $t_{ox3}$. In addition, the conditions for making the thickness of the stacked first block insulating layer 61, the second charge storage layer 62, and the second block insulating layer 63 that is equivalent to the silicon oxide film thickness be equal to the thickness of the block insulating layer 6 that is equivalent to the silicon oxide film thickness, and for making $t_{ox1}$ and $t_N$ be equal in FIG. 2 and FIG. 3, satisfy making the effective thickness $t_{eff}$ of the ONO film in the semiconductor memory according to the first embodiment of the present invention that is equivalent to the silicon oxide film thickness be equivalent as well. It should be noted that the effective film thickness $t_{eff}$ may be modified as follows in the semiconductor memory according to the first embodiment of the present invention.

$$t_{eff}/\varepsilon_{ox} = t_{ox1}/\varepsilon_{ox1} + t_N/\varepsilon_N + t_{ox2}/\varepsilon_{ox2} + t_t/\varepsilon_t + t_{ox3}/\varepsilon_{ox3} \quad (8)$$

The structure of the semiconductor memory according to the first embodiment of the present invention is also desirable since the smaller the $V_{FB}$, the deeper the erasure may be performed in the case where $V_{pp}$ is constant under the conditions where $t_{eff}$ is equivalent in both FIG. 2 and FIG. 3, whereby the gate drive characteristics and short-channel effect from the control electrode 7 to the p-type silicon semiconductor region 1 are constant. In addition, the conditions, by which the film thickness of the first gate insulating layer 4 are constant, and maintaining constant the sum of the effective film thicknesses converted to silicon oxide films in the first block insulating layer 61, the second charge storage layer 62, and the second block insulating layer 63, are the conditions where the applied electric field during programming is almost identical, the programming speed is almost identical. This is disclosed according to FIG. 5. Accordingly, programming and read-out are almost constant under the conditions.

The semiconductor memory according to the first embodiment of the present invention has the following features.

[Feature 1]

In the case of erasing until reaching the same erasure flat band voltage $V_{FB}$, electron injection from the control electrode 7 into the first charge storage layer 5 may be far more controlled than the case where the second charge storage layer 62 and the negative charges $Q_t$ are not formed when performing the erase operation through hole injection from the p-type silicon semiconductor region 1 into the first charge storage layer 5. Accordingly, the simultaneous injection of the holes and electrons into the first charge storage layer 5 may be prevented. Thus, for example, the increase in the number of traps of the first charge storage layer 5, or the increase in interface levels in the vicinity of the first charge storage layer 5 may be further reduced so as to improving reliability. At the same time, it is possible to maintain programming characteristics so as to constant as with the conventional example, and to prevent the programming speed from decreasing by, for example, maintaining the ONO effective film thickness $t_{eff}$ and the film thickness of the first gate insulating layer 4 constant. Accordingly, isolation of the programming threshold voltage and the erasure threshold voltage may be secured, and the reliability of data may be further improved.

[Feature 2]

Even in the case of using the same film thickness for the first gate insulating layer 4 as that of the conventional example, the saturation phenomenon of the erasure threshold voltage does not occur even when the absolute value of the gate voltage upon erasure is further increased for achieving the same erasure threshold voltage as that of the conventional example. Accordingly, the erase time may be reduced. In this case, since the film thickness of the first gate insulating layer 4 does not need to be made thinner, the retention characteristics of the electrons can be preserved as with the conventional example without the quantity of charge that can leak through the silicon oxide film thickness of the first gate insulating layer 4 increasing. In addition, since negative charges are stored in the second charge storage layer 62, the absolute value of the quantity of charge $Q_N$ to be stored in the first charge storage layer 5 may be decreased as compared to the conventional example shown in FIG. 3 in the case where the same programming threshold voltage is set. Since deep energy levels for charged traps are filled when the absolute value of the quantity of charge upon programming increases, deterioration of the charge retention characteristics may be prevented because of the electric field effect of $Q_N$ itself.

[Feature 3]

More precise control of the quantity of charge of the second charge storage layer 62 is possible by controlling the voltage or the time period to be applied, from the control electrode 7 to the p-type silicon semiconductor region 1 upon erasure. This may be implemented, for example, by a verification and erasure process where the erasure threshold voltage is measured after erasure is performed with a specific voltage and time period, and erasure is further performed by extending the time period or increasing the voltage when the measured results do not meet the reference value. Accordingly, if the quantity of charge in the second charge storage layer 62 decreases due to the deterioration of charge holding characteristics, for example, the charges may be replenished by increasing the voltage to be applied from the control electrode 7 to the p-type silicon semiconductor region 1. Therefore, the charges may be adjusted even after formation of the IC package or after product shipment. In addition, according to equation (7), the erasure flat band voltage $V_{FB}$ which causes saturation may be controlled to be constant by adjusting the quantity of charge $Q_t$ even if variations in the film thicknesses of the first block insulating layer 61, the second charge storage layer 62, and the second block insulating layer 63 occur. Accordingly, a more reliable semiconductor memory may be implemented. It should be noted that as the second charge storage layer (fourth insulating layer) 62 having a negative charge, a layer with more electron traps than a dry oxide film may be used by forming, for example, a silicon oxide film or an oxynitride film containing many O—H radicals in an atmosphere, for example, containing water vapor.

[Feature 4]

It is not necessary for the first block insulating layer 61, the second charge storage layer 62, and the second block insulating layer 63 to be doped with impurities such as boron or indium; and negative charges may be formed in the second charge storage layer 62. Accordingly, a more reliable semiconductor memory may be implemented without problems such as deterioration of immunity or increase in leakage when a high-concentration impurity such as boron is doped to the silicon oxide layer. In addition, by performing gate etching under conditions where etching selectivity between the second charge storage layer 62 and the second block insulating layer 63 may be provided, it is possible to control the etching of the control electrode 7 so as not to reach the first block insulating layer 61, as shown in FIG. 1. Accordingly, damage to the first charge storage layer 5 through the gate etching process may be further reduced.

[Feature 5]

Since a part of the first charge storage layer 5 on the source region 2 and the drain region 3 is removed, storing charges becomes difficult on that removed region. Accordingly, it is possible to prevent variation in the quantity of stored charge from occurring, for example, in a process step or when the voltage of the source region 2 or the drain region 3 is changed in the case where the first charge storage layer 5 is formed, and to maintain the resistances of the source region 2 and the drain region 3 constant.

[Feature 6]

With the semiconductor memory according to the first embodiment of the present invention, the control electrode 7 may be formed in an orthogonally relative to the direction in which the source region 2, the semiconductor region 1, and the drain region 3 are formed. Accordingly, as with an exemplary embodiment to be described later, the first embodiment is suitable for forming a structure, for example, a NAND structure, where the source region 2 and the drain region 3 of neighboring memory cells are connected in series.

First Modified Example of the First Embodiment

Figure 6:
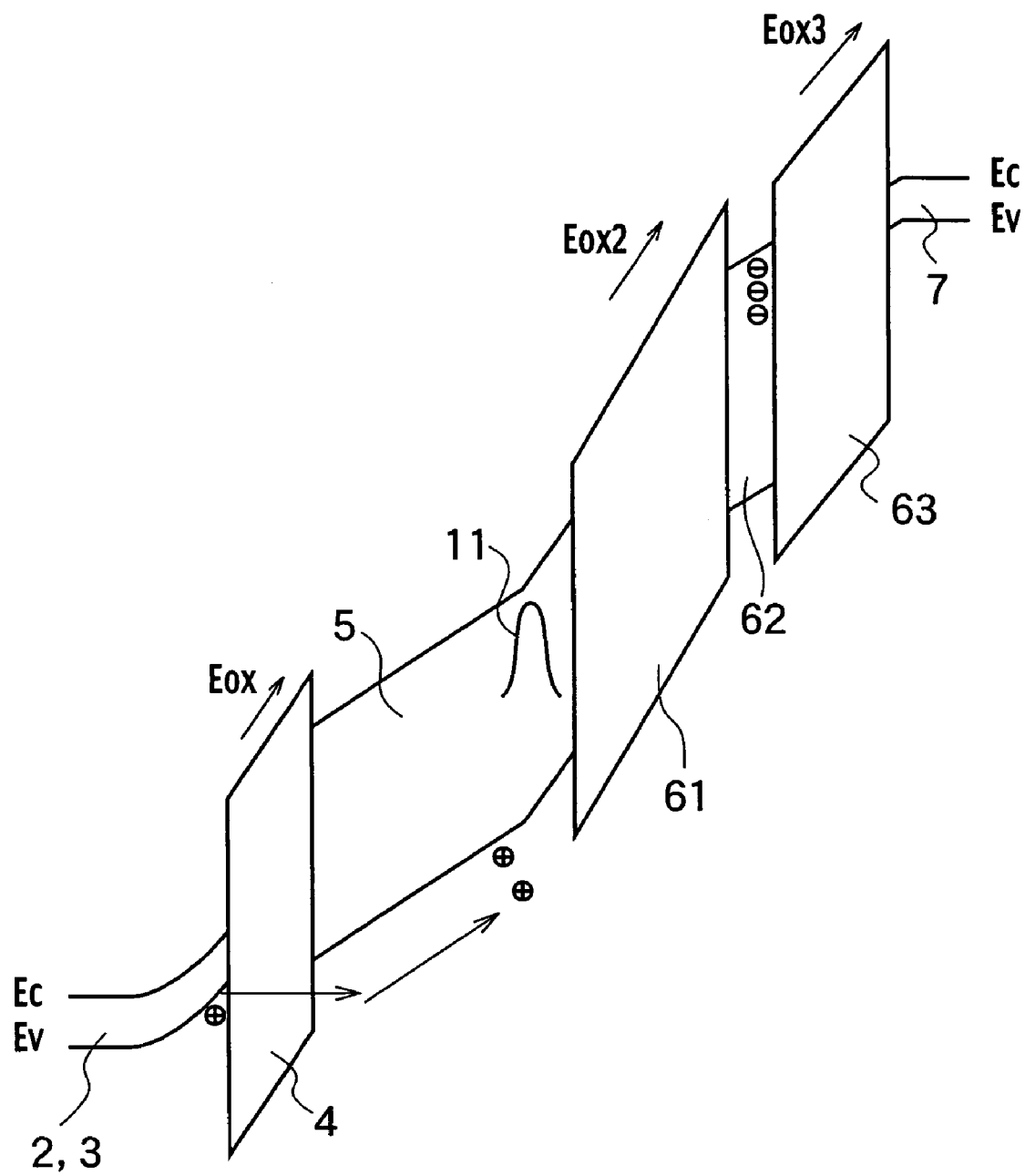
FIG. 6 is a band structural diagram upon erasure with a semiconductor memory according to a first modified example of the first embodiment of the present invention.

As discussed above, the relationship of the electric currents that flow between the p-type silicon semiconductor region 1 and the first charge storage layer 5 has been described. Similarly, erasure may be performed by flowing hole currents between the n-type source region 2 or the n-type drain region 3 and the first charge storage layer 5. In this case, it is logical to use the values of the flat sections on the source region 2 and the drain region 3 in which hole currents flow as $t_{ox1}$, $t_N$, $t_{ox2}$, $t_t$, and $t_{ox3}$. FIG. 6 shows a band structural diagram upon erasure, more specifically, under the conditions where electrons are injected from the control electrode 7. In FIG. 6, a large potential difference is applied between the source region 2 and/or the drain region 3, and the control electrode 7 when, for example, a voltage between 5 V and 20 V is applied to at least either the n-type source region 2 or the n-type drain region 3, the voltage of the p-type silicon semiconductor 1 is between the voltage of the source region 2 and/or the drain region 3, to which the voltage is applied, and 0 V, and the voltage of the control electrode 7 is between −20 V and −5 V. Erasure may be performed on either the source side, the drain side, or on both sides of the source and the drain. However, to simplify explanation hereafter, the source region 2 and the drain region 3 to which the voltage is applied to inject holes into the first charge storage layer 5 are indicated as a source region and a drain region, respectively. In this case, more band bending occurs as more holes are generated in the vicinity of the interface that is close to the first gate insulating layer 4 on the n-type source region 2 or the n-type drain region 3, where the holes pass through the first gate insulating layer 4 so as to be injected into the first charge storage layer 5 as a result of the direct tunneling phenomenon. In this case, the argument by which equation (1) through equation (7) are derived may be valid for replacing the definitions of $\Phi_s$, $V_{pp}$, $V_{FB}$, and $V_{FBi}$, as follows. In FIG. 6, the surface band bending of the n-type source region 2 or the n-type drain region 3 upon erasure is replaced with $\Phi_s$, the erasure voltage of the control gate on the basis of the n-type source region 2 or the n-type drain region 3 is replaced with $V_{pp}$, and the electric field $E_{ox}$ applied to the first gate insulating layer 4, the electric field $E_{ox2}$ applied to the first block insulating layer 61, and the electric field $E_{ox3}$ applied to the second block insulating layer 63 are indicated with arrows. In addition, $V_{FBi}$ is replaced with the flat band voltage of the control electrode 7 that is relative to the source region 2 or the drain region 3 when $Q_N=0$ and $Q_t=0$, and the flat band voltage, which is measured such that band bending does not occur between the interface of the first gate insulating layer 4 on the n-type source region 2 and the n-type drain region 3 after erasure, is replaced with $V_{FB}$. From this, $V_{FBi}$ is the difference between the Fermi energy of the source region 2 and the drain region 3 and the Fermi energy of the control electrode 7, and is approximately 0 V on the control electrode 7 made from n-type doped polysilicon relative to the n-type source region 2 and the n-type drain region 3. Alternatively, a voltage of approximately 1 V on control electrode 7 made from p-type doped polysilicon relative to the n-type source region 2 and the n-type drain region 3. In such a case, it is possible to more accurately determine the value of $V_{FBi}$ by calculation from the impurity concentration of the n-type source region 2, the n-type drain region 3, and the control electrode 7. Furthermore, the surface band bending $\Phi_s$ upon erasure may be considered almost inverted to the n-type source region 2 and the n-type drain region 3 since more band bending occurs as more holes are generated in the vicinity of the interface that is close to the first gate insulating layer 4 on the n-type source region 2 and the n-type drain region 3. In this case, $\Phi_s$ may be considered to be approximately −1 V. Therefore, it can be understood that the same solution may be directly obtained by the expression of equation (7).

Such analyses are independently valid for each of the p-type silicon semiconductor region 1, the n-type source region 2, and the n-type drain region 3. Accordingly, when the holes are injected from the n-type silicon semiconductor region 1 into the first charge storage layer 5, if the n-type silicon semiconductor region 1 is used rather than the p-type silicon semiconductor region 1, the same argument as that of the case where the holes are injected from the above-described n-type source region 2 and n-type drain region 3 into the first charge storage layer 5 may be valid, and equation (7) may be used as evaluation expression. In addition, if the p-type source region 2 and the p-type drain region 3 are formed when the n-type silicon semiconductor region 1 is used, and if the holes are injected from the p-type source region 2 and the p-type drain region 3 into the first charge storage layer 5, the same argument as that of the case where the holes are injected from the above-described p-type silicon semiconductor region 1 into the first charge storage layer 5 may be valid, and equation (7) may be used as the evaluation expression. It is apparent from the above that either the n-channel field-effect transistor or the p-channel field-effect transistor may provide the same effect as in the semiconductor memory according to the first embodiment of the present invention. The above-described erasure by direct tunneling injection of the holes from the p-type silicon semiconductor region 1 or source region 2 and the drain region 3 into the first charge storage layer 5 has advantages, such as high injection efficiency, and reduction of power consumption upon erasure. This is because uniform erasure of the entire first charge storage layer 5 is possible, and all of the generated hole currents may be used for tunneling injection.

Furthermore, it is apparent from the operational principle for the derivation of equations (1) through (7) to result as with the case where the dependency of the hole injection from the p-type silicon semiconductor region 1 into the first charge storage layer 5 on the electric field of the first gate insulating layer 4 is weaker than the dependency that FN tunneling electron injection of electrons from the control electrode 7 into the first charge storage layer 5 holds. Accordingly, in the case of the semiconductor memory according to the first modified example of the first embodiment of the present invention where hole injection from the p-type silicon semiconductor region 1 into the first charge storage layer 5 is performed according to the hot holes, dependency on the electric field of the first gate insulating layer 4 becomes weaker than that of direct tunneling since the height of the barrier of the first gate insulating layer 4 for the hot holes is much lower than the height of the barrier for the not-hot holes. In this case, with the same structure as that in FIG. 1, where the hot holes generated between the source region 2, the drain region 3, and the p-type silicon semiconductor region 1 are passed through the first gate insulating layer 4 and injected into the first charge storage layer 5, a voltage between, for example, 4 V and 20 V must be applied to either the n-type source region 2 or the n-type drain region 3 and the voltage of the p-type silicon semiconductor region 1 must be set to 0 V, for example, and the voltage of the control electrode 7 must be set between −15 V and 0 V. In addition, the voltage of the control electrode 7 relative to the voltage of the p-type silicon semiconductor region 1 may be used as $V_{pp}$ in equation (4). Furthermore, $t_{ox1}$ is not always necessary to be less than 3.5 nm upon erasure for hot-hole-injection. In addition, in the erasure method using hot holes, less voltage may be applied to the source region 2, the drain region 3, and the control electrode 7 than that in the erasure method by direct tunneling. Thus, the erase operation may be implemented with a lower voltage. The characteristics applicable to such hot-hole-injection are applicable in all embodiments of the present invention.

Second Modified Example of the First Embodiment

Figure 7:
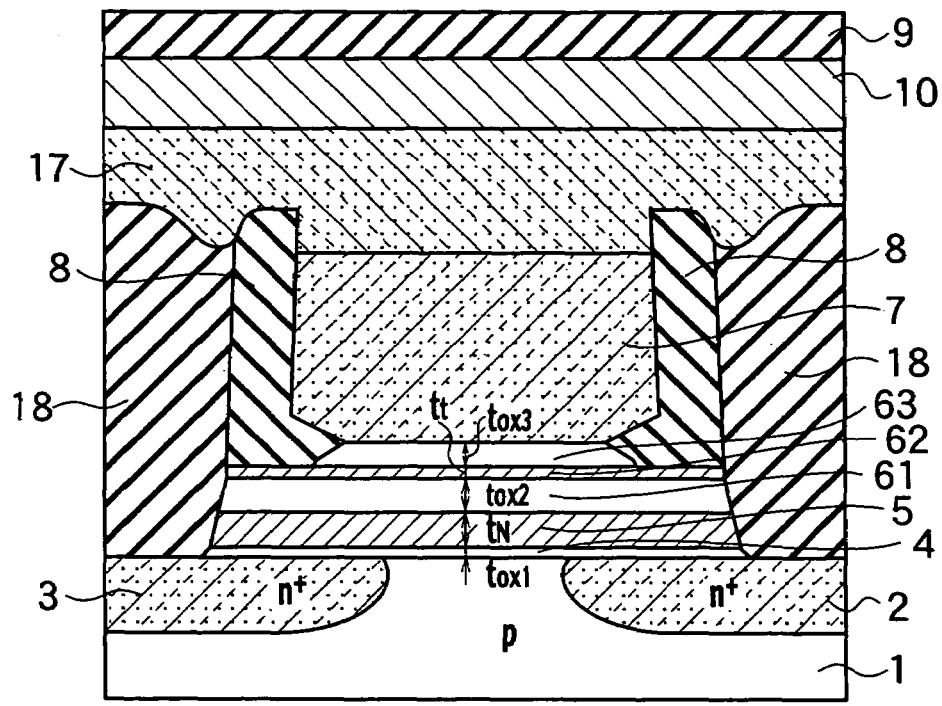
FIG. 7 shows a schematic cross-sectional structure of a semiconductor memory according to a second modified example of the first embodiment of the present invention.

FIG. 7 shows an exemplary cross-sectional structure of a semiconductor memory according to the second modified example of the first embodiment of the present invention. As with the second modified example of FIG. 7, it is also possible to form a control line 10, which is connected to the control electrode 7 via a polysilicon layer 17, in the same direction as the source region 2, the p-type silicon semiconductor region 1, and the drain region 3 are to be formed once the insulating layer 9 has been peeled from the structure of FIG. 1. It is apparent from this structure that an AND structure or a virtual ground array structure may be formed. In this case, the control line 10 may be doped with, for example, boron, phosphorus, or arsenic in a concentration range of $1\times10^{19}$ cm$^{-3}$ to $1\times10^{21}$ cm$^{-3}$ so as to be formed as the polysilicon layer 17 having a thickness of 10 nm to 500 nm. Reference numeral 18 is an insulating layer made from a silicon oxide film or a silicon nitride film, which may be formed by filling between the adjacent control electrodes 7 after formation of the source region 2 and the drain region 3.

Second Embodiment

Figure 8:
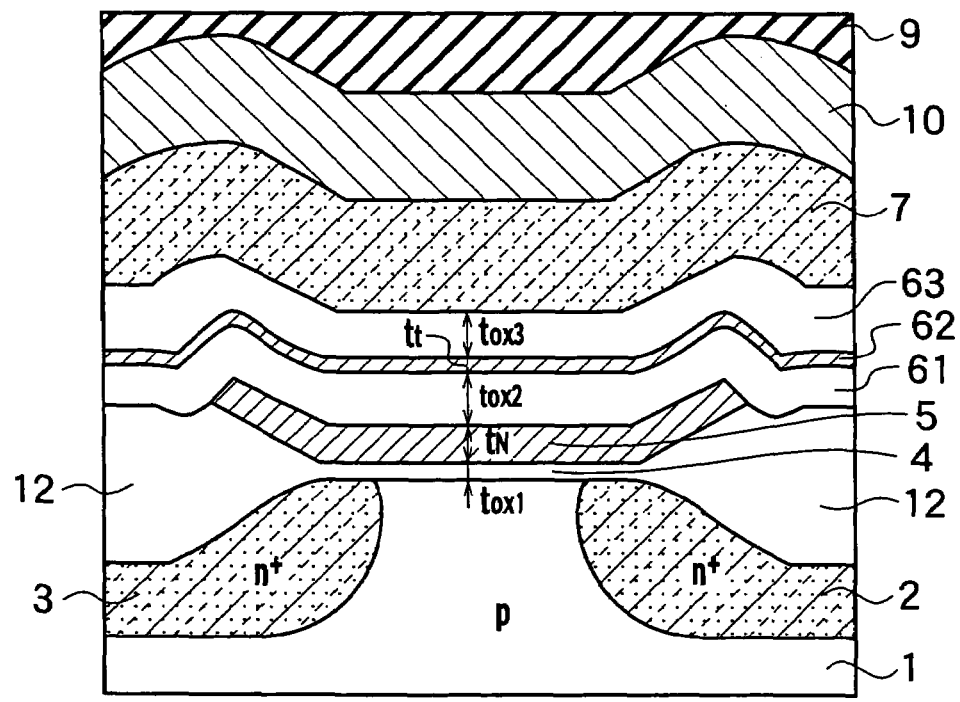
FIG. 8 shows a schematic cross-sectional structure of a semiconductor memory according to a second embodiment of the present invention.

As shown in FIG. 8, a semiconductor memory according to the second embodiment of the present invention, a control line, which is connected to a control electrode 7, is formed in the same direction as a source region 2, a p-type silicon semiconductor region 1, and a drain region 3 are formed relative to the first embodiment. It should be noted that detailed description for the same configurations as with the first embodiment using the same reference numerals is omitted.

The semiconductor memory according to the second embodiment of the present invention differs from the first embodiment in that a device isolating and insulating layer 12, made from a silicon oxide film, for example, is formed in a self-aligned manner on the source region 2 and the drain region 3. The second embodiment has a feature that, in comparison with the conventional example, a second charge storage layer 62, for storing negative charges injected from a gate and is arranged in a portion of the memory cell corresponding to a second insulating layer. In FIG. 8, a first gate insulating layer 4, which is, for example, a silicon oxide film or an oxynitride film having a thickness of 0.5 nm to 10 nm, is formed on the p-type silicon semiconductor region 1 where an impurity concentration of boron or indium is between $10^{14}$ cm$^{-3}$ to $10^{19}$ cm$^{-3}$, for example. In this case, $t_{ox1}$ denotes the thickness of a flat portion of the first gate insulating layer 4, and $\in_{ox1}$ denotes a dielectric constant of the first gate insulating film. The first gate insulating layer 4 is fabricated in a stripe form, for example, and the device isolating and insulating layer 12 having a thickness in the range of 0.05 μm to 0.5 μm, made from a silicon oxide film, for example, is formed on both sides thereof. In addition, a first charge storage layer 5 having a thickness of 3 nm to 20 nm, made from a silicon nitride film, a silicon oxynitride film, or an alumina film, for example, is formed on the top side of the first gate insulating layer 4 and a part of the top side of the device isolating layer 12. In this case, $t_N$ denotes the thickness of the flat portion of the first charge storage layer 5 on the first gate insulating layer 4, and $\in_N$ denotes the dielectric constant of the first charge storage film. Such shape may be obtained by forming the first gate insulating layer 4 on the entire surface of the p-type silicon semiconductor region 1; depositing the first charge storage layer 5 on the entire surface; patterning the first charge storage layer 5; and then oxidizing the p-type silicon semiconductor region 1.

In addition, the source region 2 and drain region 3 are formed through diffusion or ion implantation lower than the device isolating and insulating region 12 at a depth between 10 nm to 500 nm so that the surface concentration of, for example, phosphorus, arsenic, or antimony is $10^{17}$ cm$^{-3}$ to $10^{21}$ cm$^{-3}$. This may be formed independently of the device isolating and insulating layer 12 in a self-aligned manner by using the patterned first charge storage layer 5 as a mask.

Stacked on the foregoing structure is a first block insulating layer (second insulating layer) 61 having a thickness of 3 nm to 30 nm, made from a silicon oxide film, an oxynitride film, an $Al_2O_3$ film, a ZrSiO film, an HfSiO film, a ZrSiON film, or an HfSiON film, for example. In this case, $t_{ox2}$ denotes the thickness of the flat portion of the first block insulating layer (second insulating layer) 61, and $\in_{ox2}$ denotes the dielectric constant of the first block insulating film. In addition, a second charge storage layer 62, which is, for example, a silicon nitride film or a silicon oxynitride film, is formed with a thickness of 0.5 nm to 10 nm. In this case, $t_t$ denotes the thickness of the flat portion of the second charge storage layer 62, and $\in_t$ denotes the dielectric constant of the second charge storage film. Upon this structure is further stacked a second block insulating layer (third insulating layer) 63 having a thickness of 3 nm to 30 nm, made from a silicon oxide film, an oxynitride film, an $Al_2O_3$ film, a ZrSiO film, an HfSiO film, a ZrSiON film, or an HfSiON film, for example. In this case, $t_{ox3}$ denotes the thickness of the flat portion of the second block insulating layer (third insulating layer) 63, and $\in_{ox3}$ denotes the dielectric constant of the second block insulating film. In this case, the first block insulating layer 61 functions so as to block electrons stored in the second charge storage layer 62 from flowing into the first charge storage layer 5 when under an erasing stress. Desirable structures regarding film thickness and quality of such first block insulating layer (second insulating layer) 61, second charge storage layer (fourth insulating layer) 62, and second block insulating layer (third insulating layer) 63 are the same as those described in the first embodiment, thus description is omitted.

In addition, the control electrode 7 is formed with a thickness of 10 nm to 500 nm, to which is doped boron, arsenic, or phosphorus in a concentration range of $1\times10^{19}$ cm$^{-3}$ to $1\times10^{21}$ cm$^{-3}$. In this case, when boron is doped, if the boron concentration of the control electrode 7 is less than $1\times10^{20}$ cm$^{-3}$, anomalous diffusion of the boron into the silicon oxide film is prevented, and threshold voltages for simultaneously formed p-channel MOS transistors are stabilized. In addition, if the boron concentration of the control electrode 7 is more than $1\times10^{19}$ cm$^{-3}$, depletion of the control electrode 7 and reduction in the effective electric field over ONONO stacked layers are suppressed. Therefore, suppression of the depletion-effect of the control electrode 7 and the reduction-effect in the electric field on the ONONO stacked layers will realize shorter erase time. In addition, when silicon oxide film or the silicon oxynitride film is used as the first gate insulating layer 4, the height of the barrier for the holes is higher than the height of the barrier for the electrons, and the film must be made thinner for the tunneling phenomenon to occur, where a thin film less than 3.5 nm is needed in order to obtain sufficient hole-tunneling current for erasure. Accordingly, in order to inject the holes from the p-type silicon semiconductor region 1 into the first charge storage layer 5 by using the direct tunneling phenomenon, it is desirable that $t_{ox1}$ be limited to less than 3.5 nm. In addition, in this case, for example, a deposited silicon oxide film obtained from tetraethoxysilane (TEOS) through high temperature oxidation (HTO) is considered as a first material candidate for the first block insulating layer (second insulating layer) 61. However, a silicon oxide film or a silicon oxynitride film, which is obtained by oxidizing the first charge storage layer 5, may also be used.

Furthermore, a metal-lined layer 10 having a thickness of 10 nm to 500 nm, which is made from, for example, WSi or NiSi, MoSi, TiSi, CoSi, W, or Al, may be formed on the control electrode 7. The control electrode 7 is made from a polysilicon, where a plurality of the control electrode 7 is connected together with low resistance by the metal-lined layer 10.

In addition, an insulating layer 9 having a thickness of 5 nm to 500 nm, made from a silicon nitride film or a silicon oxide film, for example, is formed on the metal-lined layer 10. It should be noted that also in the second embodiment of the present invention, in order to reduce the threshold voltage range from increasing due to variation in the programming and the erasure electric field, it is desirable that the insulating layers 4, 5, 61, 62, and 63 are formed with a uniform film thickness extending from the boundary of the p-type silicon semiconductor region 1 and the source region 2 to the boundary of the p-type silicon semiconductor region 1 and the drain region 3.

Moreover, an n-type source region 2 and an n-type drain region 3 are formed respectively so as to sandwich a region being in contact with the p-type silicon semiconductor region 1 and the first gate insulating layer 4. EEPROM memory cells, which contain a quantity of charge stored in the first charge storage layer 5 as information, are configured with such source region 2, drain region 3, first charge storage layer 5, and control electrode 7, where the spacing between the source region 2 and the drain region 3 is 0.01 μm to 0.5 μm.

In the second embodiment, the following features are provided in addition to Features 1 through 5 of the first embodiment.

[Feature 7]

The control electrode 7 is formed in the same direction as the source region 2, the semiconductor region 1, and the drain region 3. Accordingly, as with an exemplary embodiment to be described later, it is suitable for implementing an AND structure or a virtual ground structure, for example, where the source region 2 and the drain region 3 of neighboring memory cells are connected in parallel. In addition, since the device isolating and insulating layer 12, the source region 2, the drain region 3, and the first charge storage layer 5 may be formed in a self-aligned manner, there is no need to secure margins for misalignment between such layers, and a higher-density memory cell may be implemented. Furthermore, it is possible to store two-bit data per memory cell, and to implement a higher-density memory cell by storing charges in the two source and drain ends of a memory cell, respectively, separated by the direction of the read-out current flow so as to read out data.

[Feature 8]

The first block insulating layer (second insulating layer) 61 and the second charge storage layer (fourth insulating layer) 62 are formed after the device isolating and insulating layer 12 is formed. Thus the first block insulating layer (second insulating layer) 61 and the second charge storage layer (fourth isolating layer) 62 are not subjected to oxidization processing for forming the device isolating and insulating layer 12. Accordingly, a more uniform film may be formed without the problem of providing a thicker film because of the oxidation of the first block insulating layer (second insulating layer) 61 and the second charge storage layer (fourth insulating layer) 62 when forming the device isolating and insulating layer 12. In addition, a film with little film deterioration due to thermal processing may be formed, and a film, which does not undergo the oxidation processing for the device isolating and insulating layer 12, such as an $Al_2O_3$ film, a ZrSiO film, an HfSiO film, a ZrSiON film, or an HfSiON film, may be used. Furthermore, the mask for forming the device isolating and insulating layer 12 through oxidation is thin since only the first charge storage layer 5 is used. Therefore, frequency of defects that occur due to the heat stress of the first charge storage layer 5 may decrease, and a more reliable semiconductor memory may be implemented.

First Modified Example of the Second Embodiment

Figure 9:
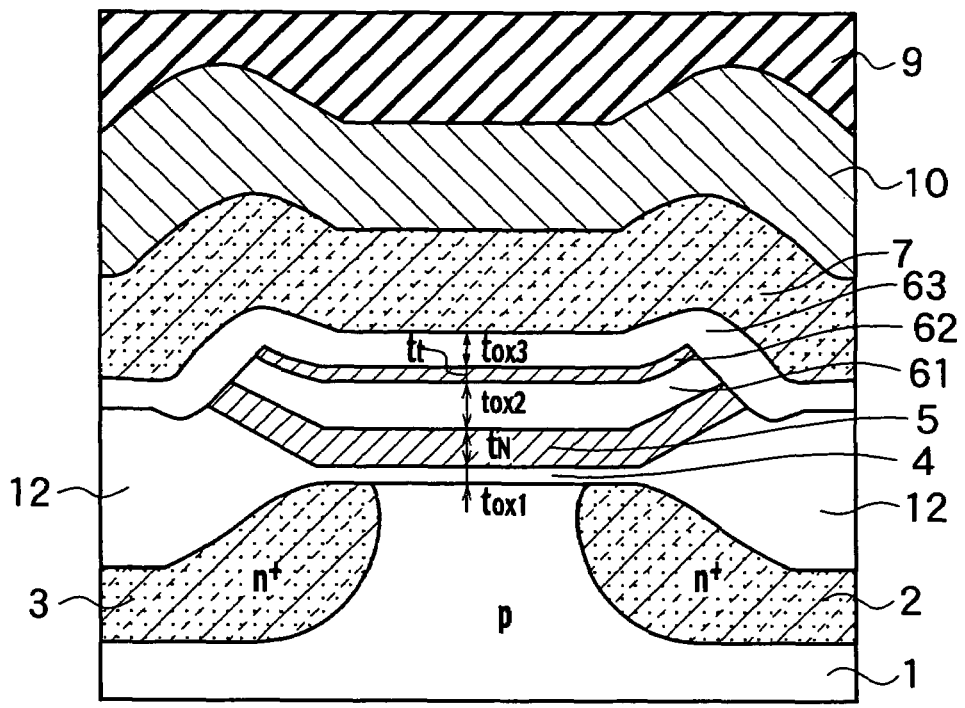
FIG. 9 shows a schematic cross-sectional structure of a semiconductor memory according to a first modified example of the second embodiment of the present invention.

FIG. 9 shows an exemplary cross-sectional structure of a semiconductor memory according to the first modified example of the second embodiment of the present invention. The first modified example is essentially similar to the second embodiment, however, it differs in that the device isolating and insulating layer 12 is formed after the first block insulating layer 61 and the second charge storage layer 62 are formed, where the first block insulating layer 61 and the second charge storage layer 62 are divided. Here, the device isolating and insulating layer 12 should be formed by etching the second charge storage layer 62, the first block insulating layer 61, and the first charge storage layer 5 through lithography and etching processes once the second charge storage layer 62 is formed on the entire surface. In addition, the same conditions as described with the second embodiment may be used, thus description of the film thickness conditions is omitted. This modified example has the following features in addition to Features 1 through 5, and Feature 7 of the first embodiment and second embodiment.

[Feature 9]

The second charge storage layer 62 is segmented on the device isolating and insulating layer 12 as with the first charge storage layer 5, and is surrounded by the first block insulating layer 61 and the second block insulating layer 63, which have higher barriers for the electrons. Accordingly, the charges contained in the second charge storage layer 62 do not move horizontally in FIG. 9, so that reliability is further improved in high temperature conditions. It should be noted that since the second charge storage layer 62 is surrounded by the first block insulating layer 61 and the second insulating layer 63 and divided from other memory cells, in the first modified example, a conductive film, such as silicon (Si), a silicon-germanium (SiGe) mixed crystal, or a silicon-germanium-carbide (SiGeC) mixed crystal, for example, may be used as the second charge storage layer 62.

Second Modified Example of the Second Embodiment

Figure 10:
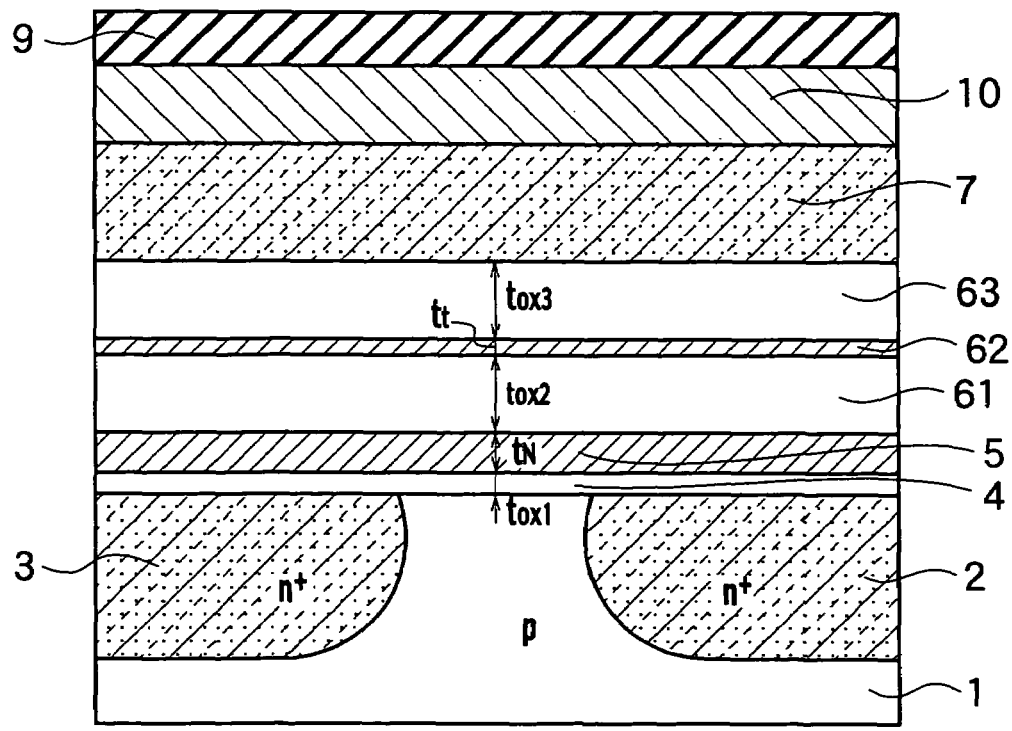
FIG. 10 shows a schematic cross-sectional structure of a semiconductor memory according to a second modified example of the second embodiment of the present invention.

FIG. 10 shows an exemplary cross-sectional structure of a semiconductor memory according to a second modified example of the second embodiment of the present invention. The second modified example is essentially similar to the second embodiment. However, it differs from the second embodiment in that the device isolating and insulating layer 12 is not formed. In the second modified example, the source region 2 and the drain region 3 are formed through ion implantation techniques. The stacked layers configured with the first gate insulating layer 4, the first charge storage layer 5, the first block insulating layer 61, the second charge storage layer 62, and the second block insulating layer 63 are formed on the p-type silicon semiconductor region 1. The control electrode 7 made from a polysilicon and the metal-lined layer 10 are deposited on the entire surface; and the first gate insulating layer 4, first charge storage layer 5, first block insulating layer 61, second charge storage layer 62, second block insulating layer 63, control electrode 7, and metal-lined layer 10 are formed by patterning. The same conditions as described in the second embodiment may be used, thus description of the film thickness conditions is omitted. In the second modified example, the following features are provided in addition to Features 1 through 4, and Feature 7 of the first embodiment and second embodiment.

[Feature 10]

The control electrode 7 is formed in the same direction as the source region 2, the semiconductor region 1, and the drain region 3. Accordingly, as with an exemplary embodiment to be described later, the second modified example is suitable for implementing an AND memory cell or a virtual ground-type memory cell, for example, where the source region 2 and the drain region 3 of the neighboring memory cells are connected in parallel. In addition, since the device isolating and insulating layer is not formed in the direction in which the p-type silicon semiconductor region 1 and the drain region 3 are to be formed, a memory cell having a more uniform film thickness can be implemented without the thickness of the stacked layers configured with the first gate insulating layer 4, the first charge storage layer 5, the first block insulating layer 61, the second charge storage layer 62, and the second block insulating layer 63 changing at the ends of the device isolating and insulating layer. Accordingly, variation in the programming and the erasure threshold voltages may also be further decreased.

It is apparent that the semiconductor memory according to the second embodiment of the present invention is capable of performing an erase operation with the same applied voltage as the semiconductor memory according to the first embodiment.

Third Embodiment

Figure 11:
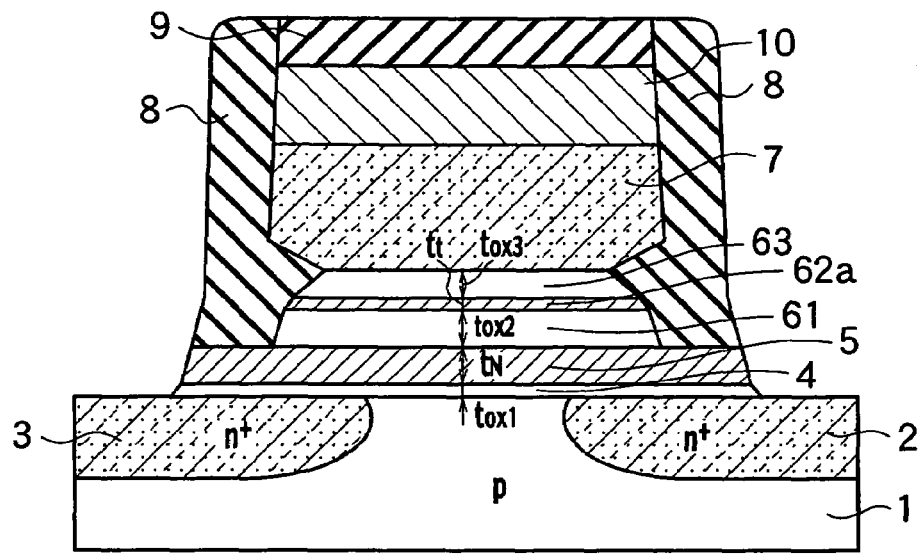
FIG. 11 shows a schematic cross-sectional structure of a semiconductor memory according to a third embodiment of the present invention.

FIG. 11 shows an exemplary cross sectional structure of a semiconductor memory according to the third embodiment of the present invention. It should be noted that detailed description for the same portions as with the first embodiment and second embodiment using the same reference numerals is omitted.

The semiconductor memory according to the third embodiment of the present invention replaces an insulating layer doped with an accepter impurity for a second charge storage layer 62. The semiconductor memory according to the third embodiment of the present invention has a feature that, in comparison with the conventional example, has a second charge storage layer 62a for storing negative charges by doping the portion corresponding to the second charge storage layer 62 with an acceptor impurity. In FIG. 11, a first gate insulating layer 4, for example, made from a silicon oxide film or an oxynitride film having a thickness of 0.5 nm to 10 nm, is formed on the p-type silicon semiconductor region 1 where the boron or indium impurity concentration is between $10^{14}$ cm$^{-3}$ to $10^{19}$ cm$^{-3}$, for example. In this case, $t_{ox1}$ denotes the thickness of the flat portion of the first gate insulating layer 4, and $\in_{ox1}$ denotes a dielectric constant of the first gate insulating film. The first gate insulating layer 4 is, for example, fabricated in a stripe form, and the device isolating and insulating layer 12 (omitted from the drawing), is formed on both side made from, for example, the silicon oxide film thereof, having a thickness in the range of 0.05 μm to 0.5 μm. In addition, a first charge storage layer 5 having a thickness of 3 nm to 20 nm, which is a silicon nitride film, a silicon oxynitride film, or an alumina film, is formed on the top side of the first gate insulating layer 4 and a part of the top side of the device isolating and insulating layer 12. In this case, $t_N$ denotes the thickness of the flat portion of the first charge storage layer 5 on the first gate insulating layer 4, and $\in_N$ denotes the dielectric constant of the first charge storage film.

Stacked on this structure is a first block insulating layer (second insulating layer) 61 having a thickness of 0.5 nm to 30 nm, made from a silicon oxide film, an oxynitride film, an Al$_2$O$_3$ film, a ZrSiO film, an HfSiO film, a ZrSiON film, or an HfSiON film. In this case, $t_{ox2}$ denotes the thickness of the flat portion of the first block insulating layer (second insulating layer) 61, and $\in_{ox2}$ denotes the dielectric constant of the first block insulating film. Stacked on the foregoing structures is the second charge storage layer (fourth insulating layer) 62a doped with an acceptor impurity having a thickness of 0.5 nm to 10 nm, which is made from a silicon oxide film, an oxynitride film, a ZrSiO film, an HfSiO film, a ZrSiON film, an HfSiON film, or a silicon oxynitride film, for example. In this case, $t_t$ denotes the thickness of the flat portion of the second charge storage layer 62a, and $\in_t$ denotes the dielectric constant of the second charge storage film. In addition, a preferable structure is doped with more than $10^{17}$ cm$^{-3}$ of boron as an acceptor impurity. Further stacked on this structure is a second block insulating layer (third insulating layer) 63 having a thickness of 0.5 nm to 30 nm, which is a silicon oxide film, an oxynitride film, an $Al_2O_3$ film, a ZrSiO film, an HfSiO film, a ZrSiON film, or an HfSiON film, for example. In this case, $t_{ox3}$ denotes the thickness of the flat portion of the second block insulating layer (third insulating layer) 63, and $\in_{ox3}$ denotes the dielectric constant of the second block insulating film. In this case, the first block insulating layer 61 is a relaxation layer that functions to prevent an interface trap being formed when an acceptor impurity reaches the interface between the first charge storage layer 5 and the first block insulating layer 61, and to improve the controllability of the number of interface traps in order to improve reliability. In addition, the second block insulating layer 63 is a relaxation layer that functions to prevent an interface trap being formed when an acceptor impurity reaches the interface between a control electrode 7 and the second block insulating layer 63, and to improve the controllability of the number of interface traps in order to improve reliability. Accordingly, such layers are formed so that the maximum volume density of the acceptor impurity in the first block insulating layer 61 and the second block insulating layer 63 is less than the maximum volume density of the acceptor impurity in the second charge storage layer (fourth insulating layer) 62a, and the peak of the maximum volume density of the acceptor impurity is in the stacked layers instead of at the end of the stacked layers when the first block insulating layer 61, the second charge storing layer 62a, and the second block insulating layer 63 are combined.

Such structure may be obtained through deposition by chemical vapor deposition (CVD) by doping with diborane, for example, when forming the second charge storage layer (fourth insulating layer) 62a through deposition; or through ion implantation of boron or boron fluoride ($BF_2$) with dose amounts of $10^{14}$ cm$^{-2}$ to $10^{17}$ cm$^{-2}$ at 5 eV to 20 keV, after formation of the second charge storage layer (fourth insulating layer) 62a. In addition, as is apparent from equation (10) to be described later, making the sum of the thickness $t_{ox2}$ of the first block insulating layer 61 and the thickness $t_t$ of the second block insulating layer 63 larger than the thickness $t_{ox3}$ of the second block insulating layer 63 desirably further decreases the flat band voltage $V_{FB}$ after erasure. In addition, the control electrode 7 is formed with a thickness of 10 nm to 500 nm to which is doped boron, arsenic, or phosphorus in the range of $1\times10^{19}$ cm$^{-3}$ to $1\times10^{21}$ cm$^{-3}$. In this case, when boron is doped to the control electrode 7, making the boron concentration less than $1\times10^{20}$ cm$^{-3}$ desirably prevents anomalous diffusion of the boron into the silicon oxide film, and stabilizes threshold voltages for simultaneously formed PMOS electric field transistors. In addition, making the boron concentration of the control electrode 7 more than $1\times10^{19}$ cm$^{-3}$ suppresses depletion of the control electrode 7 and reduction of the effective electric field over ONONO stacked layers. Therefore, suppression of the depletion of the control electrode 7 and the reduction in the electric field on the ONONO stacked layers will realize shorter erase time. In addition, when silicon oxide film or the silicon oxynitride film is used as the first gate insulating layer 4, the height of the barrier for the holes is higher than the height of the barrier for the electrons, and the film must be made thinner for the tunneling phenomenon to occur, where at least a thin film of less than 3.5 nm is needed in order to obtain sufficient hole-tunneling current for erasure. Accordingly, in order to inject the holes from the p-type silicon semiconductor region 1 into the first charge storage layer 5 by using the direct tunneling phenomenon, it is desirable that $t_{ox1}$ be limited to less than 3.5 nm. In addition, in this case, for example, a deposited silicon oxide film obtained from tetraethoxysilane (TEOS) by high temperature oxidation (HTO), for example, is a first material candidate for the first block insulating layer (second insulating layer) 61, however, a silicon oxide film or a silicon oxynitride film, which is obtained by oxidizing the first charge storage layer 5, may also be used.

Furthermore, a metal-lined layer 10 for the control electrode 7 having a thickness of 10 nm to 500 nm, which is made from, for example, WSi or NiSi, MoSi, TiSi, CoSi, W, or Al, may be formed on this control electrode 7. The control electrode 7 is made from a polysilicon, where a plurality of the control electrodes 7 are connected together with low resistance by the metal-lined layer 10.

In addition, an insulating layer 9 having a thickness of 5 nm to 500 nm, which is made from a silicon nitride film or silicon oxide film, for example, is formed on that metal-lined layer 10. It should be noted that also in the third embodiment of the present invention, in order to reduce the threshold voltage range from increasing due to variation in the programming and the erasure electric fields, it is desirable that the gate insulating layer 4, the first charge storage layer 5, the first block insulating layer 61, the second charge storage layer 62a, and the second block insulating layer 63 are formed with a uniform film thickness extending from the boundary of the p-type silicon semiconductor region 1 and the source region 2 to the boundary of the p-type silicon semiconductor region 1 and the drain region 3.

Moreover, an n-type source region 2 and an n-type drain region 3 are formed respectively so as to sandwich a region being in contact with the p-type silicon semiconductor region 1 and the first gate insulating layer 4. EEPROM memory cells, which contain a quantity of charges stored in the first charge storage layer 5 as information, are configured with such source region 2, drain region 3, first charge storage layer 5, and control electrode 7, where the spacing between the source region 2 and the drain region 3 is 0.01 μm to 0.5 μm.

Figure 12:
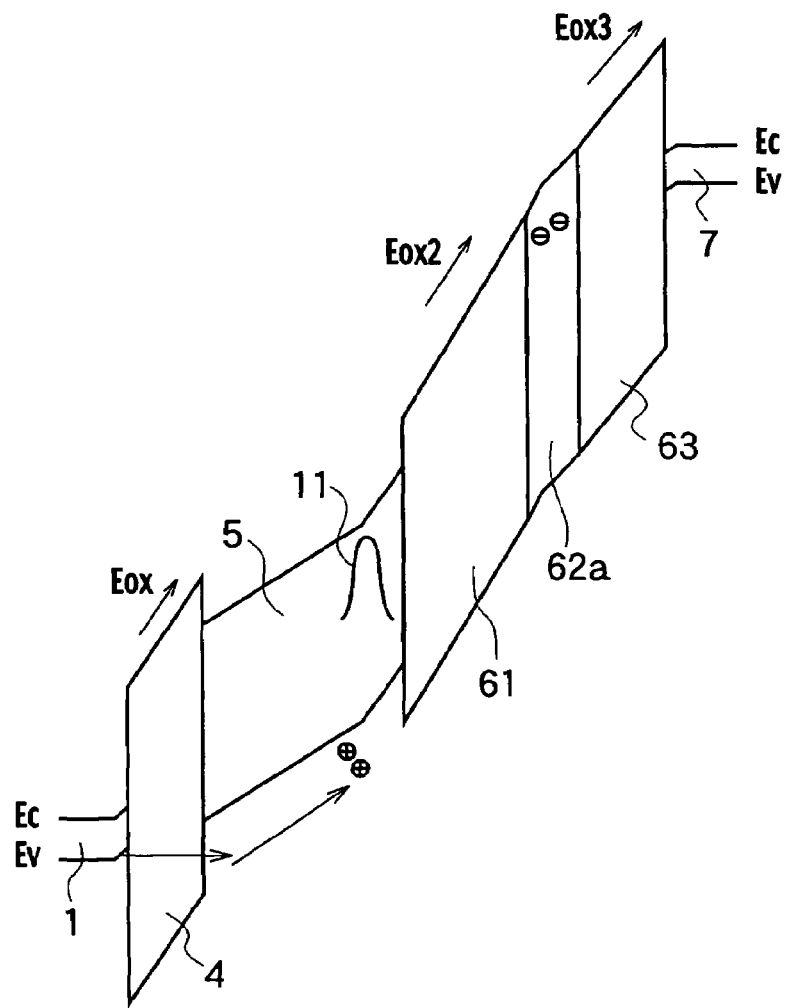
FIG. 12 is a band structural diagram upon erasure with the semiconductor memory according to the third embodiment of the present invention.

FIG. 12 shows a band structural diagram of an erasure operation, which occurs on the p-type silicon semiconductor region 1, more specifically, when electrons are injected from the control electrode 7 with the semiconductor memory according to the third embodiment of the present invention. With the semiconductor memory according to the third embodiment of the present invention, given that $x_t$ denotes the distance from the first block insulating layer 61 to the charge centroid of negative charges formed in the second charge storage layer 62a, and $Q_t$ denotes the surface concentration of negative charge, the following equation is established as with equation (6) in the first embodiment.

$$V_{FB}=V_{FBi}-Q_N/C_1+(t_{ox2}+x_t\times\in_{ox2}/\in_t)\times E_{ox2}+[t_{ox3}+(t_t-x_t)\times\in_{ox3}/\in_t]\times E_{ox3} \quad (9)$$

Here, $E_{ox2}$ denotes the electric field in the first block insulating layer 61, and $E_{ox3}$ denotes the electric field in the second block insulating layer 63. In addition, given that $Q_t$ denotes the surface concentration of charge stored in the second charge storage layer (fourth insulating layer) 62a, equation (9) is modified as follows using Gauss' theorem $\in_o\times\in_{ox2}E_{ox2}=Q_t+\in_o\times\in_{ox3}E_{ox3}$.

$$V_{FB} = V_{FBi} - Q_N/C_1 + (t_{ox2} + x_t \times \varepsilon_{ox2}/\varepsilon_t) \times Q_t/(\varepsilon_o \times \varepsilon_{ox2}) + \qquad (10)$$
$$(t_{ox2} \times \varepsilon_{ox3}/\varepsilon_{ox2} + t_t \times \varepsilon_{ox3}/\varepsilon_t + t_{ox3}) \times E_{ox3}$$

From equation (10), where the electric field $E_{ox3}$ in the second block insulating layer 63 is constant, when $Q_t$ is negative, that is, more electrons are stored in the second charge storage layer (fourth insulating layer) 62, the more the erasure flat-band voltage $V_{FB}$ may be lowered. In this case, it is possible to lower the saturated erasure threshold voltage for the term $Q_t$, that is, for $(t_{ox2}+x_t\times\varepsilon_{ox2}/\varepsilon_t)\times Q_t/(\varepsilon_o\times\varepsilon_{ox2})$ by making the thickness of the stacked first block insulating layer 61, second charge storage layer (fourth insulating layer) 62a, and the second block insulating layer 63 of FIG. 2 that is equivalent to the thickness of a silicon oxide film, to be equal to the thickness of the block insulating layer 6 of FIG. 3 which is equivalent to the thickness of a silicon oxide film. This is because, according to the relational expression between $E_{ox4}$ and $E_{ox}$ described in FIG. 4 and equation (5), the fact is disclosed in the third embodiment of the present invention where by making $t_{ox}$, $E_{ox}$, and $Q_N$ be equal in FIG. 2 and FIG. 3, and making the electric field $E_{ox3}$ of the block insulating layer 6 being in contact with the control electrode 7 be equal to $E_{ox4}$ independent of the film thicknesses of the first charge storage layer 5 and the block insulating layer 6, and independent of the control gate erasure voltage $V_{pp}$, under the conditions where the erasure threshold voltage is saturated, it is possible to obtain the electric field condition that causes saturation. For example, by doping $N_A$ of approximately up to $10^{19}$ cm$^{-3}$ acceptors (or electron traps) that are activated as the second charge storage layer 62a, and making the film thickness t 5 nm, it is possible to store as much as $Q_t$ of approximately 8 fC/μm$^2$. Furthermore, for example, given that the thickness $t_{ox2}$ of the flat portion of the first block insulating layer 61 is 5 nm, the charge centroid position $x_t$ of the second charge storage layer 62a is 2.5 nm, and given that the dielectric constants of the first block insulating layer 61, the second charge storage layer 62a, and the second block insulating layer 63 are equivalent in the case where a silicon oxide film is used as the first block insulating layer 61, the second charge storage layer 62a, and the second block insulating layer 63, the erasure threshold voltage may be lowered by $(t_{ox2}+x_t\times\varepsilon_{ox2}/\varepsilon_t)\times Q_t/(\varepsilon_o\times\varepsilon_{ox2})$ of approximately 1.7 V so as to be further negative in comparison with that for the structure of FIG. 3. Furthermore, according to equation (10), if the effective oxide film thickness $(t_{ox2}\times\varepsilon_{ox3}/\varepsilon_{ox2}+t_t\times\varepsilon_{ox3}/\varepsilon_t+t_{ox3})$ of the block insulating layer 6 is constant, $V_{FB}$ preferably becomes even lower by making $t_{ox2}$ thicker than $t_{ox3}$.

The structure of this application is further desirable since the smaller $V_{FB}$, the deeper the erasure may be performed in the case where the control gate erasure voltage $V_{pp}$ is made constant under the conditions where $t_{eff}$ is equivalent in both FIG. 12 and FIG. 3, whereby the gate drive characteristics and short-channel effect from the control electrode 7 to the p-type silicon semiconductor region 1 are constant. In addition, these conditions, which make the film thickness of the first gate insulating layer 4 constant, and keep constant the sum of the effective film thicknesses converted to the silicon oxide films in the first block insulating layer 61, the second charge storage layer 62a, and the second block insulating layer 63, are conditions where the applied electric field during programming becomes almost identical, and the programming speed becomes equal. This is in accordance with FIG. 5. Accordingly, programming and read-out times are almost constant under the foregoing conditions.

First Modified Example of the Third Embodiment

Figure 13:
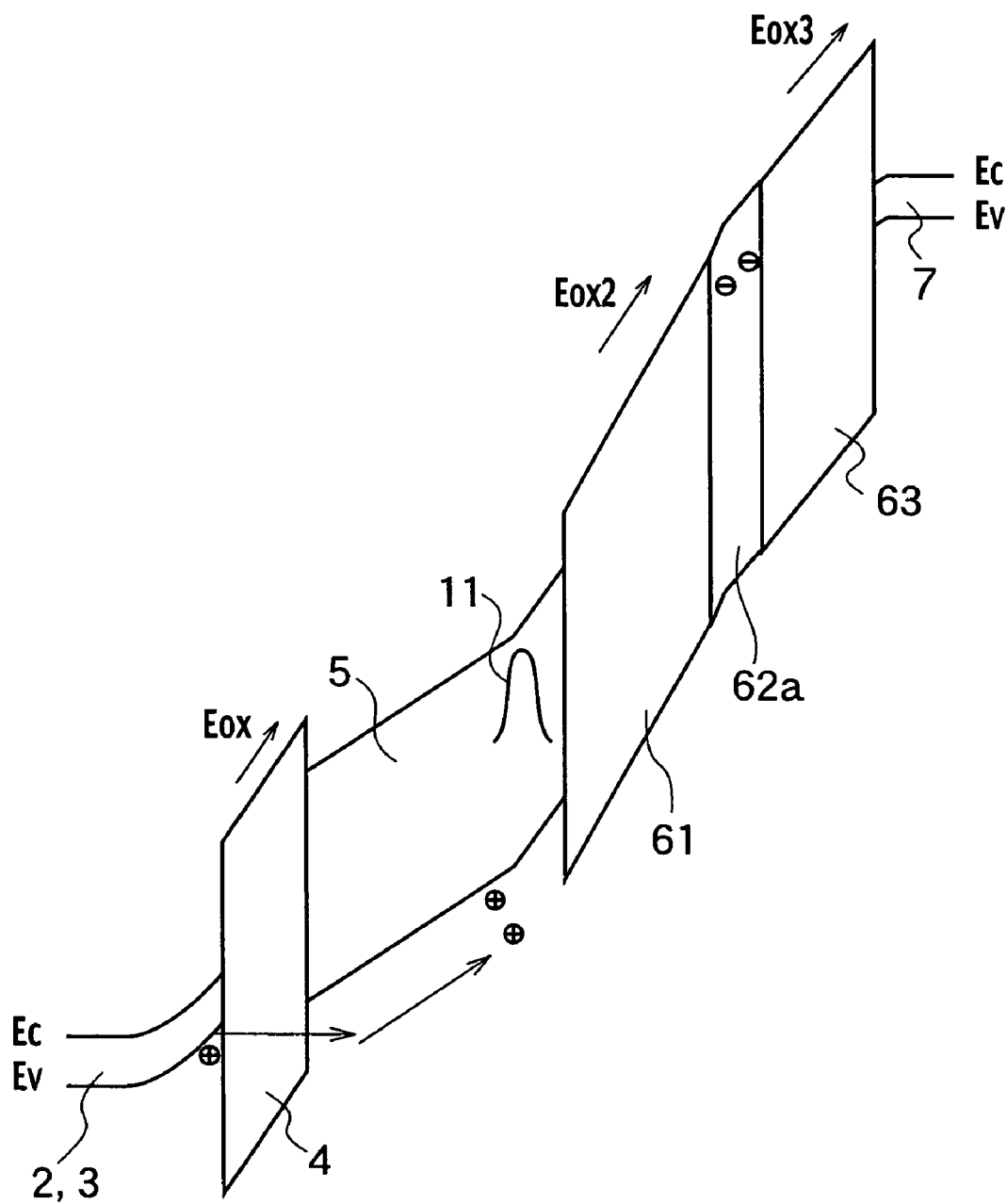
FIG. 13 is a band structural diagram upon erasure with a semiconductor memory according to a first modified example of the third embodiment of the present invention.

In the above, the relationship of the electric currents that flow between the p-type silicon semiconductor region 1 and the first charge storage layer 5 has been described. Similarly, erasure may be performed by flowing hole currents between the n-type source region 2 or the n-type drain region 3 and the first charge storage layer 5. In this case, it is logical to use the values of the flat sections on the source region 2 and the drain region 3 in which hole currents flow as $t_{ox1}$, $t_N$, $t_{ox2}$, $t_t$, and $t_{ox3}$. FIG. 13 shows a band structural diagram for an erasure operation, more specifically, under the conditions where electrons are injected from the control electrode 7. FIG. 13 shows a large potential difference applied between the source region 2 and/or drain region 3, and the control electrode 7 when, for example, a voltage that is between 5 V and 20 V is applied to either the n-type source region 2 or the n-type drain region 3, the voltage of the p-type silicon semiconductor 1 is between the voltage of the source region 2 and/or the drain region 3 to which the voltage is applied and 0 V, and the voltage of the control electrode 7 is between −20 V and −5 V. Erasure may be performed on either the source side or the drain side, or on both sides of the source and the drain, however, to simplify explanation hereafter, the source region 2 and the drain region 3 to which the voltage is applied such that holes are injected into the first charge storage layer 5 are indicated as a source and a drain region, respectively. In this case, more band bending occurs as more holes are generated in the vicinity of the interface that is close to the first gate insulating layer 4 on the n-type source region 2 or the n-type drain region 3, where the holes pass through the first gate insulating layer 4 so as to be injected as a result of the direct tunneling phenomenon. In this case, the reasoning by which equations (9) and (10) are derived may be valid when replacing the definitions of $\Phi_s$, $V_{pp}$, $V_{FB}$, and $V_{FBi}$. In FIG. 12, the surface band bending of the n-type source region 2 or the n-type drain region 3 upon erasure is replaced with $\Phi_s$, the erasure voltage of the control gate on the basis of the n-type source region 2 or the n-type drain region 3 is replaced with $V_{pp}$, and the electric field $E_{ox}$ applied to the first gate insulating layer 4, the electric field $E_{ox2}$ applied to the first block insulating layer 61, and the electric field $E_{ox3}$ applied to the second block insulating layer 63 are indicated with arrows. In addition, $V_{FBi}$ is replaced with the flat band voltage of the control electrode 7 that is relative to the source region 2 or the drain region 3 when $Q_N=0$ and $Q_t=0$, and the flat band voltage, which is measured such that the band bending does not occur between the interface of the first gate insulating layer 4 on the n-type source region 2 and the n-type drain region 3 after erasure, is replaced with $V_{FB}$. From this, $V_{FBi}$ is the difference between the Fermi energy of the source region 2 and the drain region 3 and the Fermi energy of the control electrode 7, and is approximately 0 V on the control electrode 7 made from the n-type doped polysilicon relative to the n-type source region 2 and the n-type drain region 3; or approximately 1 V on control electrode 7 made from the p-type doped polysilicon relative to the n-type source region 2 and the n-type drain region 3. Thus, it is possible to determine more accurately by calculation from the impurity densities of the n-type source region 2, the n-type drain region 3, and the control electrode 7. Furthermore, it may be considered that the surface band bending $\Phi_s$ upon erasure is almost inverted to the n-type source region 2 and the n-type drain region 3 since more band bending occurs as more holes are generated in the vicinity of the interface that is close to the first gate insulating layer 4 on the n-type source region 2 and the n-type drain region 3. In this case, $\Phi_s$ may be considered to be approximately −1 V. Therefore, it can be understood that the same solution may be directly obtained by the expression of equation (10).

Such analyses are valid independently for each of the p-type silicon semiconductor region 1, the n-type source region 2, and the n-type drain region 3. Accordingly, in the case where the holes are injected from the n-type silicon semiconductor region 1 into the first charge storage layer 5 if the n-type silicon semiconductor region 1 is used rather than the p-type silicon semiconductor region 1, the same analysis as that of the case where the holes are injected from the above-discussed n-type source region 2 and n-type drain region 3 into the first charge storage layer 5 may be valid, and equation (10) may be used. In addition, if the p-type source region 2 and the p-type drain region 3 are formed when the n-type silicon semiconductor region 1 is used, and if the holes are injected from the p-type source region 2 and the p-type drain region 3 into the first charge storage layer 5, the same analysis as that of the case where the holes are injected from the above-discussed p-type silicon semiconductor region 1 into the first charge storage layer 5 may be valid, and equation (10) may be used. It is apparent from the above that either the n-channel field-effect transistor or the p-channel field-effect transistor may provide the same effect as with the semiconductor memory according to the third embodiment of the present invention. The above-described erasure by direct tunneling injection of the holes from the p-type silicon semiconductor region 1 or source region 2 and the drain region 3 into the first charge storage layer 5 has advantages, such as high injection efficiency, and reduction of power consumption during erasure since uniform erasure of the entire first charge storage layer 5 is possible, and all of the generated hole currents may be used for tunneling injection.

Furthermore, it is apparent from the operational principle for the derivation of equations (9) and (10) to result as with the case where the dependency of the hole injection from the p-type silicon semiconductor region 1 into the first charge storage layer 5 on the electric field of the first gate insulating layer 4 is weaker than the dependency that FN tunneling electron injection of electrons from the control electrode 7 into the first charge storage layer 5 holds. Accordingly, in the case of the semiconductor memory according to the first modified example of the third embodiment of the present invention where the hole injection from the p-type silicon semiconductor region 1 into the first charge storage layer 5 is performed according to the hot holes technique, dependency on the electric field of the first gate insulating layer 4 is weaker than direct tunneling since the height of the barrier of the first gate insulating layer 4 for the hot holes is by far lower than the height of the barrier for the not-hot holes. Accordingly, it is apparent that the same effect may naturally be obtained as with the semiconductor device according to the third embodiment of the present invention. In this case, with the same structure as that in FIG. 1, for example, where the hot holes generated between the source region 2, the drain region 3, and the p-type silicon semiconductor region 1 are passed through the first gate insulating layer 4 and injected into the first charge storage layer 5, a voltage between, for example, 4 V and 20 V must be applied to either the n-type source region 2 or the n-type drain region 3, the voltage of the p-type silicon semiconductor region 1 must be set to 0 V, for example, and the voltage of the control electrode 7 must be set to between −15 V and 0 V. In addition, in this case, the voltage of the control electrode 7 relative to the voltage of the p-type silicon semiconductor region 1 may be used as the control gate erasure voltage $V_{pp}$ in equation (4). Furthermore, $t_{ox1}$ is not always necessary to be less than 3.5 nm to provide erasure for hot-hole injection. In addition, in the erasure method using hot holes, less voltage may be applied to the source region 2, the drain region 3, and the control electrode 7 than in the erasure method by direct tunneling, thus the erase operation may be implemented with a lower voltage.

The semiconductor memory according to the third embodiment and first modified example thereof of the present invention has the same features as Features 1, 2, and 5 of the semiconductor memory according to the first embodiment if the second charge storage layer 62 in Features 1 and 2 according to the first embodiment of the present invention is replaced with the second charge storage layer 62a to which an acceptor such as boron is doped, and in addition, has the following features.

[Feature 11]

With the semiconductor memory according to the third embodiment of the present invention, the process of injecting charges into the second charge storage layer 62a is not necessary as described in the semiconductor memory according to the first embodiment and second embodiment since an acceptor impurity is doped originally to the second charge storage layer 62a. Accordingly, the charge programming time period of the memory cells may be reduced, and the testing time period may also be reduced. In addition, since negative charges that are bound by the acceptor impurities are used, they may be kept more stable than the charges contained in the second charge storage layer 62 of the semiconductor memory according to the first embodiment or the second embodiment of the present invention. Accordingly, the first block insulating layer 61 and the second block insulating layer 63 may be even thinner films, and the gate voltages required for programming and erasure may be decreased. Accordingly, the area of a high-voltage circuit may be minimized, and a semiconductor memory having an even smaller chip area may be implemented.

[Feature 12]

With the semiconductor memory according to the third embodiment and first modified example thereof of the present invention, the control electrode 7 may be formed in an orthogonal manner relative to the direction in which the source region 2, the p-type silicon semiconductor region 1, and the drain region 3 are formed. Accordingly, as with an exemplary embodiment to be described later, the semiconductor memory according to the third embodiment and first modified example thereof of the present invention is suitable for forming a structure such as a NAND structure, where the source region 2 and the drain region 3 of neighboring memory cells are connected in series.

Second Modified Example of the Third Embodiment

Figure 14:
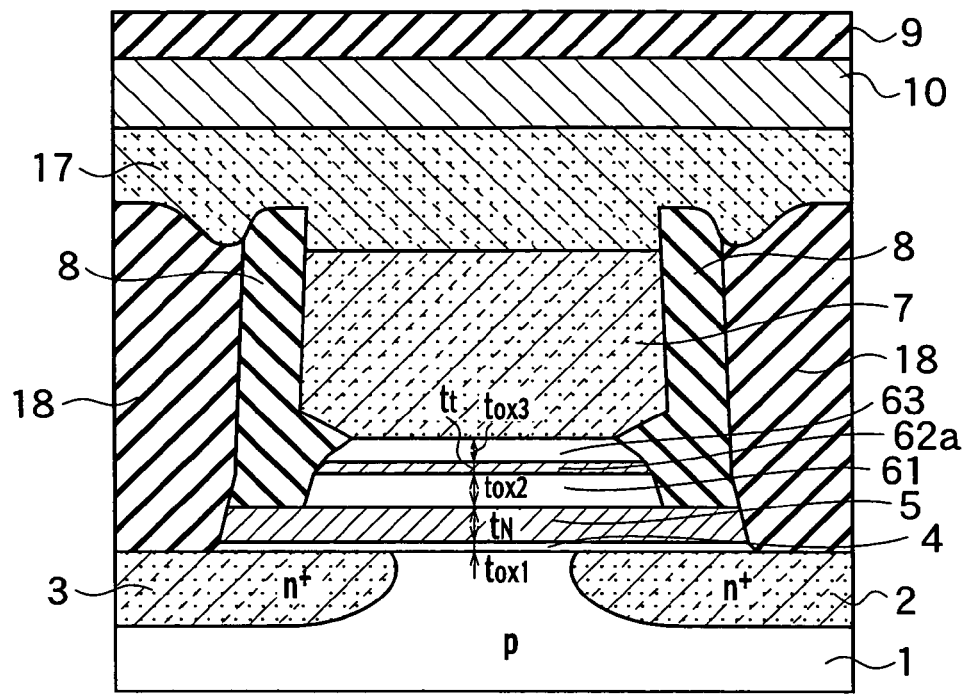
FIG. 14 shows a schematic cross-sectional structure of a semiconductor memory according to a second modified example of the third embodiment of the present invention.

FIG. 14 shows an exemplary cross-sectional structure of a semiconductor memory according to the second modified example of the third embodiment of the present invention. As with the second modified example of FIG. 14, it is apparent that a gate control line 10, connected to the control electrode 7, may be formed in the same direction as the source region 2, the p-type silicon semiconductor region 1, and the drain region 3 are formed once the insulating layer 9 has been peeled from the structure of FIG. 11. Further an AND structure or a virtual ground array structure may also be formed. In this case, reference numeral 17 is a polysilicon layer having a thickness of 10 nm to 500 nm, to which is doped boron, phosphorus, or arsenic in a concentration range of $1 \times 10^{19}$ $cm^{-3}$ to $1\times10^{21}$ $cm^{-3}$. Reference numeral 18 is an insulating layer made from a silicon oxide film or a silicon nitride film, which may be formed by filling between the adjacent control electrodes 7 after formation of the source region 2 and the drain region 3.

Fourth Embodiment

Figure 15:
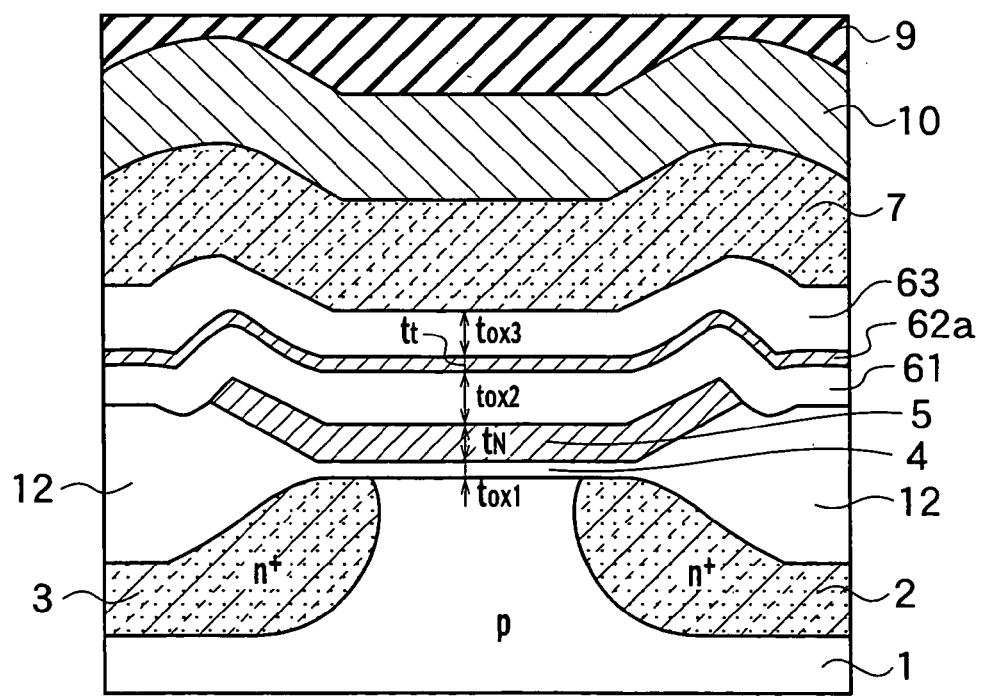
FIG. 15 shows a schematic cross-sectional structure of a semiconductor memory according to a fourth embodiment of the present invention.

A semiconductor memory according to the fourth embodiment of the present invention provides a control line 10, connected to a control electrode 7, which is formed in the same direction as a source region 2, a p-type silicon semiconductor region 1, and a drain region 3 are formed, relative to the third embodiment. FIG. 15 shows a semiconductor memory according to the fourth embodiment of the present invention. It should be noted that detailed description for the same portions as with the first through third embodiments using the same reference numerals is omitted.

The semiconductor memory according to the fourth embodiment of the present invention differs from the third embodiment in that a device isolating and insulating layer 12 made from a silicon oxide film is formed on the source region 2 and the drain region 3 in a self-aligned manner. The fourth embodiment of the present invention has a feature that, in comparison with the conventional example, has a second charge storage layer (fourth insulating layer) 62a doped with an acceptor impurity as the second charge storage layer 62. In FIG. 15, a first gate insulating layer 4, made from a silicon oxide film or an oxynitride film having a thickness of 0.5 nm to 10 nm, is formed on a p-type silicon semiconductor region 1 where an impurity concentration of boron or indium is between $10^{14}\,cm^{-3}$ to $10^{19}\,cm^{-3}$, for example. In this case, $t_{ox1}$ denotes the thickness of a flat portion of the first gate insulating layer 4, and $\in_{ox1}$ denotes a dielectric constant of the first gate insulating film. The first gate insulating layer 4 is fabricated in a stripe form, for example, and the device isolating and insulating layer 12 having a thickness in the range of 0.05 μm to 0.5 μm, which is made from a silicon oxide film, for example, is formed on both sides thereof. In addition, a first charge storage layer 5 having a thickness of 3 nm to 20 nm, made from a silicon nitride film is formed on the top side of the first gate insulating layer 4 and a part of the top side of the device isolating and insulating layer 12. In this case, $t_N$ denotes the thickness of the flat portion of the first charge storage layer 5 on the first gate insulating layer 4, and $\in_N$ denotes the dielectric constant of the first charge storage film. Such shape may be obtained by forming the first gate insulating layer 4 on the entire surface of the p-type silicon semiconductor region 1; depositing the first charge storage layer 5 on the entire surface; patterning the first charge storage layer 5; and then oxidizing the p-type silicon semiconductor region 1.

In addition, an n-type source region 2 and an n-type drain region 3 are formed through diffusion or ion implantation at a level lower than the device isolating and insulating layer 12 at a depth of between 10 nm and 500 nm so that the surface concentration of, for example, phosphorus, arsenic, or antimony is $10^{17}\,cm^{-3}$ to $10^{21}\,cm^{-3}$. This may be formed independently of the device isolating and insulating layer 12 in a self-aligned manner by using the patterned first charge storage layer 5 as a mask.

Stacked on the above structure a first block insulating layer (second insulating layer) 61 having a thickness of 0.5 nm to 30 nm, which is made from a silicon oxide film, an oxynitride film, an $Al_2O_3$ film, a ZrSiO film, an HfSiO film, a ZrSiON film, or an HfSiON film. In this case, $t_{ox2}$ denotes the thickness of the flat portion of the first block insulating layer (second insulating layer) 61, and $\in_{ox2}$ denotes the dielectric constant of the first block insulating film. Stacked thereon is the second charge storage layer (fourth insulating layer) 62a doped with an acceptor impurity having a thickness of 0.5 nm to 10 nm, and made from a silicon oxide film, an oxynitride film, a ZrSiO film, an HfSiO film, a ZrSiON film, an HfSiON film, or a silicon oxynitride film. In this case, $t_t$ denotes the thickness of the flat portion of the second charge storage layer 62a, and $\in_t$ denotes the dielectric constant of the second charge storage film. In addition, a preferable structure is doped with boron in a concentration of more than $10^{17}\,cm^{-3}$ as an acceptor impurity. In this manner, the fact that negative charges are generated when boron is doped into an insulating layer containing Si—O is disclosed in G. Pacchioni and M. Vezzoli, "Electronic structure of the paramagnetic boron oxygen hole center in B-doped $SiO_2$", Physical Review B, Vol. 64, pp. 155201-155207. Further stacked on this structure is a second block insulating layer (third insulating layer) 63 having a thickness of 0.5 nm to 30 nm, which is made from a silicon oxide film, an oxynitride film, an $Al_2O_3$ film, a ZrSiO film, an HfSiO film, a ZrSiON film, or an HfSiON film. In this case, $t_{ox3}$ denotes the thickness of the flat portion of the second block insulating layer (third insulating layer) 63, and $\in_{ox3}$ denotes the dielectric constant of the second block insulating film. In this case, the first block insulating layer 61 is a buffer layer that functions to prevent an interface trap being formed when an acceptor impurity reaches the interface between the first charge storage layer 5 and the first block insulating layer 61, and to improve the controllability of the number of interface traps in order to improve the reliability. In addition, the second block insulating layer 63 is a buffer layer that functions to prevent interface traps being formed when an acceptor impurity reaches the interface between a control electrode 7 and the second block insulating layer (third insulating layer) 63, and to improve the controllability of the number of interface traps in order to improve the reliability. Accordingly, such layers are formed so that the boron concentration in the first block insulating layer 61 and the second block insulating layer (third insulating layer) 63 is lower than that in the second charge storage layer (fourth insulating layer) 62, and the peak of the boron concentration is in the stacked layers instead of at the end of the stacked layers when the first block insulating layer 61, the second charge storing layer (fourth insulating layer) 62a, and the second block insulating layer (third insulating layer) 63 are combined. Desirable structures regarding film thickness and quality of such first block insulating layer 61, second charge storage layer (fourth insulating layer) 62a, and second block insulating layer (third insulating layer) 63 are the same as described in the first through third embodiments. Thus, a description is omitted.

In addition, the control electrode 7 is formed with a thickness of 10 nm to 500 nm, to which is doped boron, arsenic, or phosphorus in a concentration range of $1\times10^{19}\,cm^{-3}$ to $1\times10^{21}\,cm^{-3}$. In this case, making the boron concentration of the control electrode 7 less than $1\times10^{20}\,cm^{-3}$ desirably prevents anomalous diffusion of the boron into the silicon oxide film, and stabilizes threshold voltages for simultaneously formed PMOS electric field transistors. In addition, making the boron concentration of the control electrode 7 more than $1\times10^{19}\,cm^{-3}$ suppresses depletion of the control electrode 7 and reduction in the effective electric field over ONONO stacked layers. Therefore, such structure is desirable for preventing increases in erase time. In addition, when the silicon oxide film or the silicon oxynitride film is used as the first gate insulating layer 4, the height of the barrier for the holes is higher than the height of the barrier for the electrons, and the film must be made thinner for the tunneling phenomenon to occur, where at least a thin film less than 3.5 nm is needed in order to obtain sufficient hole-tunneling current for erasure. Accordingly, in order to inject the holes from the p-type silicon semiconductor region 1 into the first charge storage layer 5 by using the direct tunneling phenomenon, it is desirable that $t_{ox1}$ be limited to less than 3.5 nm. In addition, in this case, for example, a deposited silicon oxide film obtained from tetraethoxysilane (TEOS) through high temperature oxidation (HTO), is considered as a first candidate material for the first block insulating layer (second insulating layer) 61, however, a silicon oxide film or a silicon oxynitride film, which is obtained by oxidizing the first charge storage layer 5, may also be used.

Furthermore, a metal-lined layer 10 having a thickness of 10 nm to 500 nm, which is made from, for example, WSi or NiSi, MoSi, TiSi, CoSi, W, or Al, may be formed on the control electrode 7. The control electrode 7 is made from a polysilicon, where a plurality of control electrode 7 are connected together with low resistance by the metal-lined layer 10.

In addition, an insulating layer 9 having a thickness of 5 nm to 500 nm, made from a silicon nitride film or a silicon oxide film, is formed on the metal-lined layer 10. It should be noted that also in the fourth embodiment of the present invention, in order to reduce the threshold voltage range from increasing due to variation in the programming and the erasure electric fields, it is desirable that the gate insulating layer 4, the first charge storage layer 5, the first block insulating layer 61, the second charge storage layer 62a, and the second block insulating layer 63 are formed with a uniform film thickness extending from the boundary of the p-type silicon semiconductor region 1 and the source region 2 to the boundary of the p-type silicon semiconductor region 1 and the drain region 3.

Moreover, the n-type source region 2 and the n-type drain region 3 are formed respectively so as to sandwich a region being in contact with the p-type silicon semiconductor region 1 and the first gate insulating layer 4. EEPROM memory cells, which contain a quantity of charge stored in the first charge storage layer 5 as information, are configured with such source region 2, drain region 3, first charge storage layer 5, and control electrode 7, where the spacing between the source region 2 and the drain region 3 is 0.01 µm to 0.5 µm. The semiconductor memory according to the fourth embodiment has the following features in addition to Features 1, 2, and 5 of the first embodiment and Feature 11 of the third embodiment.

[Feature 13]

The control electrode 7 is formed in the same direction as the source region 2, the semiconductor region 1, and the drain region 3. Accordingly, as with an exemplary embodiment to be described later, this structure is suitable for implementing an AND structure or a virtual ground array structure, for example, where the source region 2 and the drain region 3 of neighboring memory cells are connected in parallel. In addition, since the device isolating and insulating layer 12, the source region 2, the drain region 3, and the first charge storage layer 5 may be formed in a self-aligned manner, there is no need to provide margins for misalignment between such layers, and a higher-concentration memory cell may be implemented.

[Feature 14]

Since the first block insulating layer (second insulating layer) 61 and the second charge storage layer (fourth insulating layer) 62a are formed after the device isolating and insulating layer 12 is formed, the first block insulating layer (second insulating layer) 61 and the second charge storage layer 62a are not subjected to oxidization processing for forming the device isolating and insulating layer 12. Accordingly, a more uniform film may be formed without a problem of making a thicker film due to the oxidation of the first block insulating layer (second insulating layer) 61 and the second charge storage layer 62a upon formation of the device isolating and insulating layer 12. In addition, since the first block insulating layer 61 and the second charge storage layer 62a are not subjected to oxidization processing for forming the device isolating and insulating layer 12, a film having little film deterioration due to thermal processing may be formed, and a film, which does not undergo the oxidation processing for the device isolating and insulating layer 12, such as an $Al_2O_3$ film, a ZrSiO film, an HfSiO film, a ZrSiON film, or an HfSiON film may be used. Furthermore, the mask for forming the device isolating and insulating layer 12 by oxidation is thin since only the first charge storage layer 5 is used, therefore, frequency of defects that occur due to heat stress of the first charge storage layer 5 may decrease, and a more reliable semiconductor memory may be implemented.

First Modified Example of the Fourth Embodiment

Figure 16:
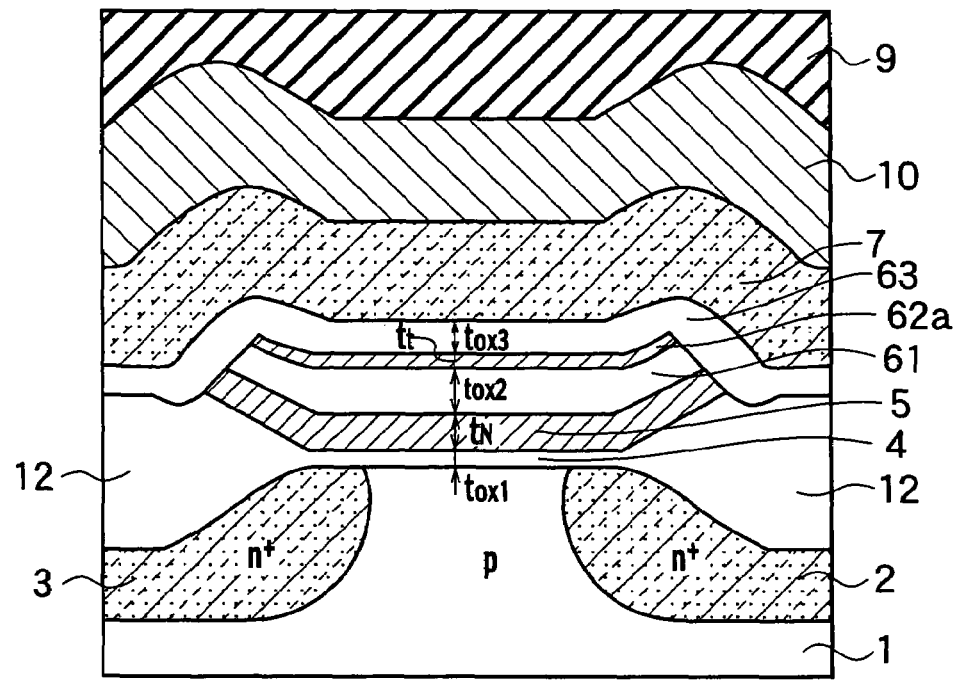
FIG. 16 shows a schematic cross-sectional structure of a semiconductor memory according to a first modified example of the fourth embodiment of the present invention.

FIG. 16 shows a semiconductor memory according to the first modified example of the fourth embodiment of the present invention. The first modified example is essentially similar to the fourth embodiment, however, it differs in that the device isolating and insulating layer 12 is formed after the second charge storage layer 62a is formed, where the first block insulating layer 61 and the second charge storage layer 62a are divided. Here, the device isolating and insulating layer 12 should be formed by etching the second charge storage layer 62a, the first block insulating layer 61, and the first charge storage layer 5 by lithography and etching processes once the second charge storage layer 62 is formed on the entire surface. In addition, the same conditions as described with the semiconductor memory according to the second embodiment may be used, thus description of the film thickness conditions is omitted. In the first modified example, the following features are achieved in addition to Features 1, 2, 5, 11, and 13 of the first through fourth embodiments.

[Feature 15]

The second charge storage layer 62a is segmented on the device isolating and insulating layer 12 as with the first charge storage layer 5, and is surrounded by the first block insulating layer 61 and the second block insulating layer 63, which have higher barriers for the electrons, relative to the above-mentioned fourth embodiment. Accordingly, the charges contained in the second charge storage layer 62a do not move horizontally in FIG. 16, where by reliability under high temperatures may be further improved.

Second Modified Example of the Fourth Embodiment

Figure 17:
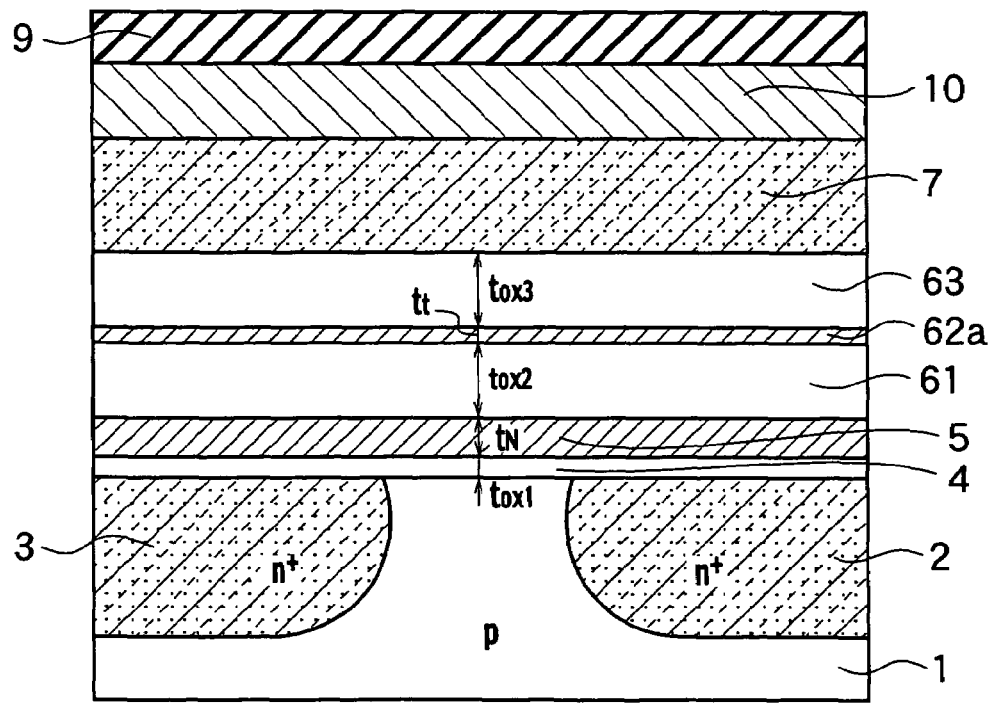
FIG. 17 shows a schematic cross-sectional structure of a semiconductor memory according to a second modified example of the fourth embodiment of the present invention.

FIG. 17 shows a semiconductor memory according to the second modified example of the fourth embodiment of the present invention. The second modified example is essentially similar to the fourth embodiment, however, it differs from the fourth embodiment in that the device isolating and insulating layer 12 is not provided. In the second modified example, for example, the source region 2 and the drain region 3 are formed by ion implantation techniques; stacked layers configured with the first gate insulating layer 4, the first charge storage layer 5, the first block insulating layer 61, the second charge storage layer 62a, and the second block insulating layer 63 are formed on the p-type silicon semiconductor region 1. The control electrode 7 and the metal-lined layer 10 are deposited on the entire surface; and the first gate insulating layer 4, first charge storage layer 5, first block insulating layer 61, second charge storage layer 62a, second block insulating layer 63, control electrode 7, and metal-lined layer 10 are formed by patterning. The same conditions as described in the second embodiment may be used, thus description of the film thickness conditions is omitted. In the second modified example, the following features are achieved in addition to Features 1, 2, 11, and 13 of the first through fourth embodiments.

[Feature 16]

The control electrode 7 is formed in the same direction as the source region 2, the semiconductor region 1, and the drain region 3. Accordingly, as with an exemplary embodiment to be described later, it is suitable for implementing an AND memory cell or a virtual ground-type memory cell, for example, where the source region 2 and the drain region 3 of the neighboring memory cells are connected in parallel. In addition, since the device isolating and insulating layer 12 is not formed in the direction of the p-type silicon semiconductor region 1 and the drain region 3, a memory cell having a more uniform film thickness can be implemented without the thickness of the stacked layers configured with the first gate insulating layer 4, the first charge storage layer 5, and the first block insulating layer 6 changing at the ends of the device isolating and insulating layer 12. Accordingly, variation in the programming and the erasure threshold voltage may also be further decreased.

It is apparent that the semiconductor memory according to the second modified example of the fourth embodiment of the present invention is capable of performing an erase operation with the same applied voltage as the semiconductor memory according to the first through third embodiments.

Fifth Embodiment

FIG. 18 through FIG. 21 show a circuit structure, a planar pattern, and a device cross-sectional structure, respectively, of a semiconductor memory according to the fifth embodiment of the present invention. The fifth embodiment illustrates a NAND cell array in which the memory cells described in the first through fourth embodiments are connected in series. Description for the common portions with the first through fourth embodiments using the same reference numerals is omitted.

Figure 18:
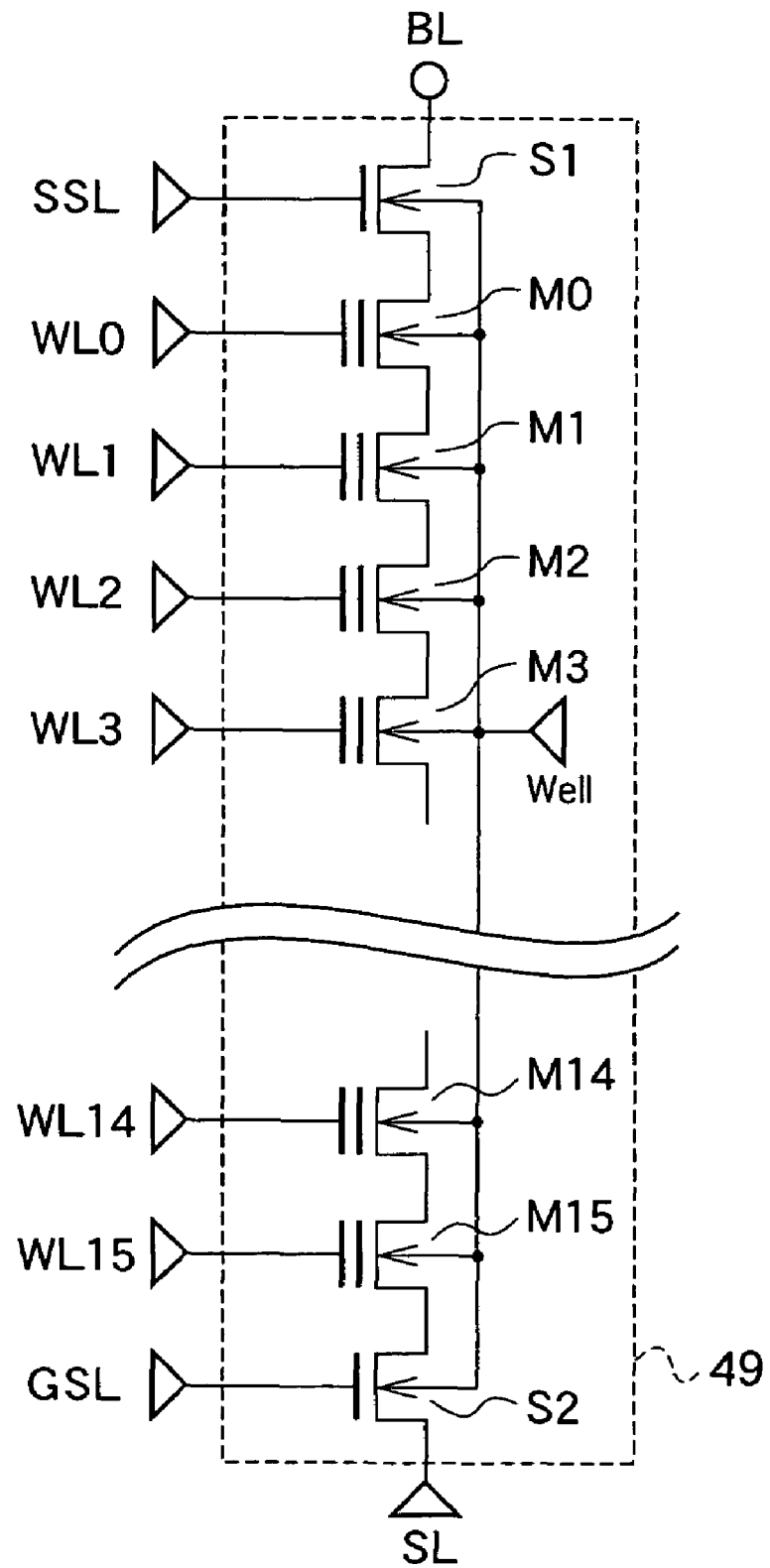
FIG. 18 shows a schematic circuit structure of a semiconductor memory according to a fifth embodiment of the present invention.
Figure 19:
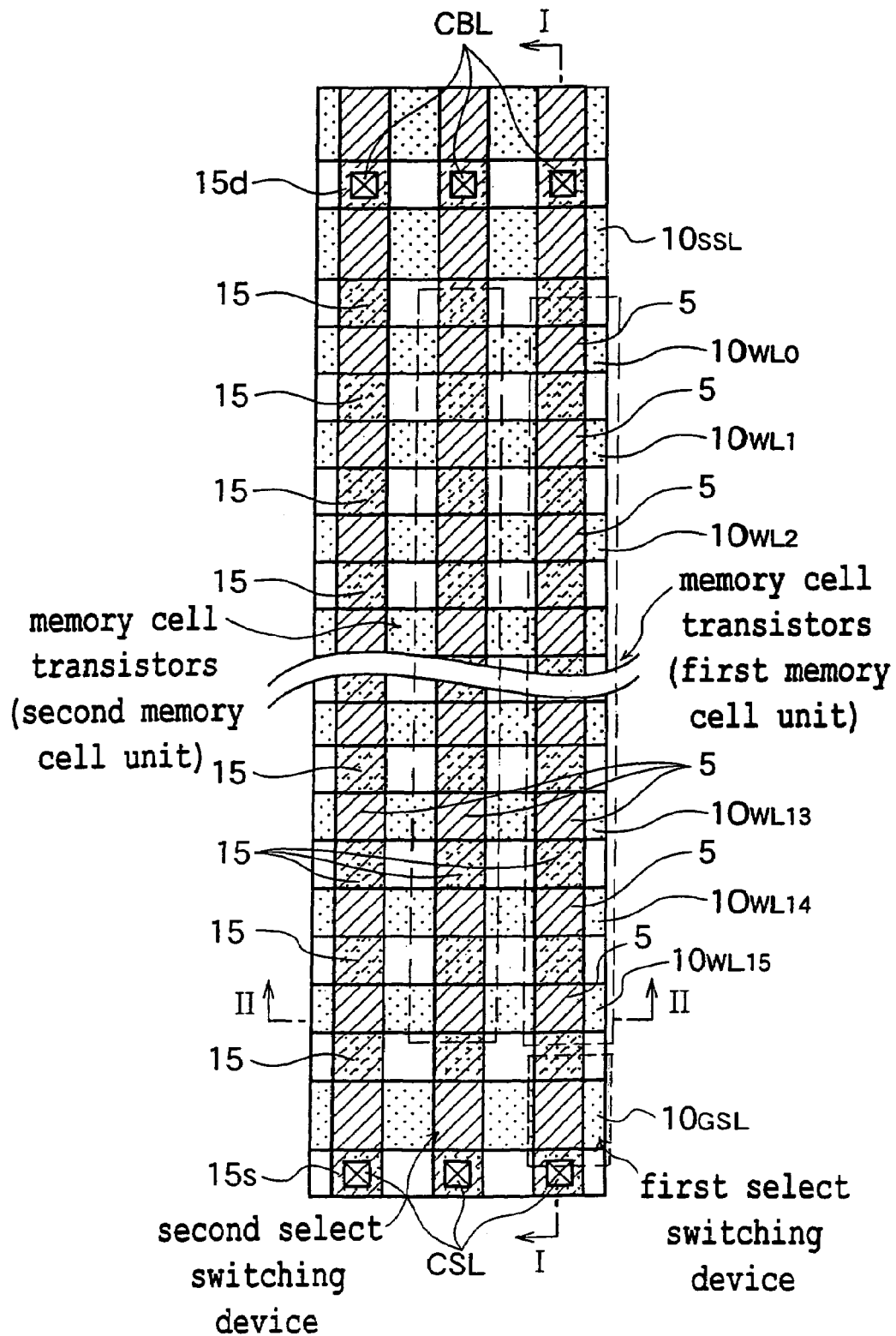
FIG. 19 shows a schematic planar pattern structure of the semiconductor memory according to the fifth embodiment of the present invention.
Figure 20:
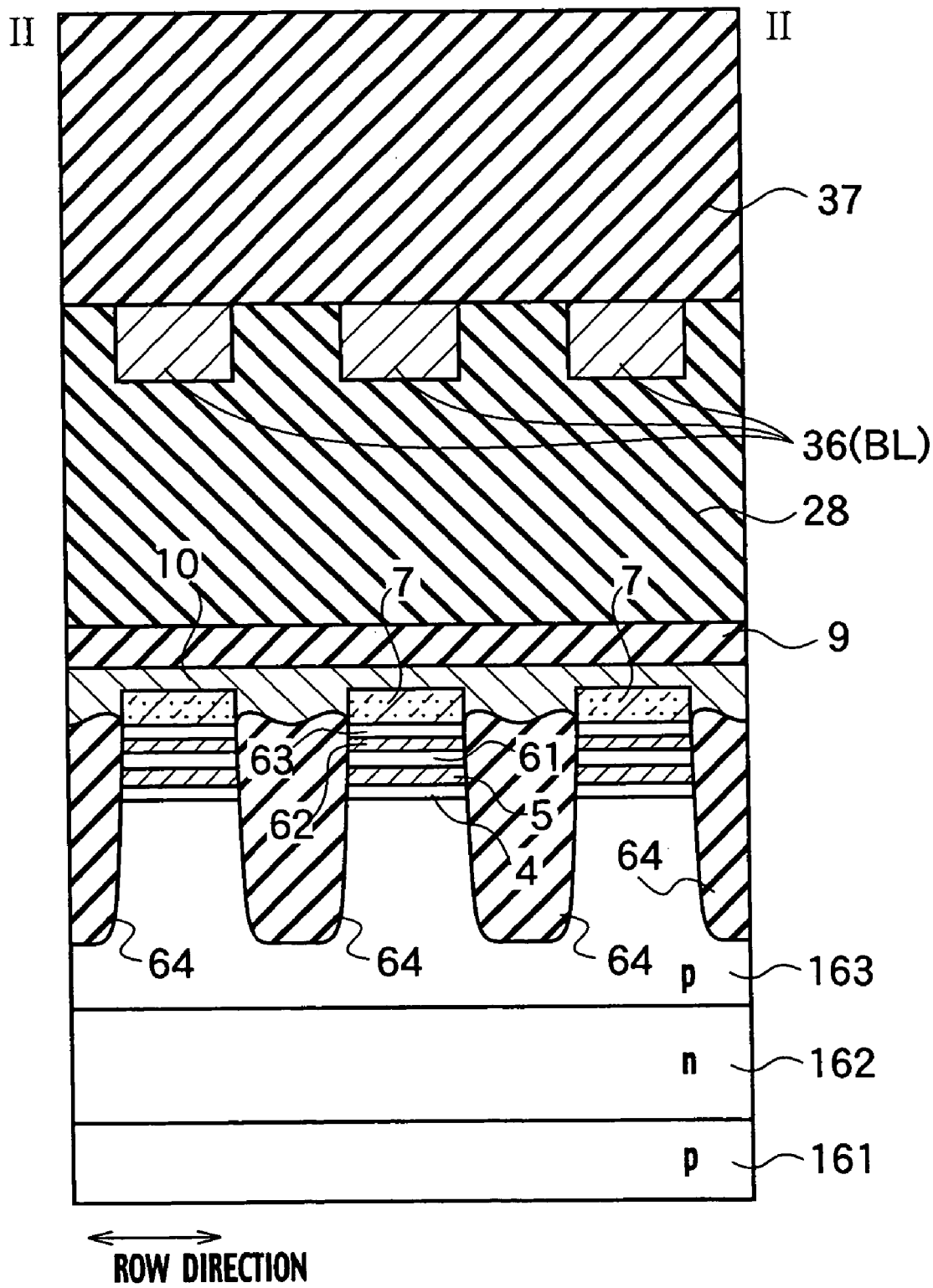
FIG. 20 shows a schematic cross-sectional structure cut along the line II-II of the semiconductor memory according to the fifth embodiment of the present invention.
Figure 21:
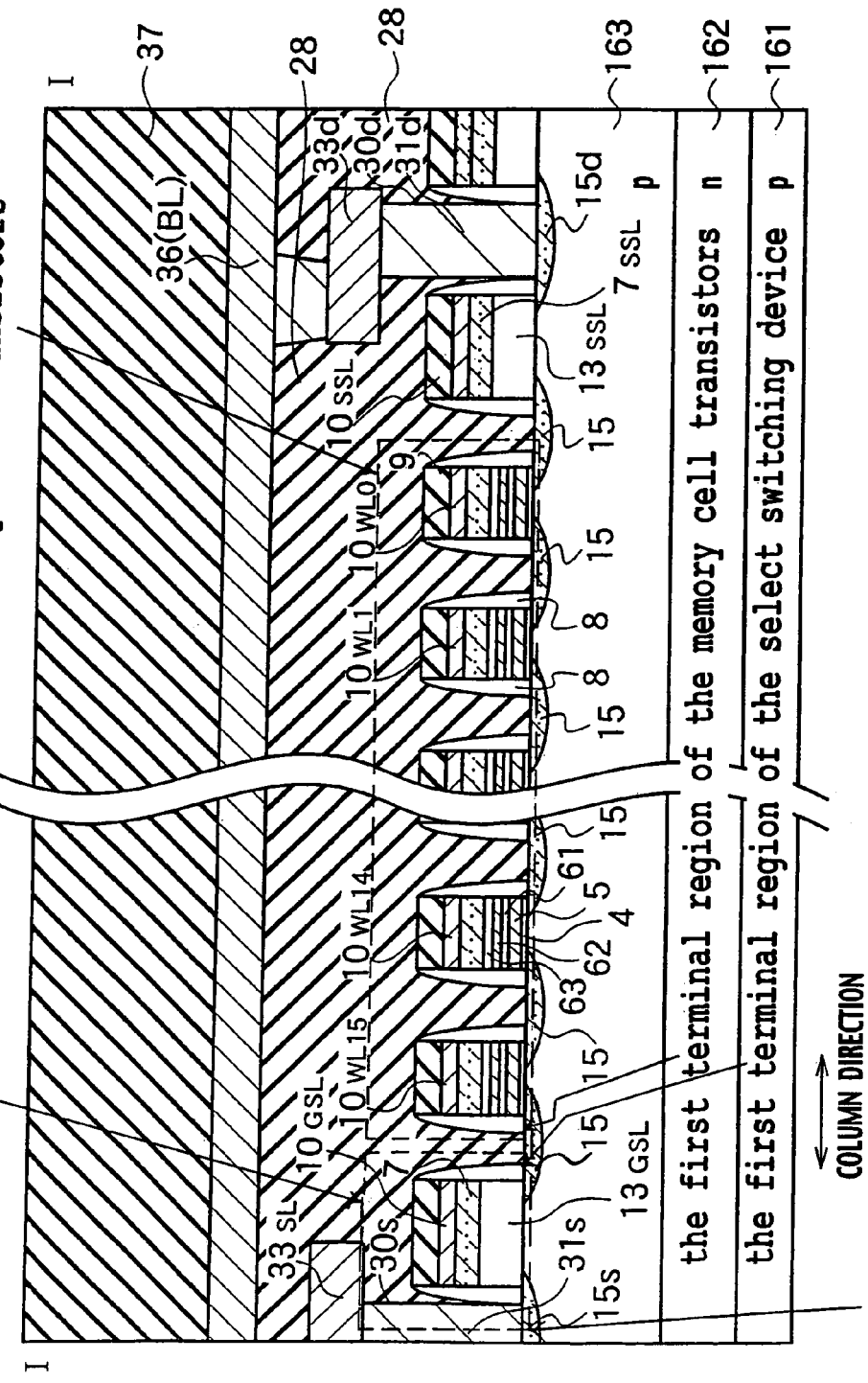
FIG. 21 shows a schematic cross-sectional structure cut along the line I-I of the semiconductor memory according to the fifth embodiment of the present invention.

FIG. 18 is a circuit diagram corresponding to a single memory block (indicated by reference numeral 49), and FIG. 19 shows a structure where three cell blocks of FIG. 18 are connected in parallel. FIG. 20 and FIG. 21 are cross-sectional diagrams cut along the respective lines II-II and I-I of the NAND cell array block corresponding to FIG. 18 and FIG. 19, respectively. In particular, to make the cell structure more easy to comprehend, FIG. 19 only shows the structure of the memory cell portions that are at a level lower than the gate control lines $10_{WL0}$ through $10_{WL15}$.

In FIG. 18, for example, the first charge storage layers 5, which store charges representing information, are formed on the substrate via the first gate insulating layers 4, and the second charge storage layers 62, which store negative charges. The layers are stacked to form field-effect transistors. The nonvolatile memory cells M0 to M15 configured with these field-effect transistors are connected in series, where one end of the memory cells is connected to a data transfer line BL via a select transistor S1. Furthermore, the other end is connected to a common source line SL via a select transistor S2. In addition, each of the transistors is formed on the same well. For example, the first gate insulating layers 4, which are made from silicon oxide films or oxynitride films having a thickness of 0.5 nm to 10 nm, are formed upon a p-well region 163 where the boron impurity concentration is between $10^{14}$ cm$^{-3}$ and $10^{19}$ cm$^{-3}$. In addition, the first charge storage layers 5 having a thickness of 3 nm to 20 nm, which are made from silicon nitride films, for example, are formed on the top side of the first gate insulating layers 4. Stacked on the foregoing layers are the first block insulating layers (second insulating layers) 61 having a thickness of 3 nm to 30 nm, which are made from silicon oxide films, oxynitride films, $Al_2O_3$ films, ZrSiO films, HfSiO films, ZrSiON films, or HfSiON films. In addition, the second charge storage layers 62 which are, for example, made from silicon nitride films or silicon oxynitride films, are formed with a thickness of 0.5 nm to 10 nm. The memory cell structure described in the first and/or third embodiments may be used as this type of memory cell. It should be noted that the second charge layer (fourth insulating layer) 62a, which has a negative charge and is described in the third embodiment, may be substituted for the second charge storage layer 62 of the fifth embodiment of the present invention.

Further stacked on the above layers is the second block insulating layers (third insulating layers) 63 having a thickness of 3 nm to 30 nm, which are made from silicon oxide films, oxynitride films, $Al_2O_3$ films, ZrSiO films, HfSiO films, ZrSiON films, or HfSiON films, for example. In addition, the control electrodes 7 are formed having a thickness of 10 nm to 500 nm to which is doped boron, arsenic, or phosphorus in a concentration range of $1 \times 10^{19}$ cm$^{-3}$ to $1 \times 10^{21}$ cm$^{-3}$. The metal-lined layers 10 are formed on these layers with a thickness of 10 nm to 500 nm, and are made from a stack structure of WSi and polysilicon, or a stack structure of W, NiSi, MoSi, TiSi, CoSi, and polysilicon.

These metal-lined layers 10 are formed to extend to the block boundaries horizontally in FIG. 19 so as to connect the neighboring memory cell blocks and form the data select lines WL0 to WL15 and the select gate control lines SSL and GSL. It should be noted that in order to reduce the load of the booster circuit during erasure and control the power consumption, it is desirable that voltage can be applied to the p-well region 163 independent of the p-type semiconductor substrate 161. Furthermore, as shown in FIG. 20, the p-well region 163 is formed in a self-aligned manner on regions where there are no device isolating and insulating layers 64. This structure can be formed, for example by depositing layers 4, 5, 61, 62, and 63 onto the entire surface of the p-well region 163, and then patterning and etching the p-well region 163 to a depth of, for example, 0.05 μm to 0.5 μm so that the device isolating and insulating layer 64 is implanted to reach the p-well region 163.

On both sides of the control electrodes 7, as shown in FIG. 21, the n-type diffusion layers 15 that become the source regions or the drain regions are formed to sandwich the insulating layers 8, which for example, are made from silicon nitride films or silicon oxide films having a thickness of 5 nm to 200 nm. These n-type diffusion layers 15, first charge storage layers 5, and control electrodes 7 form nonvolatile EEPROM cells, where the gate length of the first charge storage layers is assumed to lie in the range of between 0.5 μm and 0.01 μm. These n-type diffusion layers 15 that become the source regions or the drain regions are made from, for example, phosphorus, arsenic, or antimony at a depth of between 10 nm and 500 nm so that the surface concentration is in a range of $10^{17}$ cm$^{-3}$ to $10^{21}$ cm$^{-3}$. In addition, these n-type diffusion layers 15 are connected in series between adjacent memory cells so that a NAND connection is provided. Furthermore, in FIG. 21, $10_{SSL}$ and $10_{GSL}$ are block select lines corresponding to the select gate lines SSL and GSL, respectively, and are formed on the same layer as the EEPROM gate control lines 10. These gate control lines 10 are placed opposite the p-well region 163 via gate insulating layers $13_{SSL}$ and $13_{GSL}$, having a 3 nm to 15 nm thickness and are made from either a silicon oxide film or an oxynitride film, thereby forming MOS transistors. In this case, making the gate lengths of a control electrode $7_{SSL}$ and a control electrode $7_{GSL}$ to be longer than the gate lengths of the control electrodes 7 in the memory cells, that is for example, forming electrodes $7_{SSL}$ and $7_{GSL}$ to lie within the range of 1 μm and 0.02 μm, allows maintaining a large on-off ratio upon block selection or non-selection, thus preventing erroneous programming or erroneous read-out. In this case, it is desirable for the control electrodes $7_{SSL}$ and $7_{GSL}$ to be made from the same conductivity type polysilicon gate electrode as that of the control electrodes 7 of the memory cells, since it is possible to prevent depletion from occurring due to the interdiffusion of impurities between the memory cell gates and the gates of the block select gate control lines SSL and GSL, as well as reduce the number of process steps.

Furthermore, an n-type diffusion layer 15d, which is formed on one side of the control electrode $7_{SSL}$ and becomes a source region or a drain region, is connected to a data transfer line 36 (BL), which is made from, for example, W, WSi, titanium (Ti), titanium nitride (TiN), copper, or Al, via a bit line connecting electrode $33_d$ and a contact $31_d$. The contact $31_d$ is formed within a contact hole $30_d$. In this case, the data transfer line 36 (BL) is formed to reach the block boundaries horizontally in FIG. 19 so as to connect the neighboring memory cell blocks. On the other hand, an n-type diffusion layer $15_s$, which is formed on one side of the control electrode $7_{GSL}$ and becomes a source region or a drain region, is connected to a source line SL via a source line connecting electrode $33_{SL}$ and a contact $31_a$. The contact 31 is formed within a contact hole $30_s$. This common source line SL is formed to reach the block boundaries horizontally in FIG. 19 so as to connect the neighboring memory cell blocks. Naturally, the n-type diffusion layer $15_s$ may be used as the common source line SL by forming the n-type diffusion layer to reach the block boundaries horizontally. The BL contact CBL and SL contact CSL are filled with, for example, n-type doped or p-type doped polysilicon, tungsten, tungsten silicide, Al, TiN, Ti, or the like to form conductor regions. In addition, the MOS transistors and the common source line SL and bit line BL are filled therebetween by interlayer films 28 made from, for example, SiO$_2$ or SiN. Moreover, an insulating protection layer 37 made from, for example, SiO$_2$, SiN, or polyimide, or the upper interconnection made from W, Al, or Cu, which is not shown in the drawing, is formed on top of this bit line BL.

With the semiconductor memory according to the fifth embodiment of the present invention, in addition to the features of the first through fourth embodiments, the p-well region 163 is used in common, and since a plurality of cells can be erased simultaneously by tunneling electrons from the p-well region 163, high-speed erasure of many bits at one time is possible while controlling the power consumption during erasure.

Sixth Embodiment

FIG. 22 through FIG. 26 show a semiconductor memory according to the sixth embodiment of the present invention. The sixth embodiment of the present invention replaces the NAND cell array block 49 of the fifth embodiment with a virtual ground-array type cell array block. Description for the common portions with the first through fifth embodiments using the same reference numerals is omitted.

Figure 22:
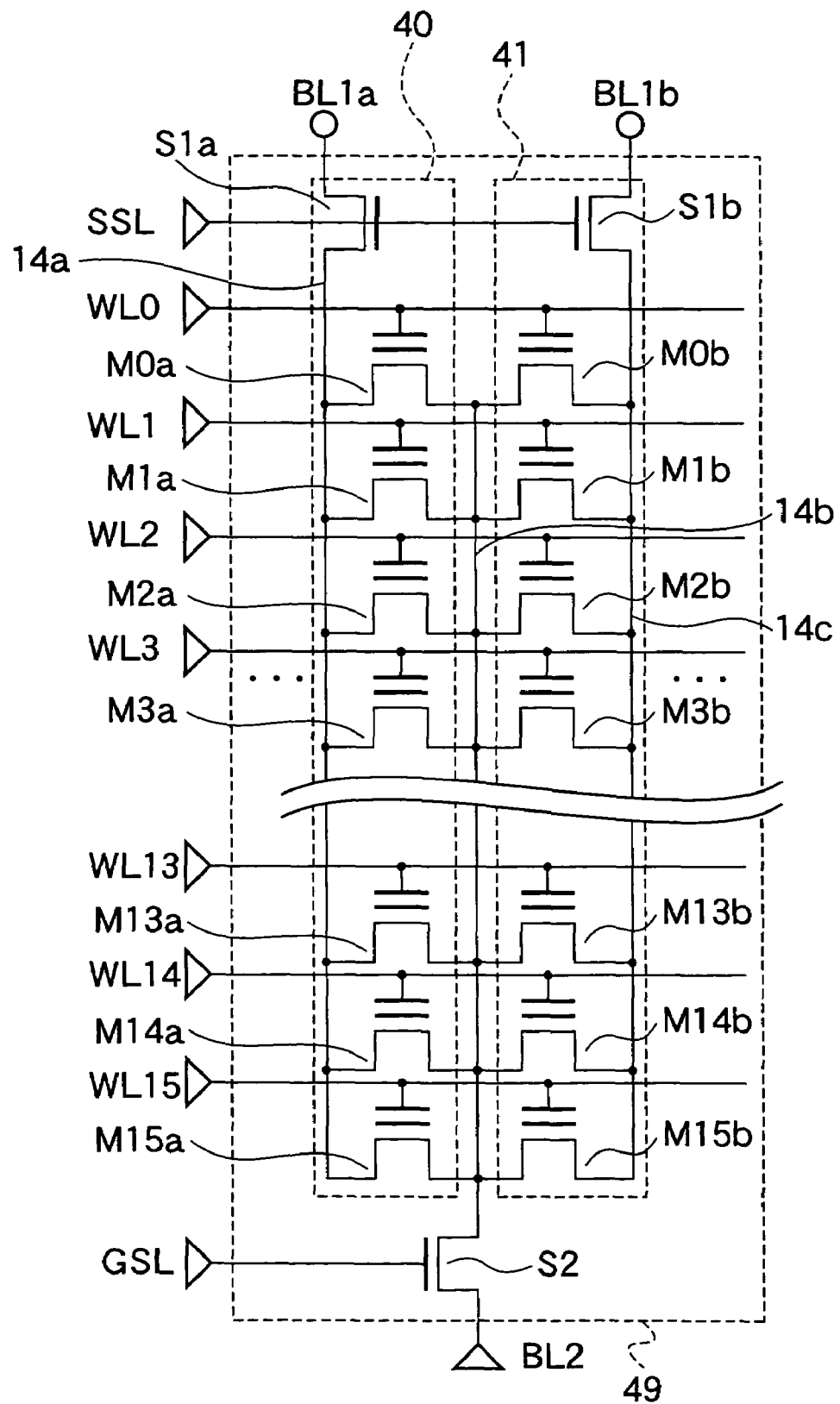
FIG. 22 shows a schematic circuit structure of a semiconductor memory according to a sixth embodiment of the present invention.
Figure 25:
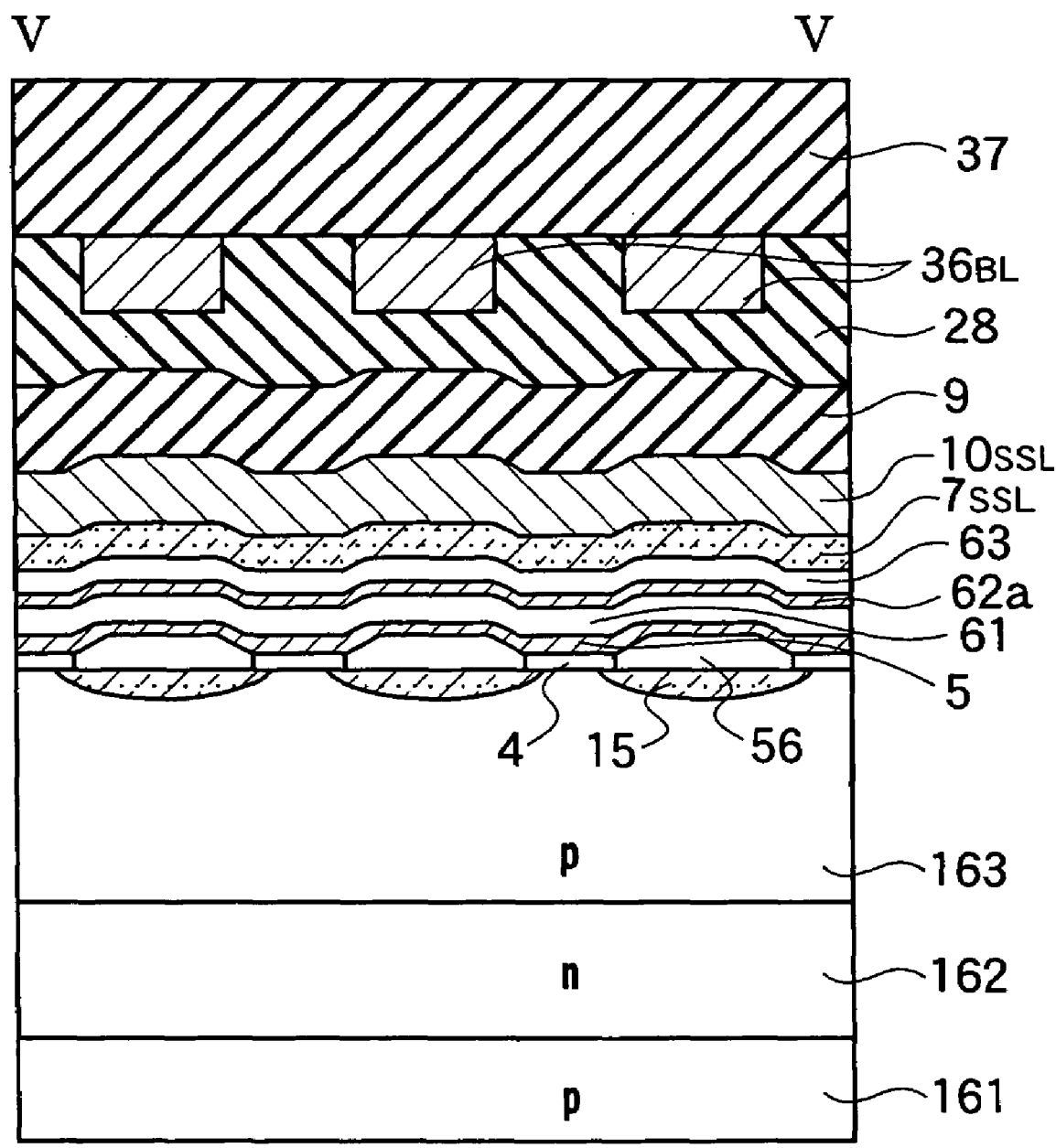
FIG. 25 shows a schematic cross-sectional structure cut along the line V-V of the semiconductor memory according to the sixth embodiment of the present invention.
Figure 26:
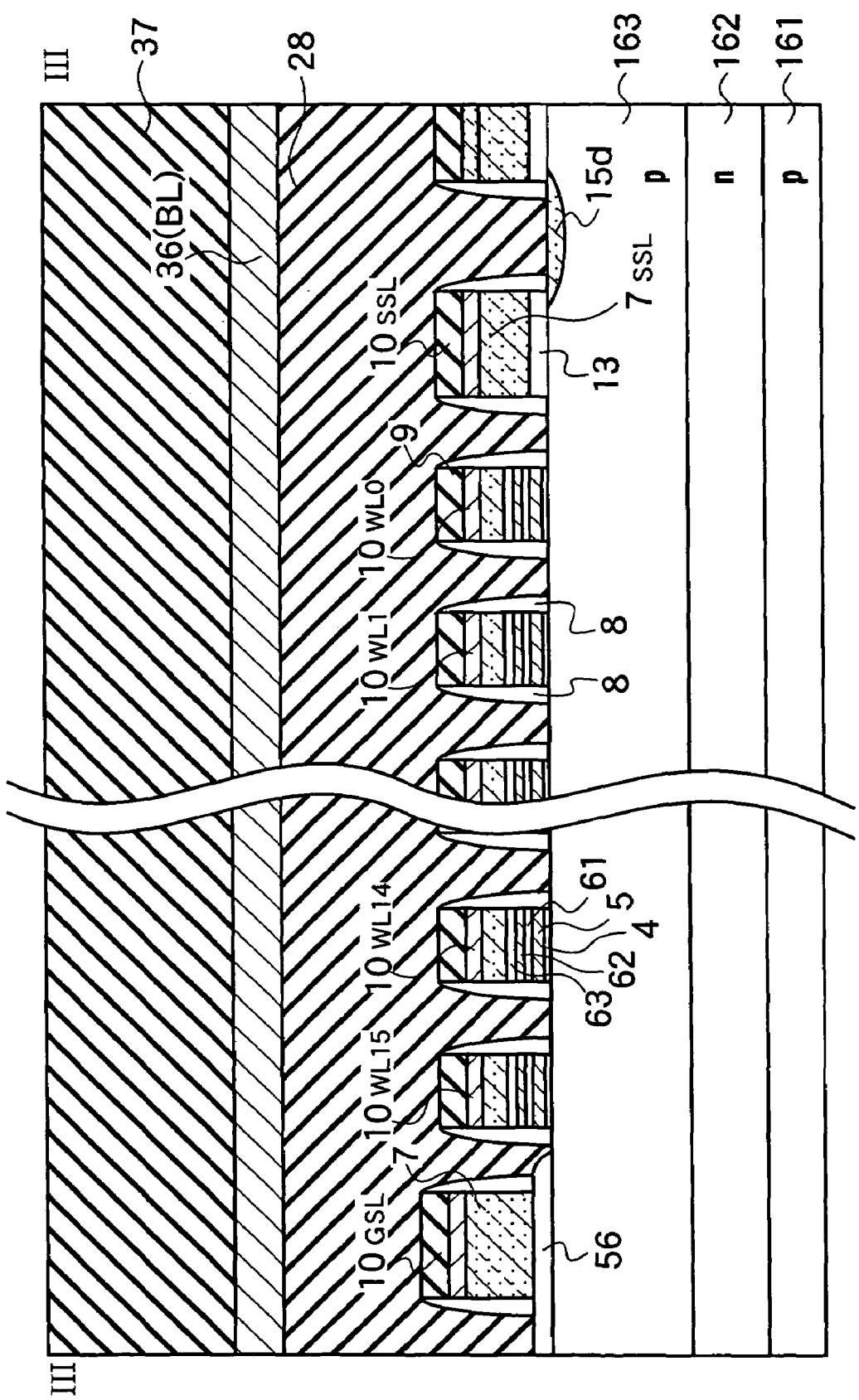
FIG. 26 shows a schematic cross-sectional structure cut along the line III-III of the semiconductor memory according to the sixth embodiment of the present invention.

Regarding a virtual ground-type memory cell array block, FIG. 22, FIG. 23, FIG. 24, FIG. 25, and FIG. 26 show a schematic circuit diagram, a schematic planar pattern, a schematic cross-sectional diagram cut along the line IV-IV, a schematic cross-sectional diagram cut along the line V-V, and a schematic cross-sectional diagram cut along the line III-III, respectively. In FIG. 22, the memory cell block 49 has a first memory cell unit 40 connected between local data lines 14a and 14b, and a second memory cell unit 41 connected between local data lines 14b and 14c. Nonvolatile memory cells M0a to M15a configured with memory cell (field-effect) transistors that include charge storage layer electrodes are connected in parallel, where one end of each of the memory cells is connected to a data transfer line BL1a via a select transistor S1a. Furthermore, the other end of each of the memory cells is connected to a neighboring data transfer line BL2 via a block select transistor S2. In addition, each of the transistors is formed on the same p-well region 163. If n denotes a block index (natural number), the control electrodes of the respective nonvolatile memory cells M0a to M15a are connected to the data select lines WL0 to WL15, respectively. Furthermore, since a single memory cell block is selected from among a plurality of memory cell blocks that are aligned along the data transfer lines BL and connected to the data transfer lines BL, the control electrode of a block select transistor S1b is connected to the block select line SSL. In addition, the control electrode of the block select transistor S2 is connected to the block select line GSL. Moreover, respective nonvolatile memory cells M0b to M015b are formed adjacent to the nonvolatile memory cells M0a to M015a along the length of data select lines WLx, mutually sharing the local data transfer line 14b. Accordingly, a so-called virtual ground memory cell block 49 (dotted line region) is formed. In this case, with the sixth embodiment, the block select gate control lines SSL and GSL are formed via wirings on the same layer as the data select lines WL0 to WL15 of the memory cell element. In addition, the single memory cell block 49 only requires having at least one block select line, and forming the block select line in the same direction as the data select lines is desirable for achieving a high packing-density. The sixth embodiment shows an example where $16=2^4$ memory cells are connected to the memory cell block 49. However, there should be a plurality of memory cells connected to the data transfer line BL and the data select line WL, where it is desirable for address decoding that the number of memory cells is $2^n$ (n is a positive integer). To make the cell structure more easy to comprehend, FIG. 23 only shows the structure of the portions of memory cells lower than the gate control lines 10. In FIGS. 25 and 26, for example, the first gate insulating layers 4, which are made from silicon oxide films or oxynitride films having a thickness of 0.5 nm to 10 nm, are formed on a p-well region 163 where the boron impurity concentration is between $10^{14}$ cm$^{-3}$ and $10^{19}$ cm$^{-3}$. In addition, the first charge storage layers 5 having a thickness of 3 nm to 20 nm, which are made from silicon nitride films, for example, are formed on the top side of the first gate insulating layers 4. Stacked on these layers are the first block insulating layers (second insulating layers) 61 having a thickness of 3 nm to 30 nm, which are made from silicon oxide films, oxynitride films, Al$_2$O$_3$ films, ZrSiO films, HfSiO films, ZrSiON films, or HfSiON films. In addition, the second charge storage layers 62 which are, for example, made from silicon nitride films or silicon oxynitride films, are formed with a thickness of 0.5 nm to 10 nm. The memory cell structure described in the first through fourth embodiments may be used as this type of memory cell. It should be noted that the second charge layer (fourth insulating layer) 62a, which is doped with an accepter impurity and is described in the third and fourth embodiments, may be substituted for the second charge storage layer 62 of the sixth embodiment of the present invention.

Further stacked on the above layers are the second block insulating layers (third insulating layers) 63 having a thickness of 3 nm to 30 nm, which are made from silicon oxide films, oxynitride films, $Al_2O_3$ films, ZrSiO films, HfSiO films, ZrSiON films, or HfSiON films, for example. In addition, the control electrodes 7 are formed having a thickness of 10 nm to 500 nm to which is doped boron, arsenic, or phosphorus in a concentration range of $1 \times 10^{19}$ $cm^{-3}$ to $1 \times 10^{21}$ $cm^{-3}$. Formed on these layers are the gate control lines 10 having a thickness of 10 nm to 500 nm, which are made from a stack structure of WSi (tungsten silicide) and polysilicon, or a stack structure of W, NiSi, MoSi, TiSi, CoSi, and polysilicon. Furthermore, an interlayer insulating layer 56 and the n-type diffusion layer 15 of a cell unit may be formed in a self-aligned manner by advance deposition of a mask material made from a polysilicon on the portion of the structure where the first gate insulating layer 4 is to be formed, forming the n-type diffusion layer 15 by ion implantation, depositing the interlayer insulating layer 56 on the entire surface, and then selectively removing the mask material at the portion corresponding to the first gate insulating layer 4 by lithography, chemical mechanical polishing (CMP), or etch back. The memory cell structure described in the first through fourth embodiments may be used as memory cells of this embodiment.

The gate control lines 10 having a thickness of 10 nm to 500 nm are formed on the above layers, which are made from polysilicon, a stack structure of WSi (tungsten silicide) and polysilicon, or a stack structure of W, NiSi, MoSi, TiSi, CoSi, and polysilicon. The gate control lines 10 are formed to extend horizontally to the block boundaries in FIG. 23 so as to connect the neighboring memory cell blocks and form the data select lines WL0 to WL15 and the block select gate control lines SSL and GSL. It should be noted that in order to reduce the load of the booster circuit during erasure and control the power consumption, it is desirable that a double-well structure is employed in which voltage can be applied to the p-well region 163 independent of the p-type semiconductor substrate 161. However, for example, in the case of using the hot-hole erasure method, which is described in the first embodiment, without changing the ground potential of the p-well region 163, a double-well structure is unnecessary and the p-type silicon semiconductor region 1 may be used.

In the cross section V-V that corresponds to a memory cell as shown in FIG. 25, the n-type diffusion layers 15, which become the source regions or the drain regions, are formed beneath the polysilicon regions sandwiching the interlayer insulating layers 56. The interlayer insulating layers 56 are made from silicon oxide films or oxynitride films having a thickness of 5 nm to 200 nm, for example. The n-type diffusion layers 15, first charge storage layers 5, and control electrodes 7 form EEPROM cells, which use the quantity of charge stored in the first charge storage layers 5 as information, where the gate length is assumed to lie in the range between 0.5 μm and 0.01 m. As shown in FIG. 25, forming the interlayer insulating layers 56 so as to cover the n-type diffusion layers 15 is desirable for preventing abnormal programming due to concentration of electric fields at the ends of the source regions or the drain regions.

The n-type diffusion layers 15 are made from, for example, phosphorus, arsenic, or antimony at a depth between 10 nm and 500 nm so that the surface concentration is $10^{11}$ $cm^{-3}$ to $10^{21}$ $cm^{-3}$. In addition, the n-type diffusion layers 15 are shared between memory cells that are adjacent to each other along the direction of the data transfer lines, implementing a parallel connection thereof.

Figure 23:
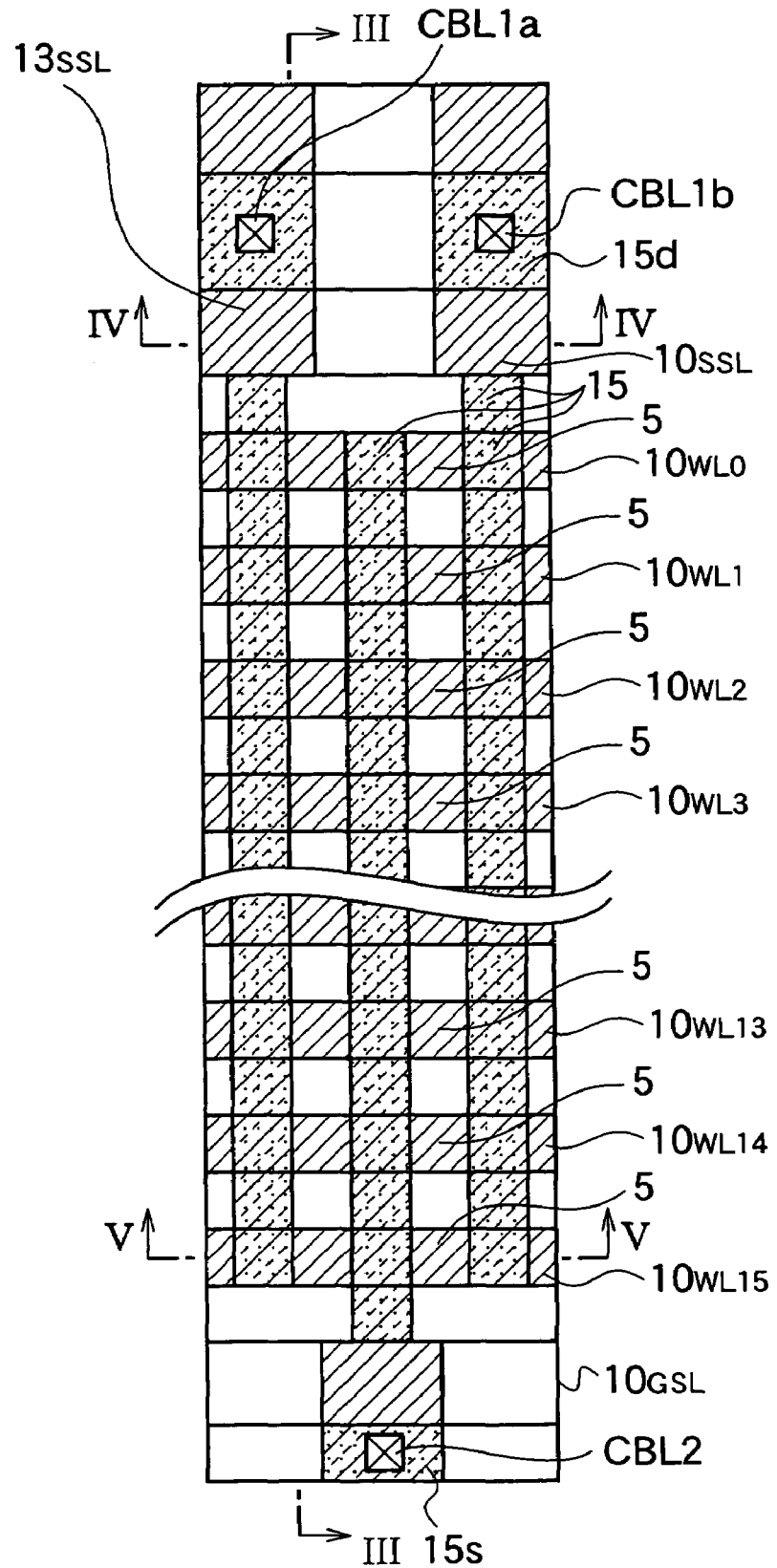
FIG. 23 shows a schematic planar pattern structure of the semiconductor memory according to the sixth embodiment of the present invention.
Figure 24:
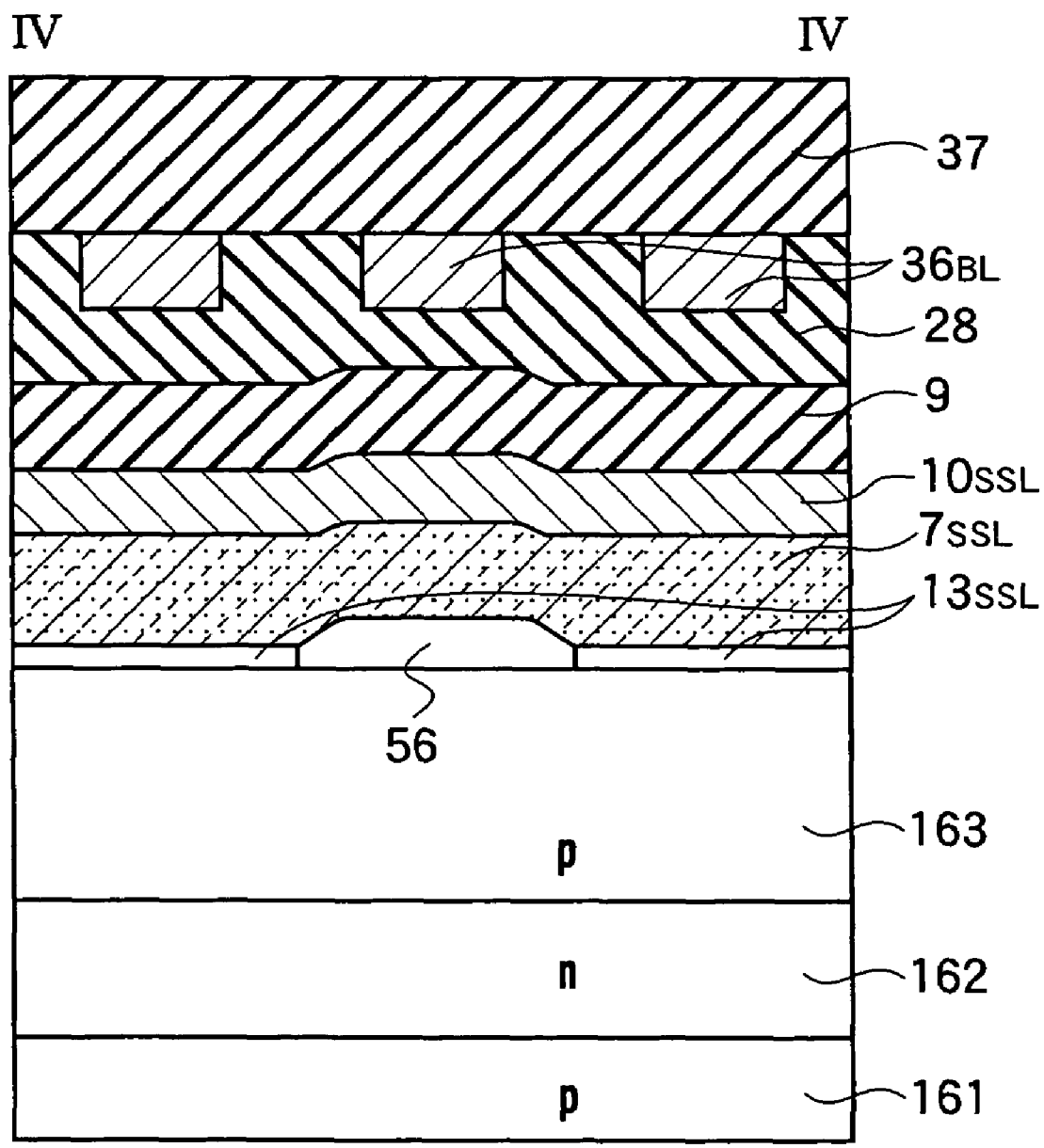
FIG. 24 shows a schematic cross-sectional structure cut along the line IV-IV of the semiconductor memory according to the sixth embodiment of the present invention.

Moreover, the block select lines $10_{SSL}$ and $10_{GSL}$ are connected to the select gate control lines SSL and GSL, respectively, and are formed on the same layer as the control lines WL0 to WL15 of the EEPROM. In this case, as shown in FIG. 22 and FIG. 23, the block select transistor S1 is formed as a MOSFET with the n-type diffusion layers 15 and 15d as the source and the drain region, and the block select line $10_{SSL}$ as the gate electrode. The block select transistor S2 is formed as a MOSFET with the n-type diffusion layers 15 and 15s as the source and the drain region, and the block select line $10_{GSL}$ as the gate electrode. In this case, making the gate lengths of the block select lines $10_{SSL}$ and $10_{GSL}$ to be longer than the gate lengths of the gate electrodes in the memory cells, that is forming the gate lengths lie within the range of 1 μm and 0.02 μm, allows maintaining a large on-off ratio upon block selection or non-selection, thus preventing erroneous programming or erroneous read-out. In this case, it is desirable for the control electrodes $7_{SSL}$ and $7_{GSL}$ of the block select lines $10_{SSL}$ and $10_{GSL}$ to be made from the same conductivity type electrode as that of the control electrodes 7 of the memory cells since it is possible to prevent depletion from occurring due to the inter-diffusion of impurities between the memory cell gates and the gates of the block select gate control lines SSL and GSL, as well as reduce the number of processes.

Using virtual ground array-type memory cells in the sixth embodiment of the present invention permits the serial resistors of a memory cell block to be small and constant, and is suitable for stabilizing the threshold values for multivalue data. Furthermore, storage and read-out of one-bit data can be respectively performed near two n-type diffusion layers within a single transistor according to the current flow direction, thus is desirable for achieving high concentration. Moreover, in the sixth embodiment, in addition to the features of the first through fourth embodiments, parallel connection of the memory cells assures large cell current, which allows high speed data read-out.

Seventh Embodiment (AND MONONOS Flash Memory)

Figure 27:
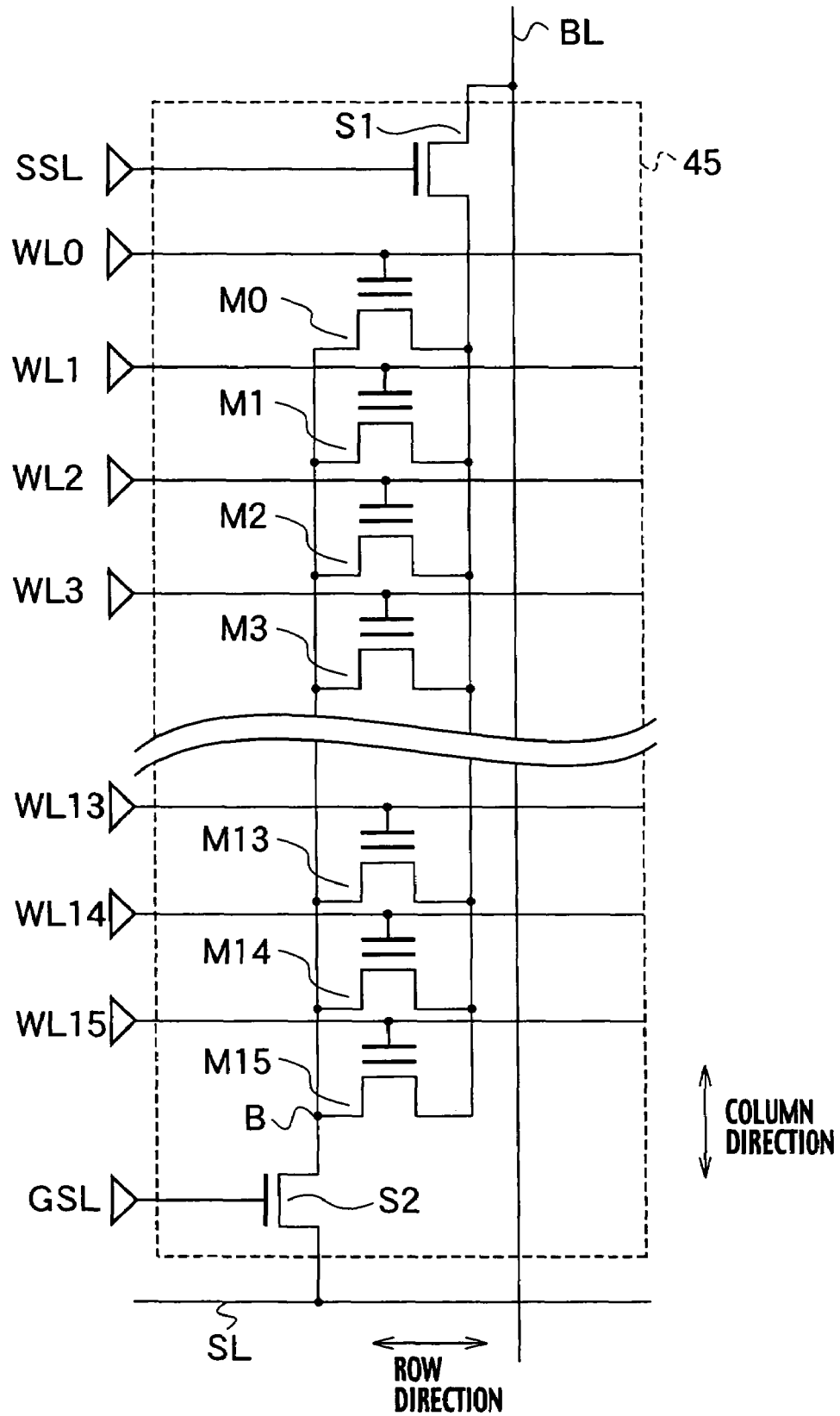
FIG. 27 shows a schematic circuit structure of an exemplary AND MONONOS flash memory unit, which is a semiconductor memory according to a seventh embodiment of the present invention.
Figure 28:
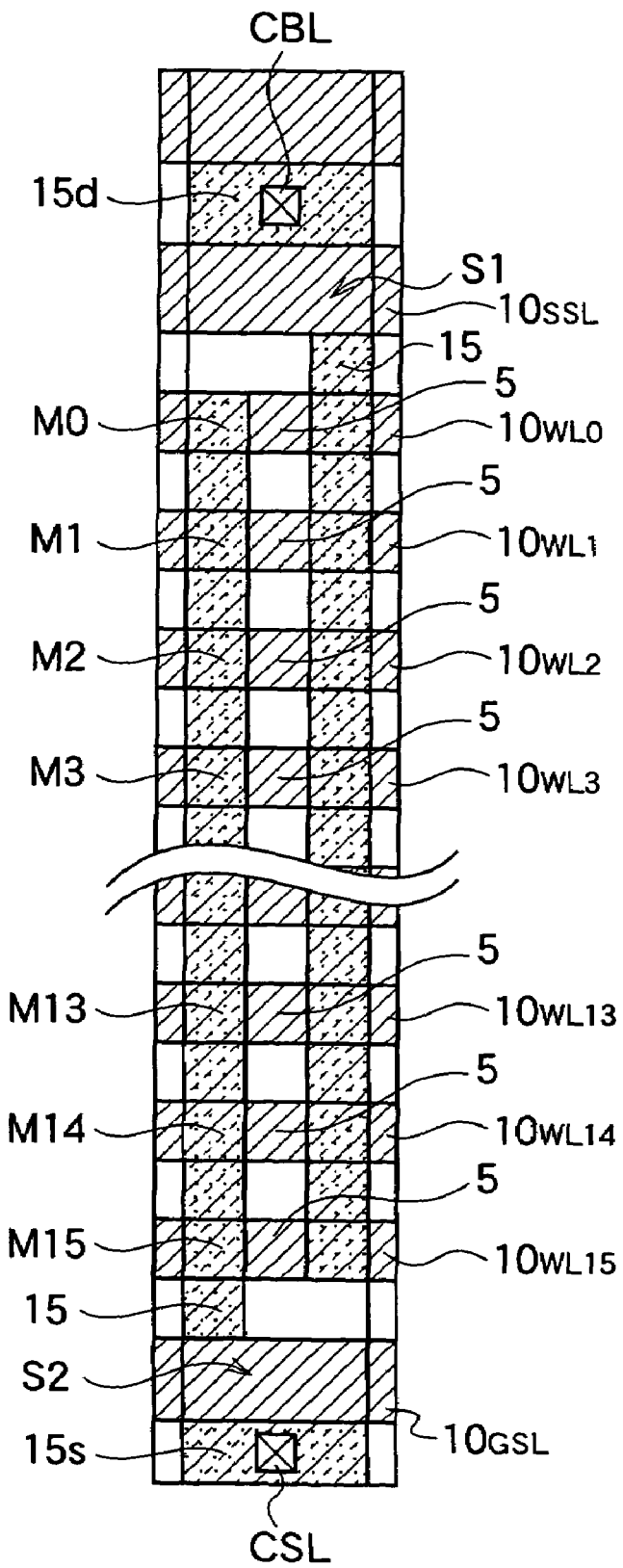
FIG. 28 shows a schematic planar pattern structure of the exemplary AND MONONOS flash memory unit, which is the semiconductor memory according to the seventh embodiment of the present invention.
Figure 29:
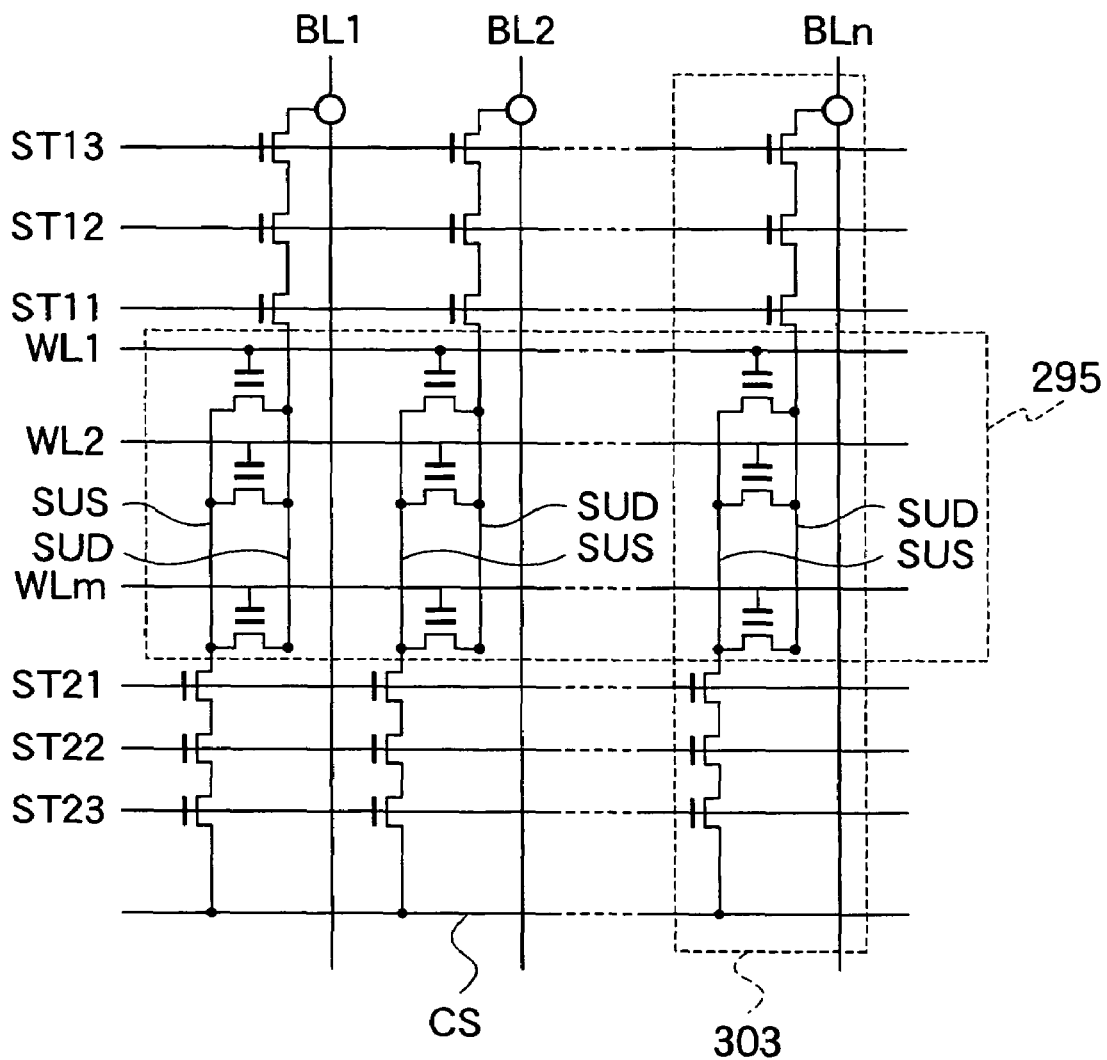
FIG. 29 shows a schematic circuit structure of the exemplary AND MONONOS flash memory unit, which is the semiconductor memory according to the seventh embodiment of the present invention.

The term "AND" is derived from the fact that the connecting method is a parallel connection as with the NOR type, and the logic method is opposite the NOR type. FIG. 27 through FIG. 29 show a semiconductor memory according to the seventh embodiment of the present invention. FIG. 27 is a schematic circuit diagram of an exemplary AND MONONOS flash memory unit; FIG. 28 is a schematic planar pattern of an exemplary AND MONONOS flash memory unit 45, which corresponds to FIG. 27; and FIG. 29 is a circuit diagram of an exemplary matrix configured with AND MONONOS flash memory according to the seventh embodiment of the present invention.

As shown in FIG. 29, relative to an AND MONONOS memory cell array 295, the bit line side select gate is divided into three bit line side select gate lines ST11, ST12, and ST13. In addition, the source line side select gate is also divided into three source line side select gate lines ST21, ST22, and ST23.

Different signals may be assigned to these select gates from a select gate control circuit (not shown in the figure). Alternatively, the select gates short circuit at a predetermined pitch, and a technique may be employed to reduce the delay of signals propagated on the select gate line. In FIG. 29, word lines WL1 through WLm are arranged orthogonal to the bit lines BL1 through BLn. A region 303 enclosed by a dotted line indicates the AND MONONOS memory cell unit. The AND MONONOS memory cell units 303 are electrically connected to a common source line CS. The AND MONONOS memory cell unit 303 is configured with MONONOS memory cells connected in parallel between sub bit lines SUD and sub source lines SUS, bit line side select gate lines ST11, ST12, and ST13, which connect the sub bit lines SUD to the bit lines, and source line side select gate lines ST21, ST22, and ST23, which connect the sub source lines SUS to the source line CS. The feature of this MONONOS memory cell array is that a pseudo contactless structure is employed where the wirings of the bit lines BL0 through BLn and the source line CS are hierarchized, and sub bit lines SUD and sub source lines SUS are made from diffused layers.

Eighth Embodiment (Divided Bit Line NOR MONONOS Flash Memory)

The divided bit line NOR (DINOR) type flash memory has the following features: single power supply operation, high-speed programming, and small memory size, which are the same as the NAND flash memory, and high-speed random access, which is a feature of a NOR flash memory. A hierarchical structure is employed for the bit lines and sub bit lines SUD in the memory array, therefore, the DINOR flash memory unit is approximately equal to that of the AND type. The memory cell is a MONONOS type as with the NOR type or the NAND type memory cell, and the drain in the memory cell is connected in parallel to the sub bit line SUD, which is made from polysilicon. For example, in the case of 16M-bit DINOR flash memory, 64 memory cells are connected to the sub bit lines SUD. The memory cell size is reduced by making the connection to the memory cell using implanted contacts between polysilicon and diffused layer. The mechanism for writing-in/erasing the memory cell is the same as that for AND flash memory, and is performed using the FN tunnel current. Programming to the memory cell is performed by injecting holes from the drain into the first charge storage layer. In the erase operation, electrons are implanted from the substrate to the first charge storage layer using the tunnel current of the entire channel surface.

Figure 30:
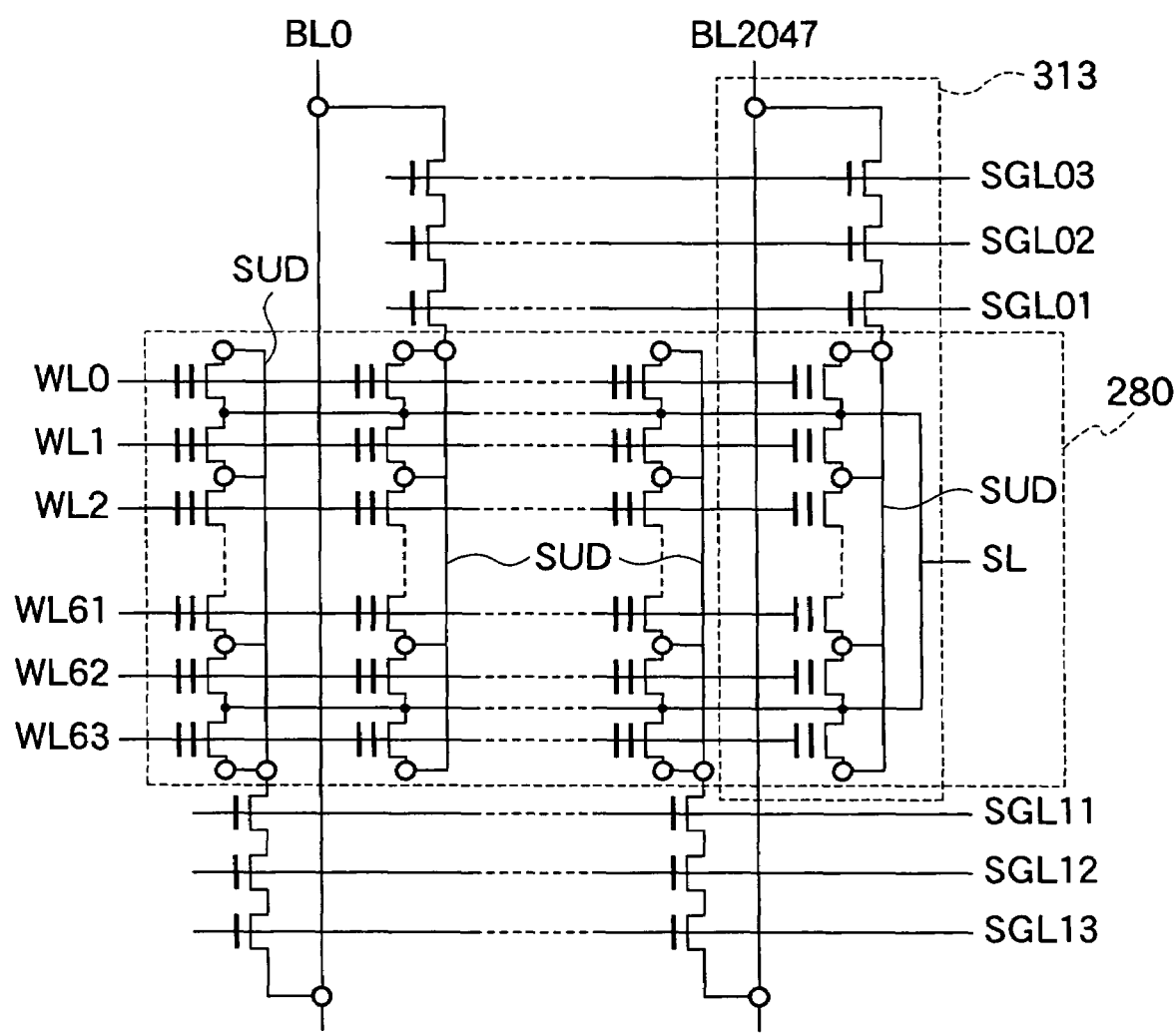
FIG. 30 shows an exemplary circuit structure of a semiconductor memory configured with a divided bit line NOR MONONOS flash memory according to an eighth embodiment of the present invention, and is a planar view showing an example configured with NAND flash memory.

FIG. 30 is a circuit diagram of an exemplary semiconductor memory configured with DINOR MONONOS flash memory according to the eighth embodiment of the present invention. For the DINOR MONONOS flash memory, as shown in FIG. 30, in a DINOR MONONOS memory cell array 280, a hierarchical structure is employed for the bit lines BL0 through BL2047, and the sub bit lines SUD, where the bit lines are connected to the sub bit lines SUD via select gate lines SGL01, SGL02, and SGL03, and select gate lines SGL11, SGL12, and SGL13, respectively. In other words, at the bottom of the figure, three select gate lines SGL11, SGL12, and SGL13 are respectively formed, whereas, at the top of the figure, three select gate lines SGL01, SGL02, and SGL03 are respectively formed. The bit line side select gate is divided into three select gate lines SGL01, SGL02, and SGL03. In addition, the source line side select gate is also divided into three select gate lines SGL11, SGL12, and SGL13. Different signals may be assigned to the select gates from a select gate control circuit (not shown in the figure). Alternatively, the select gates short circuit at a predetermined pitch, and a technique may be employed to reduce the delay of signals propagated on the select gate line. In addition, in the DINOR memory cell array, word lines WL0 through WL63 are arranged orthogonal to the bit lines BL0 through BL2047, and a memory cell is connected to each word line. The memory cells are electrically connected to the common source region of each memory cell, and also connected to the common source line SL. In FIG. 30, an area 313 enclosed by a dotted line indicates the DINOR memory cell unit. Furthermore, a black circle ● indicates a diffusion layer region while a white circle ○ indicates a contact region.

Ninth Embodiment (NAND MONONOS Flash Memory)

Figure 31:
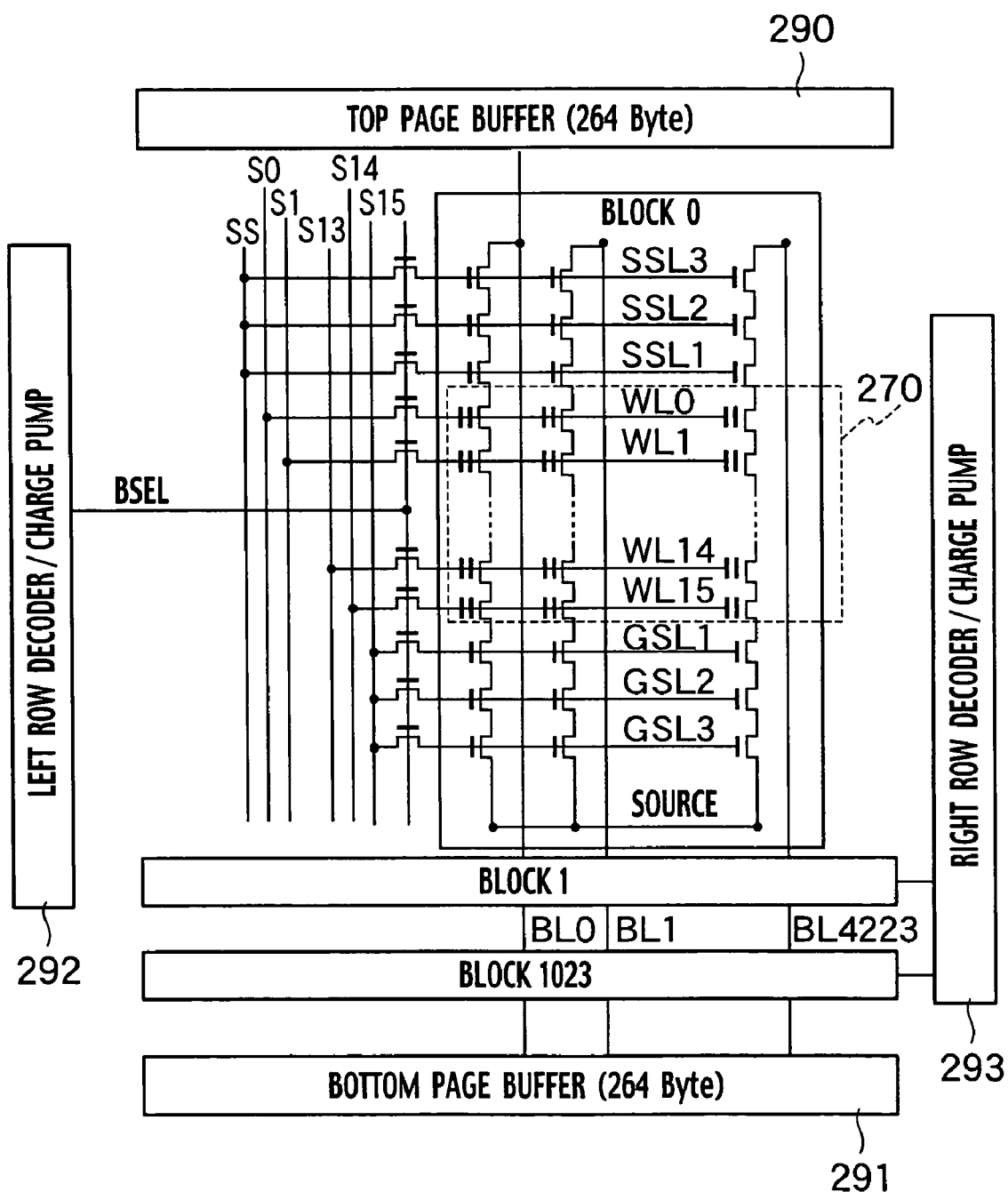
FIG. 31 shows a schematic circuit structure of an exemplary 64M-bit NAND MONONOS flash memory unit, which is a semiconductor memory according to a ninth embodiment of the present invention.

FIG. 31 is a circuit diagram of an example of the semiconductor memory configured with 64M-bit NAND MONONOS flash memory according to the ninth embodiment of the present invention. As shown in FIG. 31, the bit line side select gate is divided into three bit line side select gate lines SSL1, SSL2, and SSL3. In addition, the source line side select gate is also divided into three source line side select gate lines GSL1, GSL2, and GSL3. Different signals may be assigned to the select gates from a select gate control circuit (not shown in the figure). Alternatively, the select gates short circuit at a predetermined pitch, and a technique may be employed to reduce the delay of signals propagated on the select gate line. In the exemplary circuit structure of FIG. 31, a technique is employed to supply the same electric potential through the operation of the row select transistor. In FIG. 31, block 0 through block 1023 including a NAND MONONOS memory cell array 270 are arranged, where a top page buffer 290, a bottom page buffer 291, a left row decoder/charge pump 292, and a right row decoder/charge pump 293 are arranged. In addition, in FIG. 31, word lines WL0 through WL15 are arranged in parallel with the bit line side select gate lines SSL1, SSL2, and SSL3, and the source line side select gate lines GSL1, GSL2, and GSL3, where bit lines BL0 through BL4223 are arranged orthogonal to the word lines. A feature of FIG. 31 is that the bit line side select gate lines SSL1, SSL2, and SSL3 are short circuited, and the source line side select gate lines GSL1, GSL2, and GSL3 are short circuited.

The present invention is not limited to the above first through ninth embodiments. As the method for forming a device isolating layer or an insulating layer, a method other than converting silicon into a silicon oxide film or a silicon nitride film may be used, for example, oxygen ion implantation into deposited silicon or oxidization of deposited silicon. Furthermore, $TiO_2$, $Al_2O_3$, a tantalum oxide film, strontium titanate, barium titanate, lead zirconium titanate, or a stacked layer thereof may be used for the first charge storage layer 5. Though the p-type silicon semiconductor region 1 is assumed as the semiconductor substrate in the embodiments, an n-type silicon substrate, a SOI silicon layer of a silicon-on-insulator (SOI) substrate, or a monocrystal semiconductor substrate that includes silicon, such as a SiGe mixed crystal or a SiGeC mixed crystal, may be used instead. In addition, formation of an n-channel MISFET on the p-type silicon semiconductor region 1 or the p-well region 163 has been described above, however, this structure may be replaced with formation of a p-channel MISFET on the n-type silicon semiconductor region 1. In that case, an n-type conductivity should be substituted for the p-type conductivity and a p-type conductivity substituted for the n-type conductivity for the source regions or the drain regions and the semiconductor regions in the above embodiments. Furthermore, the doping impurities As, P, and Sb should be replaced with either In or B. In this case, the gate remains a p-type conductivity. Furthermore, a silicon semiconductor, a SiGe mixed crystal, or a SiGeC mixed crystal may be used for the control electrode 7. The control electrode 7 may be a polycrystal or a stacked layer structure. Moreover, amorphous silicon, an amorphous SiGe mixed crystal, or an amorphous SiGeC mixed crystal may be used for the control electrode 7. The control electrode 7 may be a stacked layer structure thereof. However, it is desirable to use a semiconductor, in particular, a semiconductor including silicon that allows forming p-type electrodes and preventing electron injection from the gate electrodes. Furthermore, the first charge storage layers 5 may be formed in a pattern of dots, where applicable. In addition, since the first embodiment and its second modified example, the first modified example of the second embodiment, and the fifth embodiment have structures where the second charge storage layers 62 are divided between memory cells, respectively, the second charge storage layer 62 may be a semiconductor layer made from, for example, Si, a SiGe mixed crystal, a SiGeC mixed crystal or the like, as electrical isolation can be preserved.

It should be noted that with the semiconductor memory according to the first through ninth embodiments of the present invention, for the method for storing electrons in the second charge storage layer 62, erasure should be performed by injecting electrons from the control gate 7 under the conditions where the voltage applied to the control electrode 7 relative to the p-type silicon semiconductor region 1 is a further negative value, such as $V_{ppe1}$. Note that after electrons have been injected into the second charge storage layer 62, by applying a voltage to the control electrode 7, relative to the p-type silicon semiconductor region 1, that is closer to 0 V than the above $V_{ppe1}$, charges can be prevented from being further injected into the second charge storage layer 62, and deterioration due to repeated charge injection from the first charge storage layer 5 or changes in characteristics due to variation in the quantity of charge can be prevented. Furthermore, as a method for injecting electrons into the second charge storage layer 62, for example, charge accumulation may be performed by charging, such as a dry etching process, a high concentration plasma (HDP) insulating layer deposition process, or the like employed when forming a semiconductor memory according to the embodiments of the present invention.

Moreover, it is apparent that the semiconductor memory according to the first through ninth embodiments of the present invention is effective even if a different insulating layer is inserted between the first charge storage layer 5 and the first block insulating layer 61. However, forming the first block insulating layer 61 directly on the first charge storage layer 5 is desirable since the thickness of the stacked insulating layer can be made thinner and programming and erasure can be performed with a lower electric field, and low power consumption can be achieved.

In addition, with the semiconductor memory according to the first and the second embodiment of the present invention, it is desirable for the thickness of the second charge storage layer 62 to be less than that of the first charge storage layer 5 since programming and erasure can be performed with a lower electric field by decreasing the effective film thickness $t_{eff}$, and low power consumption can be achieved. It should be noted that even under such conditions, since the thickness of the first block insulating layer (second insulating layer) 61 and the thickness of the second block insulating layer (third insulating layer) 63 are greater than that of the first gate insulating layer 4, the loss of charges from the second charge storage layer 62 can be made less than that from the first charge storage layer 5. In addition, this condition may be used in combination with the above condition where thickness $t_{ox2}$ of the first block insulating layer (second insulating layer) 61 is thicker than the thickness $t_{ox3}$ of the second block insulating layer (third insulating layer) 63.

Tenth Embodiment

Figure 32:
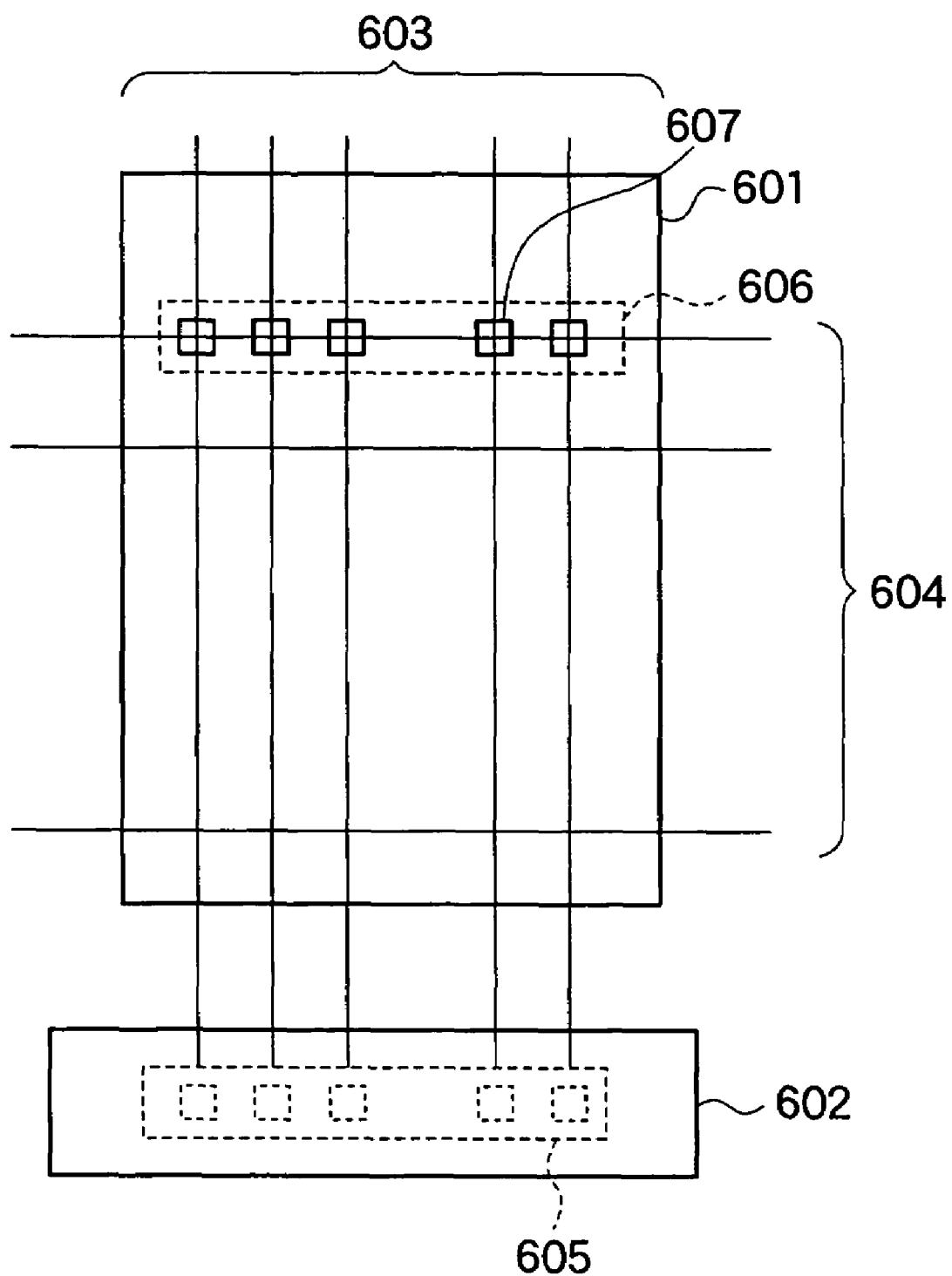
FIG. 32 is a schematic block diagram of page mode MONONOS flash memory used in a semiconductor memory system according to a tenth embodiment of the present invention.

Roughly classified, there are three operation modes of a semiconductor memory according to the embodiments of the present invention. The operation modes are "page mode", "byte mode", and "ROM region included EEPROM mode". The page mode performs, as shown in FIG. 32, a read-out operation of all the memory cell strings 606, at one time, formed on a word line 604 in a MONONOS flash memory cell array 601 into a sense amplifier 602 as memory cell strings 605 via a bit line 603, or alternatively, a programming operation from the sense amplifier 602 of all the memory cells at one time. In other words, the read-out/programming operation is performed page-by-page. In FIG. 32, MONONOS memory cells 607 are arranged on the intersections of the word line 604 and bit line 603.

Figure 33:
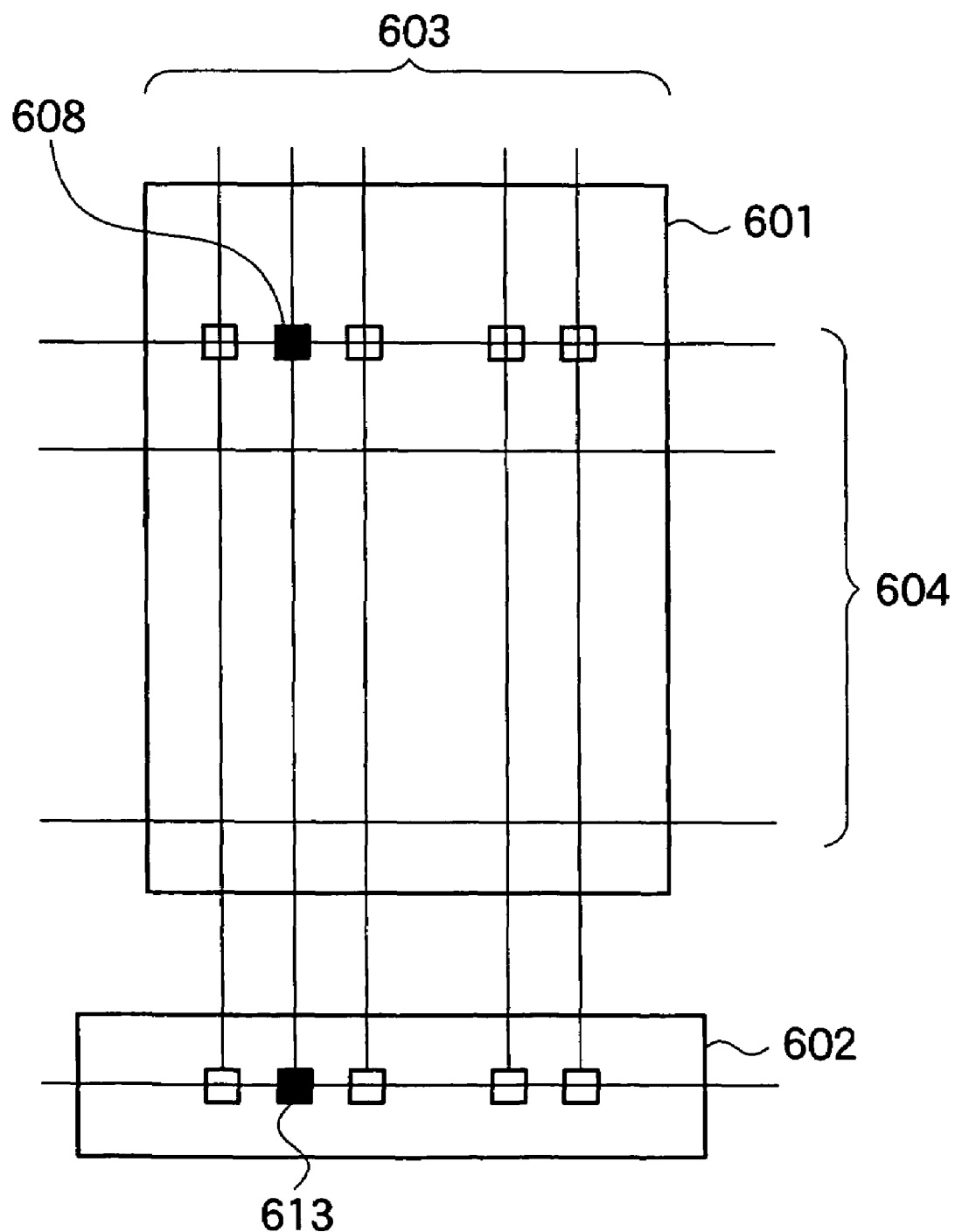
FIG. 33 is a schematic block diagram of byte mode MONONOS flash memory used in the semiconductor memory system according to the tenth embodiment of the present invention.

In contrast, the byte mode performs, as shown in FIG. 33, read-out operation of a MONONOS memory cell 608 formed on the word line 604 in the MONONOS flash memory cell array 601 into the sense amplifier 602 as a memory cell 613 byte-by-byte, or programming operation from the memory cell 613 in the sense amplifier 602 into a MONONOS memory cell 608 byte-by-byte. In other words, it is different from the page mode in that read-out/programming operation is performed byte-by-byte.

Figure 34:
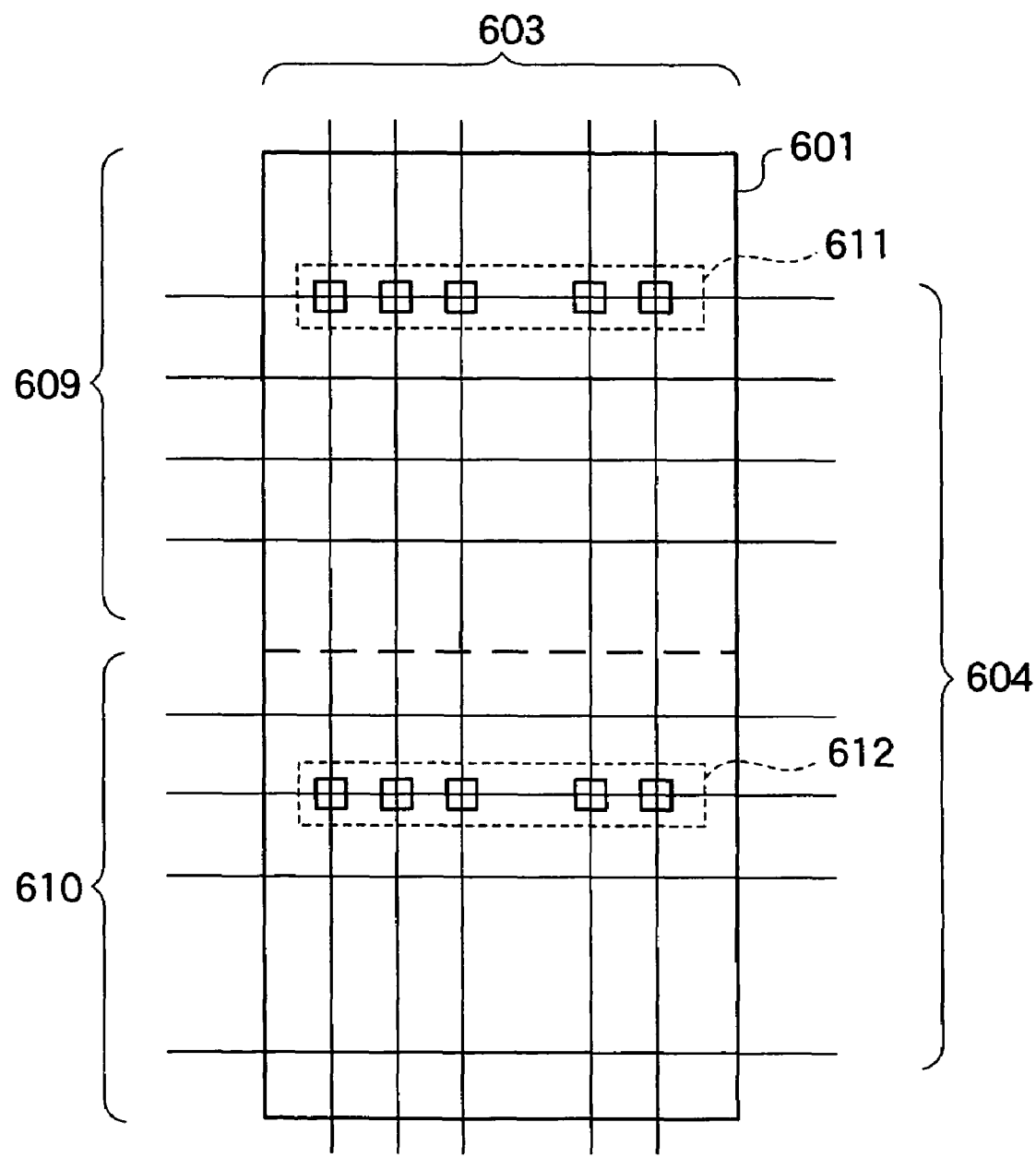
FIG. 34 is a schematic block diagram of ROM region included EEPROM mode MONONOS flash memory used in the semiconductor memory system according to the tenth embodiment of the present invention.

The ROM region included EEPROM mode performs, as shown in FIG. 34, operations of reading out information from the MONONOS flash memory cell array 601 page-by-page, or, byte-by-byte, and rewriting the information by dividing the inside of the MONONOS flash memory cell array 601 into a MONONOS flash memory 609 section and an ROM region included EEPROM 610 section, and then systematically switching so that the ROM region included EEPROM 610 section performs the rewrite operations. An example where memory cell strings 611 on the same word line in the MONONOS flash memory 609 are read out or written in the ROM region included EEPROM 610 side as memory cell strings 612 is shown in FIG. 34.

Figure 35:
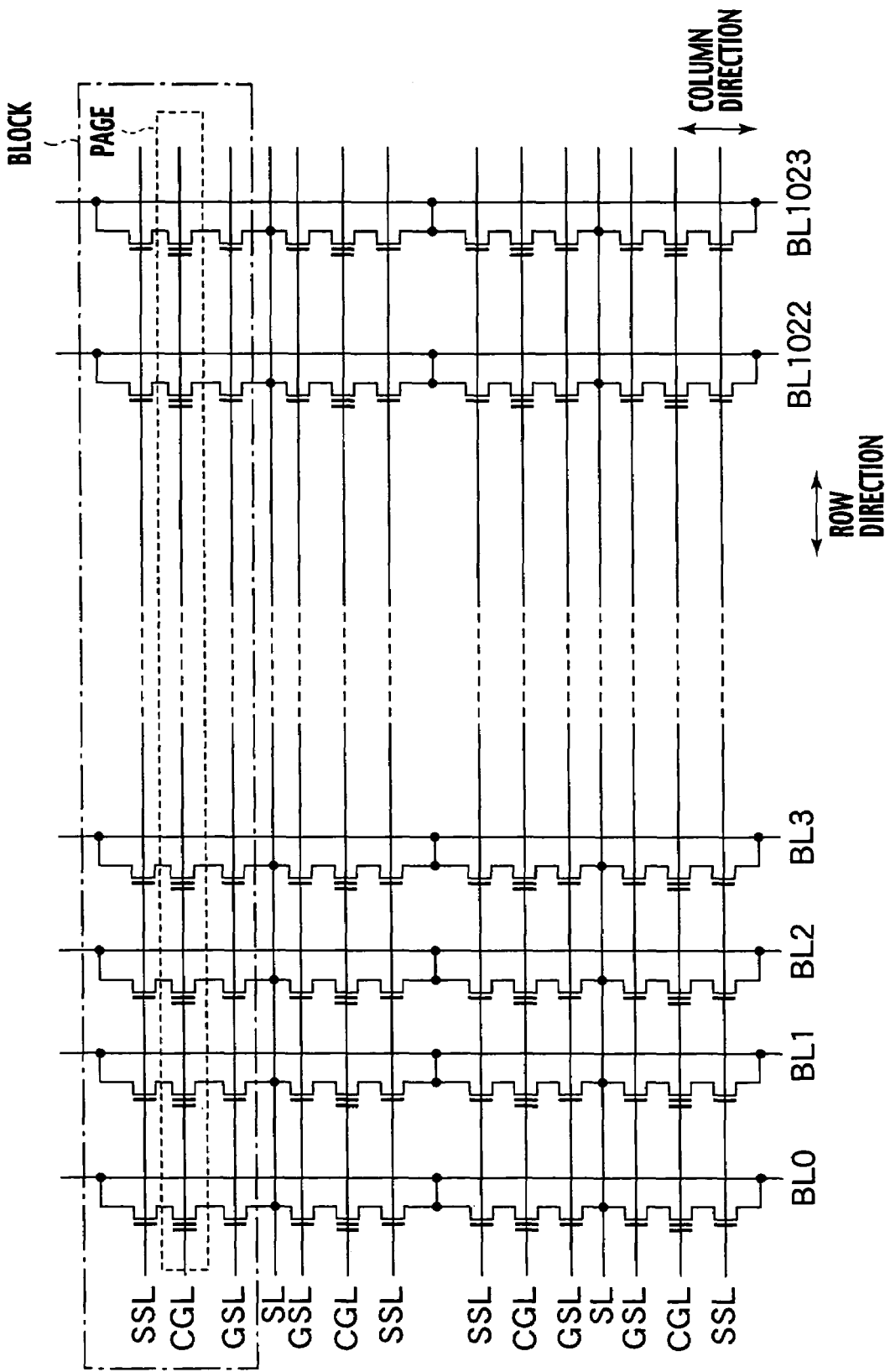
FIG. 35 shows a schematic circuit structure of ROM region included EEPROM mode MONONOS flash memory used in the semiconductor memory system according to the tenth embodiment of the present invention.

FIG. 35 is a schematic circuit diagram of the ROM region included EEPROM MONONOS flash memory shown in FIG. 34 that is used in the semiconductor memory according to the tenth embodiment of the present invention. An exemplary circuit shown in FIG. 35 features the use of a three-transistor NAND cell structure. In other words, a three transistor/cell style NAND MONONOS memory cell array is configured by arranging two switching transistors for each NAND memory cell. CGL is the control gate line, SSL is the select gate line for the source side switching transistor, and GSL is the select gate line for the drain side switching transistor. One horizontal block of NAND MONONOS memory cells on the same CGL line configure one page. Bit lines BL0 through BL1023 are arranged vertically. By using such three transistor/cell style NAND MONONOS memory cells, it is possible to implement the ROM region included EEPROM mode MONONOS flash memory cell array 601 as shown in FIG. 34.

Naturally, it is possible to operate the respective semiconductor memorys according to the first through ninth embodiments of the present invention in each mode: page mode, byte mode, and ROM region included EEPROM mode. In addition, in the above-described semiconductor memory according to the seventh through ninth embodiments of the present invention, examples of AND MONONOS flash memory, DINOR MONONOS flash memory, and NAND MONONOS flash memory are described, however, it is apparent that it is possible to implement operation modes of page mode, byte mode, and ROM region included mode in any of such three types of MONONOS flash memory. In particular, as described later, in the case of using the MONONOS flash memory in applications such as vehicle LSIs, memory cards, or IC cards, the ROM region included EEPROM mode allowing the flash memory to operate systematically is important for configuring system LSI.

[System LSI]

In the semiconductor memory according to the first through ninth embodiments of the present invention, various application examples are possible. Some of those application examples are shown in FIG. 36 through FIG. 50.

APPLICATION EXAMPLE 1

Figure 36:
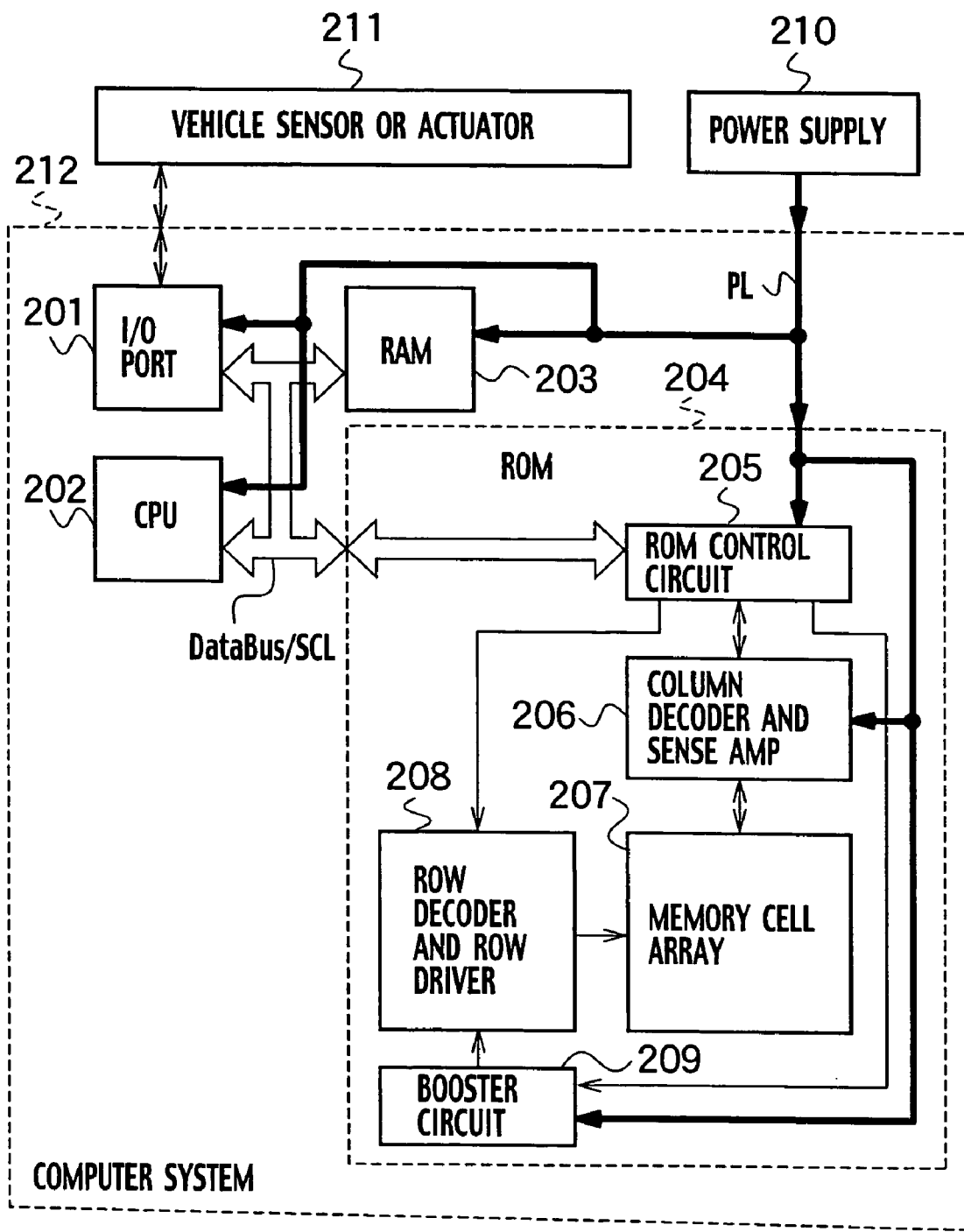
FIG. 36 is a schematic block diagram of a vehicle integrated circuit to which is applied the semiconductor memory system according to the tenth embodiment of the present invention.

The semiconductor memory according to the first through sixth embodiments of the present invention described above is also applicable for a semiconductor memory system in which not only a stand-alone read-only memory (ROM) array, but also more complicated logic circuits and ROM arrays are formed on the same semiconductor substrate. FIG. 36 shows a computer system 212 employing, for example, the aforementioned MONONOS memory cell array structure described with FIGS. 18, 19, 22, and 23. In particular, FIG. 36 shows the computer system 212 for a vehicle system. The computer system 212 is electrically connected to a vehicle sensor or actuator 211 via wiring so as to transfer electrical signals via an input/output port 201. Furthermore, power is supplied from a power supply 210 to the computer system 212 via a power line PL. It is desirable for the voltage output from the power supply 210 to lie in the range between 1 V and 5 V since this satisfies the power supply voltage specifications for the logic circuits of RAM 203 or a CPU 202 and the input/output port 201 to be described later, and since the surface area of wires may be reduced via a single power supply wiring. It should be noted that the power line PL is indicated by a thick line in the drawing to be easily distinguished.

Note that this computer system 212 includes the input/output port 201, RAM 203 that is the first memory device, the CPU 202 that computes information, and ROM 204. The system is where these are capable of transferring data via data bus lines and internal system control lines. In this case, ROM 204 is a region for storing programs that the CPU 202 executes, and furthermore, is a region for, for example, storing information of respective vehicle identification numbers or vehicle export destinations, or the like. In addition, ROM 204 has a ROM control circuit 205 that is connected to the data bus. This ROM control circuit 205 is a logic circuit that performs read-out, programming, and erasure operations for a specific address in a memory cell according to instructions for read-out, programming, and erasure operations for ROM 204 given through the data bus or internal system control lines. Furthermore, this ROM control circuit 205, which is connected to a column decoder and sense amplifier 206, is a circuit for decoding the address of a specified column, and then transferring the programming data or read-out data of that column. Moreover, the column decoder and sense amplifier 206 is connected to a memory cell array 207 via respective data transfer lines. On the other hand, the ROM control circuit 205, which is connected to a row decoder and row driver 208, is a circuit for decoding the address of a specified row, and then, for example, applying the boost voltage provided from a booster circuit 209 to the data select line corresponding to the row upon programming. In this case, the booster circuit 209 is a circuit, which for example, has a charge pump circuit, and applies a high voltage that ranges between the power supply voltage and 30 V to the memory cell array 207.

In addition, the row decoder and the row driver 208 are connected to the memory cell array 207 via respective data select lines. It should be noted that the memory cell array 207 has adopted here, for example, the memory cell array structure described in FIG. 18 or FIG. 20. Accordingly, compared to the conventional example, the present invention has the effects of Features 1 and 2, in other words, the effect of reducing the number of traps of the first charge storage layer 5, or the increase in interface levels in the vicinity of the first charge storage layer 5, and improving reliability. Furthermore, the present invention has the effect of securing isolation of the programming threshold and the erasure threshold, and further securing isolation even if the charge holding characteristics deteriorate due to a rise in temperature. With a vehicle LSI system, since there is a possibility for the car temperature to exceed the consumer specification temperature (for example, 85° C.), guarantee for high-temperature operation in an 85° C. to 100° C. environment is required. However, due to the above effects, the semiconductor memory system of this application example can achieve a highly reliable memory system with few malfunctions even in such environment. Moreover, the programming time varies less than in the conventional example, and the erasure time can be shortened. Accordingly, the sum of the data erasure time and the programming time, in other words, the rewrite time can be shortened, thereby improving the speed for rewriting mixed memory, in particular, an EEPROM for which bit-to-bit programming and erasure operations are required.

In addition, as indicated in Feature 1, the erasure speed can be improved under the conditions where the programming voltage and speed remain the same as those in the conventional example. Accordingly, in the case where the programming time is assumed constant, compared to the conventional example, the programming time can be extended as much as the erasure time can be shortened. Therefore, the voltage applied to the control electrode 7 relative to the p-type silicon semiconductor region 1 can be reduced upon programming, thereby further reducing the voltage generated at the booster circuit. This allows the surface area of the charge pump circuit in the booster circuit to be reduced more than was previously possible, therefore reducing the power consumed in the booster circuit or shortening the time it takes for completion of boosting. In addition, a transistor device with low circuit immunity can be used as a row driver, so that for example, the device isolating space between the transistor devices, which are row drivers, can be reduced, leading to providing a smaller row driver surface area.

In addition, the surface area of the ROM circuit can be further reduced since punch-through does not occur even if the booster circuit 209 and the row decoder and row driver 208, to which high voltage is applied respectively, are arranged closer to the ROM control circuit 205 and the column decoder and sense amplifier 206, which both operate at a lower power supply voltage. Naturally, in this working example, a mixed circuit including the CPU 202 and/or RAM 203, may be formed not only in ROM 204 but on the same semiconductor substrate as the ROM. Even in such example, the surface area of the mixed circuit can be further reduced since punch-through does not occur even if the CPU 202 or the RAM 203 operating at a low voltage is arranged closer to the row decoder and row driver 208 and the booster circuit 209.

APPLICATION EXAMPLE 2

Figure 37:
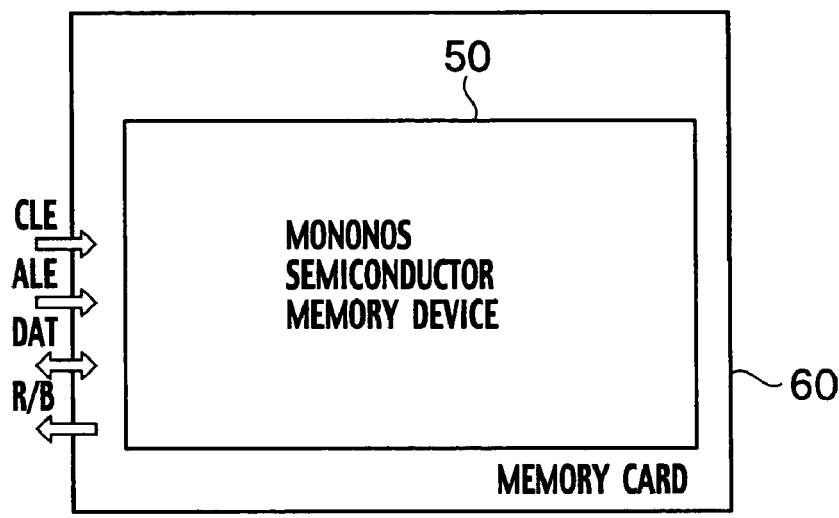
FIG. 37 is a schematic block diagram illustrating an internal structure of a memory card to which is applied the semiconductor memory system according to the tenth embodiment of the present invention.

As an example, a memory card 60 including a MONONOS semiconductor memory 50 having MONONOS memory cells is configured as shown in FIG. 37. The semiconductor memories according to the first through ninth embodiments of the present invention are applicable to the MONONOS semiconductor memory 50. The memory card 60 is, as shown in FIG. 37, operable so as to receive a predetermined signal from an external device (not shown in the drawing) or to output a predetermined signal to an external device (not shown in the drawing).

A signal line DAT, command line enable signal line CLE, address line enable signal line ALE, and ready/busy signal line R/B are connected to the memory card 60 in which the MONONOS semiconductor memory 50 is embedded. The signal line DAT is used to transfer a data signal, address signal, or command signal. The command line enable signal line CLE is used to transmit a signal which indicates that the command signal is being transferred over the signal line DAT. The address line enable signal line ALE is used to transmit a signal which indicates that the address signal is being transferred over the signal line DAT. The ready/busy signal line R/B is used to transmit a signal which indicates whether the semiconductor memory 50 is ready or not. The signal line DAT is used to transfer a data signal, address signal, or command signal. The command line enable signal line CLE is used to transmit a signal which indicates that the command signal is being transferred over the signal line DAT. The address line enable signal line ALE is used to transmit a signal which indicates that the address signal is being transferred over the signal line DAT. The ready/busy signal line R/B is used to transmit a signal which indicates whether the semiconductor memory 50 is ready or not.

APPLICATION EXAMPLE 3

Figure 38:
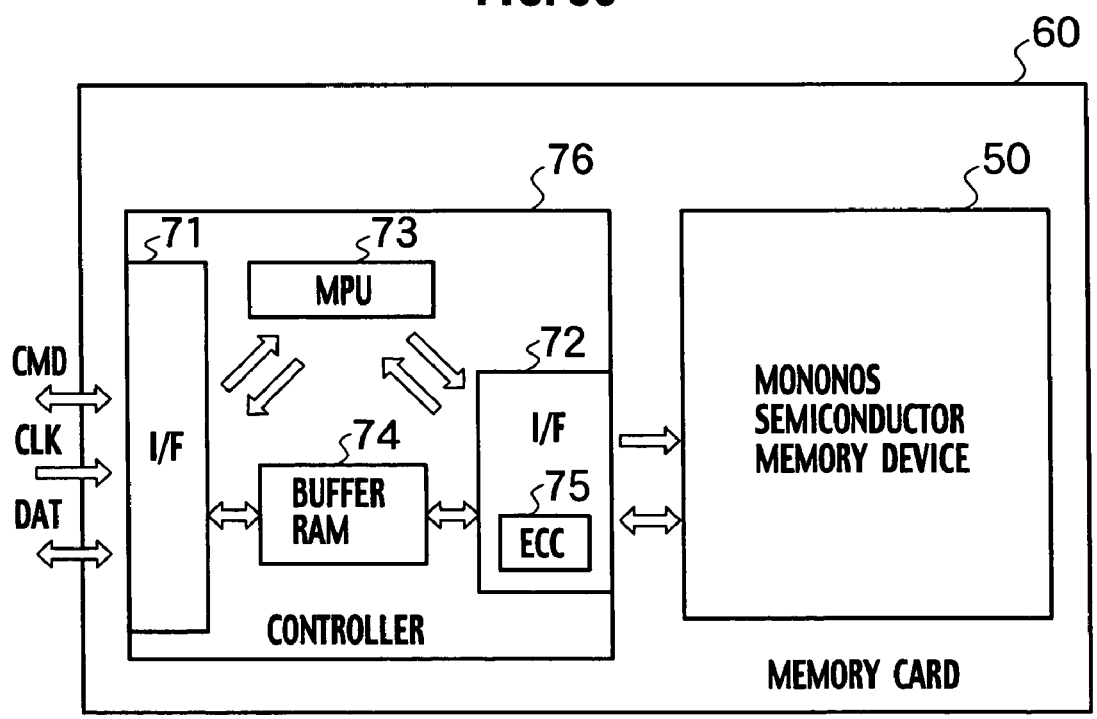
FIG. 38 is a schematic block diagram illustrating the internal structure of a memory card to which is applied the semiconductor memory system according to the tenth embodiment of the present invention.

Another example of the memory card 60 includes, as shown in FIG. 38, a MONONOS semiconductor memory 50, and a controller 76 that controls the MONONOS semiconductor memory 50, and transfers a prescribed signal with an external device, unlike with the example of the memory card of FIG. 37. The controller 76 has interface units (I/F) 71 and 72, a microprocessor unit (MPU) 73, buffer RAM 74, and an error correction code unit (ECC) 75 included in the interface unit (I/F) 72.

The interface unit (I/F) 71 transfers a prescribed signal to an external device, and the interface unit (I/F) 72 transfers a prescribed signal to the MONONOS semiconductor memory 50. The microprocessor unit (MPU) 73 converts a logic address to a physical address. The buffer RAM 74 temporarily stores data. The error correction code unit (ECC) 75 generates an error correction code.

A command line CMD, clock signal line CLK, and signal line DAT are connected to the memory card 60. The number of control signal lines, bit width of signal line DAT, and circuit structure of the controller 76 may be modified as desired.

APPLICATION EXAMPLE 4

Figure 39:
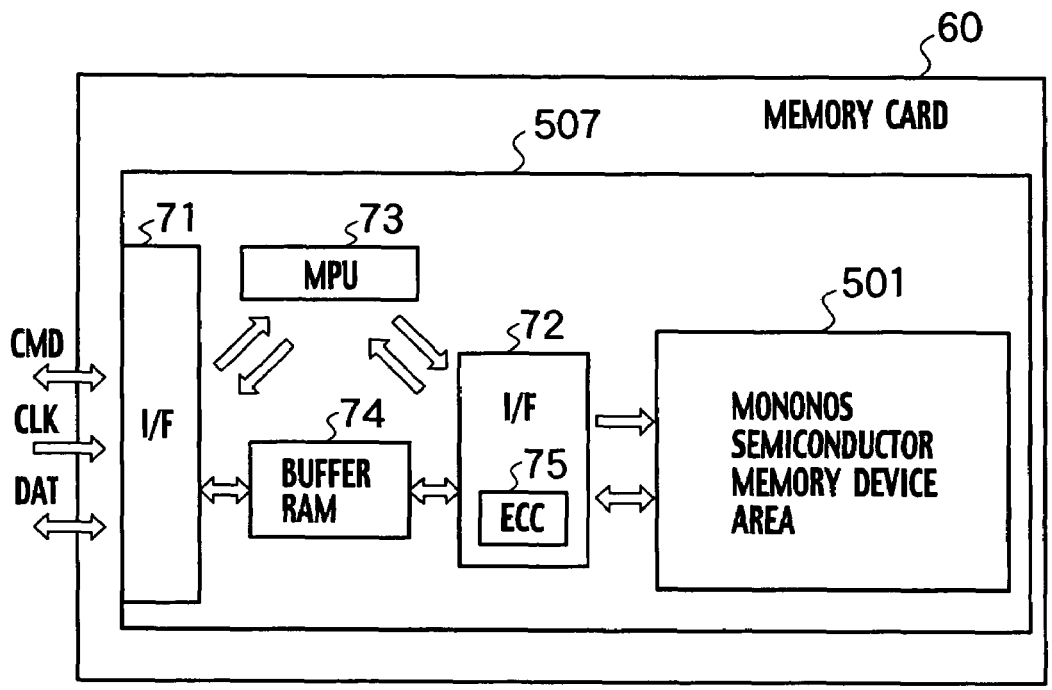
FIG. 39 is a schematic block diagram illustrating the internal structure of a memory card to which is applied the semiconductor memory system according to the tenth embodiment of the present invention.

Another exemplary structure of the memory card 60 implements, as shown in FIG. 39, a system LSI chip 507 by integrating interface units (I/F) 71 and 72, a microprocessor unit (MPU) 73, buffer RAM 74, error correction code unit (ECC) 75 included in the interface unit (I/F) 72, and MONONOS semiconductor memory region 501 all onto one chip. Such system LSI chip 507 is loaded in the memory card 60.

APPLICATION EXAMPLE 5

Figure 40:
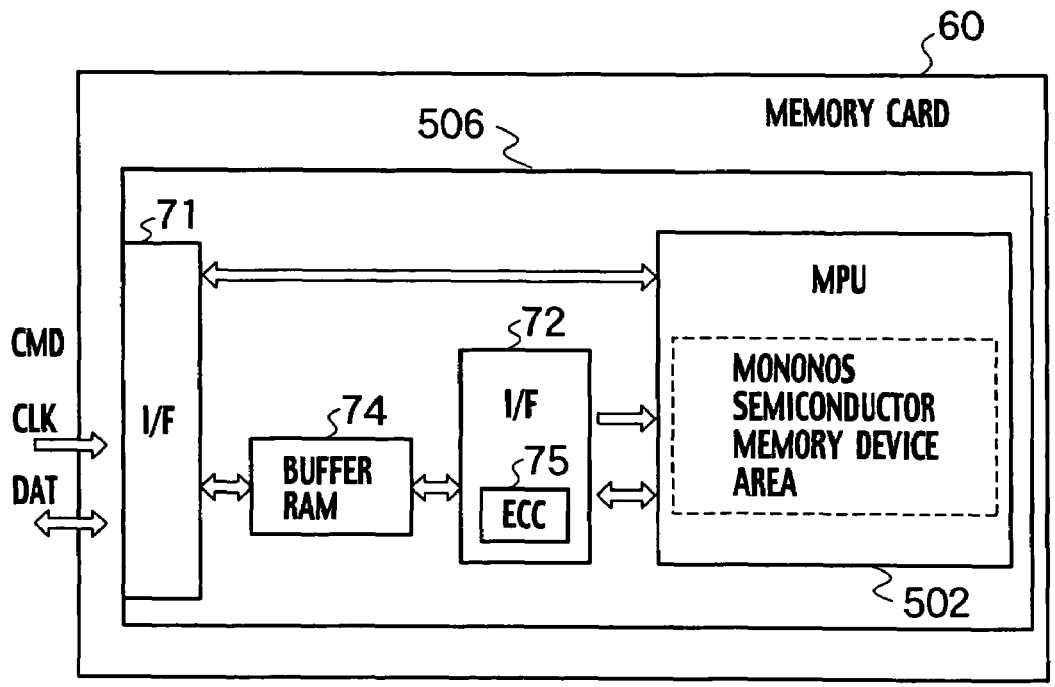
FIG. 40 is a schematic block diagram illustrating the internal structure of a memory card to which is applied the semiconductor memory system according to the tenth embodiment of the present invention.

Another exemplary structure of the memory card 60 implements, as shown in FIG. 40, a MONONOS memory mixed MPU 502 by forming the MONONOS semiconductor memory region 501 in the microprocessor unit (MPU) 73, and implements a system LSI chip 506 by integrating interface units (I/F) 71 and 72, buffer RAM 74, and error correction code unit (ECC) 75 included in the interface unit (I/F) 72 all onto one chip. Such system LSI chip 506 is loaded in the memory card 60.

APPLICATION EXAMPLE 6

Figure 41:
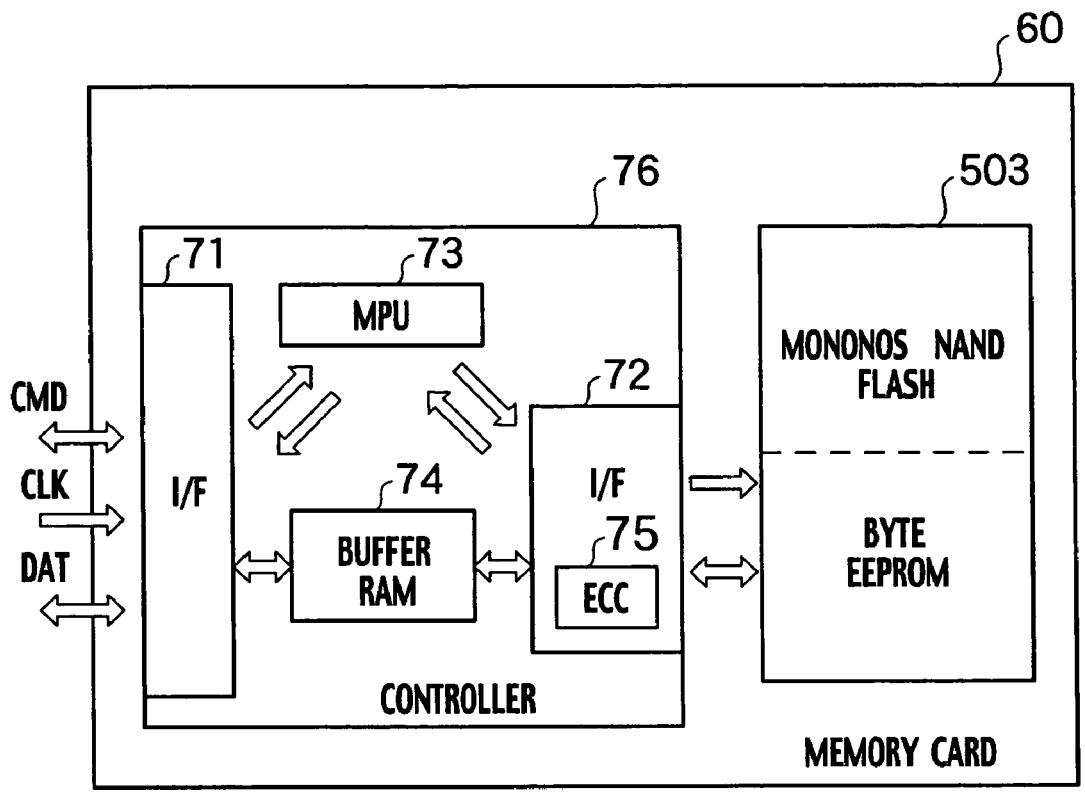
FIG. 41 is a schematic block diagram illustrating the internal structure of a memory card to which is applied the nonvolatile semiconductor memory system according to the tenth embodiment of the present invention.

Another exemplary structure of the memory card 60 utilizes, as shown in FIG. 41, an ROM region included EEPROM mode MONONOS flash memory 503, configured with NAND MONONOS flash memories and byte EEPROM, instead of the MONONOS semiconductor memory 50 shown in FIG. 37 or FIG. 38.

Naturally, it is possible to configure the system LSI chip 507 by forming the ROM region included EEPROM mode MONONOS flash memory 503 in the same chip as the controller 76, as shown in FIG. 39, and integrating them onto one chip. In addition, as shown in FIG. 40, it is possible to implement a MONONOS memory mixed MPU 502 by forming a semiconductor memory region configured with ROM region included EEPROM mode MONONOS flash memories 503 in the microprocessor unit (MPU) 73, and to configure a system LSI chip 506 by integrating the interface units (I/F) 71 and 72 and buffer RAM 74 all onto one chip.

APPLICATION EXAMPLE 7

Figure 42:
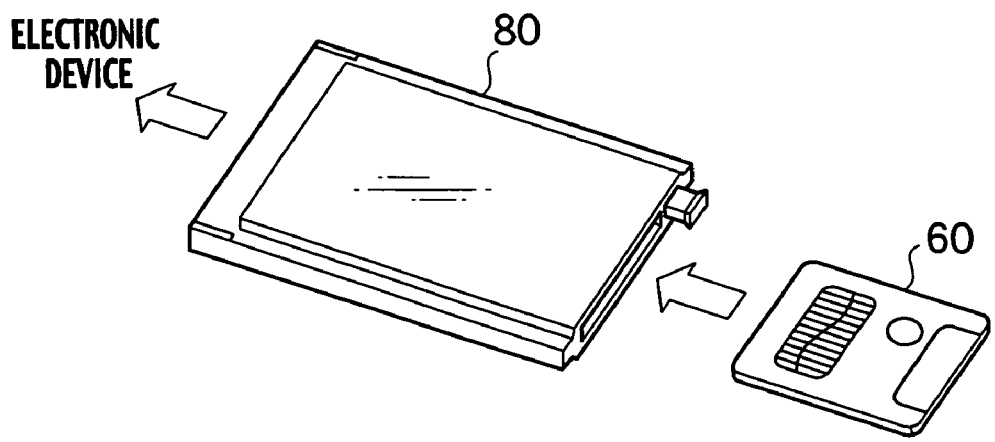
FIG. 42 shows a schematic structure of a memory card and a card holder to which is applied the nonvolatile semiconductor memory system according to the tenth embodiment of the present invention.

As an application example of the memory card 60 shown in FIG. 38 through FIG. 41, a memory card holder 80 may be provided, as shown in FIG. 42. The memory card holder 80 may receive the memory card 60, which uses the semiconductor memory described in detail in the first through ninth embodiments of the present invention as a MONONOS semiconductor memory 50. The memory card holder 80 is connected to an electronic device (not shown in the drawing), and is operable as an interface between the memory card 60 and the electronic device. The memory card holder 80 is capable of executing various functions such as those of the microcontroller 76, microprocessor unit (MPU) 73, buffer RAM 74, error correction code unit (ECC) 75, and interface units (I/F) 71 and 72 in the memory card 60 disclosed in FIG. 38 through FIG. 41.

APPLICATION EXAMPLE 8

Figure 43:
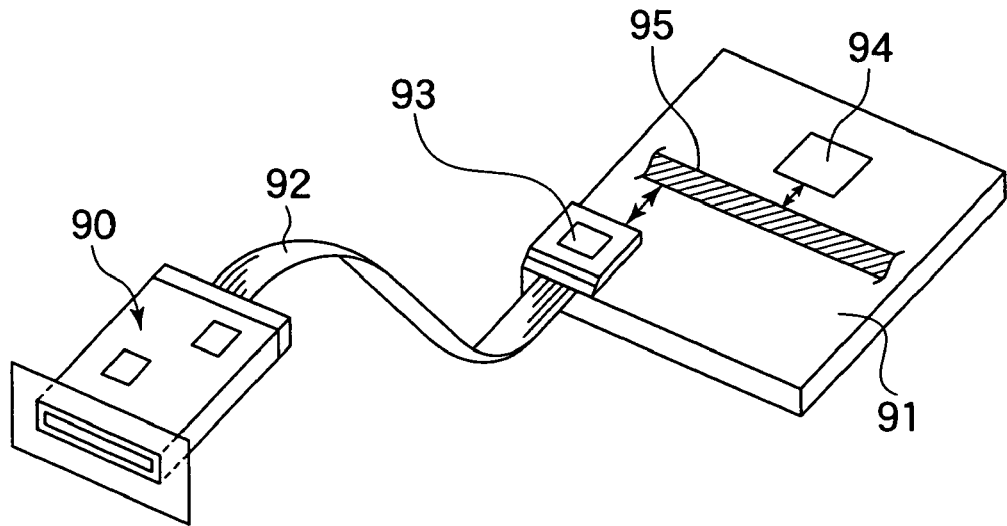
FIG. 43 shows a schematic structure of a connecting device, which is operable to receive the memory card, and the card holder to which is applied the semiconductor memory system according to the tenth embodiment of the present invention.

Another application example is described while referencing FIG. 43. In FIG. 43, a connecting apparatus 90 capable of receiving the memory card 60 or memory card holder 80 is disclosed. A semiconductor memory described in detail in the first through ninth embodiments of the present invention is embedded in either the memory card 60 or memory card holder 80 and is used as the MONONOS semiconductor memory 50, MONONOS semiconductor memory region 501, MONONOS memory mixed MPU 502, and/or ROM region included EEPROM mode MONONOS flash memory 503. The memory card 60 or memory card holder 80 is attached to the connecting apparatus 90, and connected electrically. The connecting apparatus 90 is connected to a circuit board 91 which mounts a CPU 94 and bus 94 via a connecting wire 92 and interface circuit 93.

APPLICATION EXAMPLE 9

Figure 44:
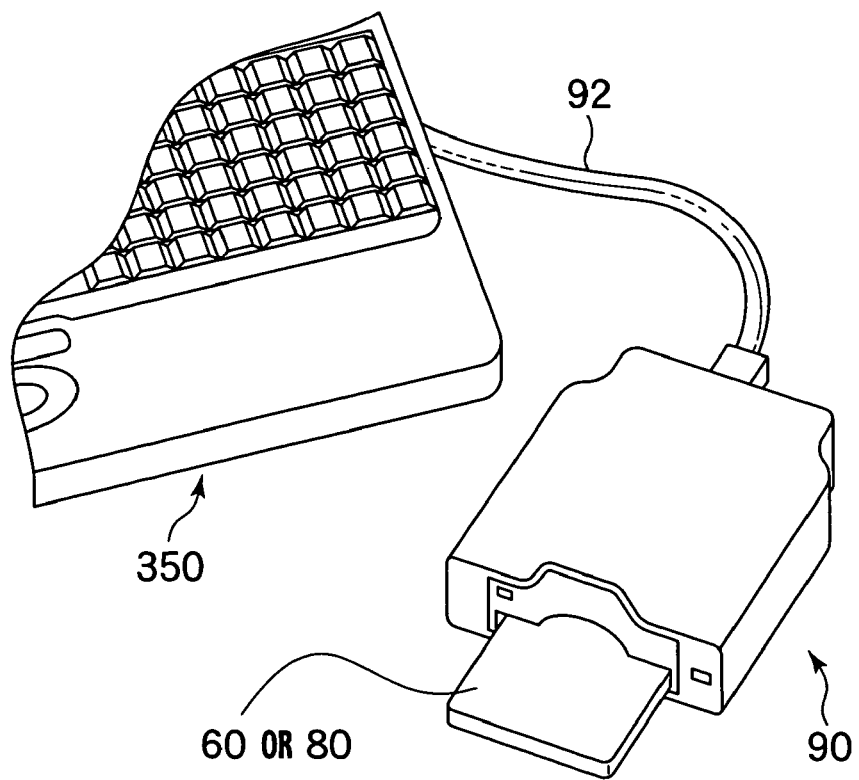
FIG. 44 shows a schematic structure of a coupling device for connecting to a personal computer via a connecting wire with an internal memory card to which is applied the semiconductor memory system according to the tenth embodiment of the present invention.

Another application example is described while referencing FIG. 44. A semiconductor memory described in detail in the first through ninth embodiments of the present invention is embedded in either the memory card 60 or memory card holder 80 and is used as the MONONOS semiconductor memory 50, MONONOS semiconductor memory region 501, MONONOS memory mixed MPU 502, and/or ROM region included EEPROM mode MONONOS flash memory 503. The memory card 60 or memory card holder 80 is attached to the connecting apparatus 90, and connected electrically. The connecting apparatus 90 is connected to a personal computer (PC) 350 via a connecting wire 92.

APPLICATION EXAMPLE 10

Figure 45:
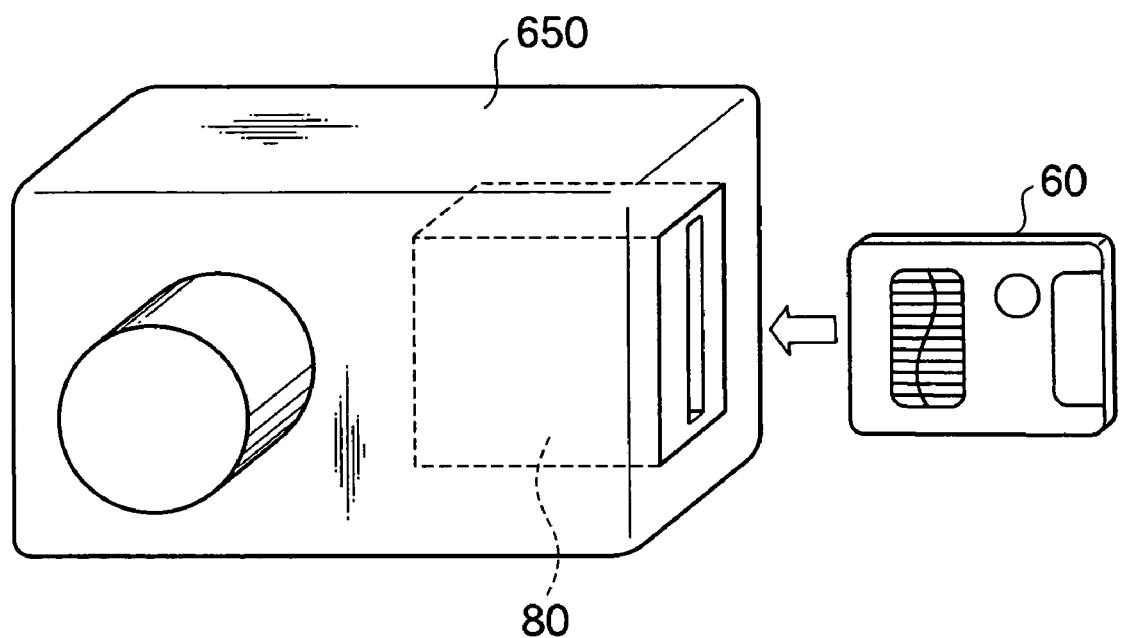
FIG. 45 is a digital camera system allowing loading of a memory card to which is applied the semiconductor memory system according to the tenth embodiment of the present invention.

Another application example is described while referencing FIG. 45. A semiconductor memory described in detail in the first through ninth embodiments of the present invention is embedded in the memory card 60 as the MONONOS semiconductor memory 50, MONONOS semiconductor memory region 501, MONONOS memory mixed MPU 502, and/or ROM region included EEPROM mode MONONOS flash memory 503. FIG. 45 shows an example of applying such memory card 60 to a digital camera 650 in which the memory card holder 80 is embedded.

APPLICATION EXAMPLE 11

Figure 46:
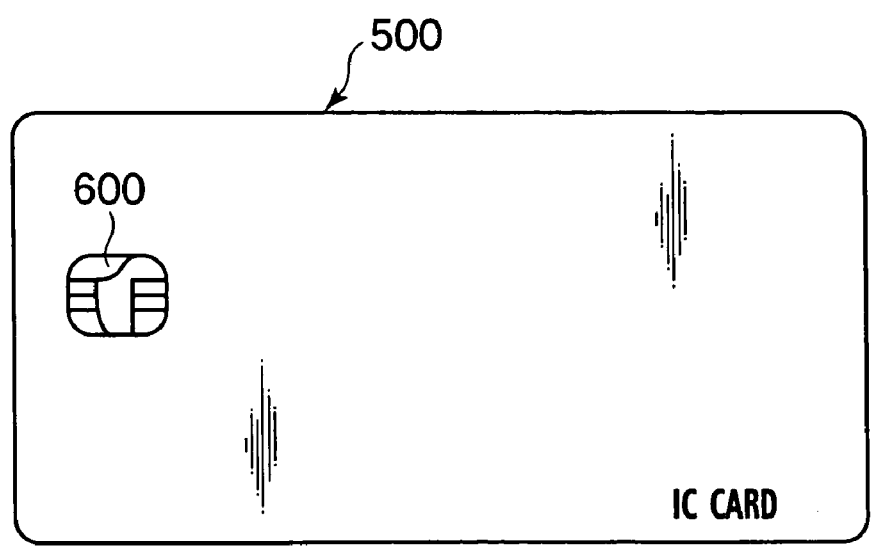
FIG. 46 shows a schematic structure of an IC card to which is applied the semiconductor memory system according to the tenth embodiment of the present invention.
Figure 47:
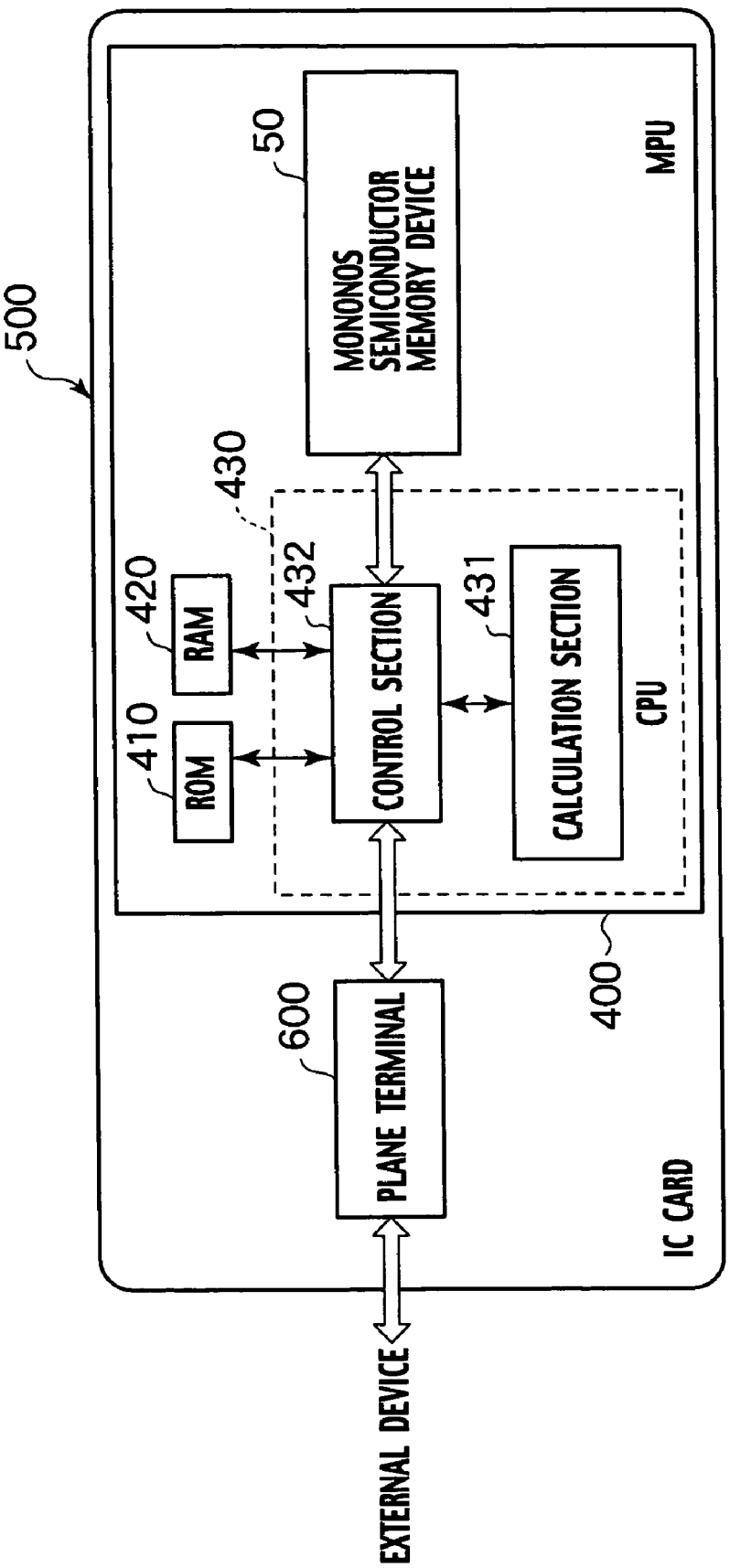
FIG. 47 is a schematic block diagram illustrating the internal structure of an IC card to which is applied the semiconductor memory system according to the tenth embodiment of the present invention.

Another application example of the semiconductor memory according to the first through ninth embodiments of the present invention configures, as shown in FIG. 46 and FIG. 47, an interface circuit (IC) card 500 which includes an MPU 400 configured with a MONONOS semiconductor memory 50, ROM 410, RAM 420, and CPU 430, and a plane terminal 600. The IC card 500 may be connected to an external device via the plane terminal 600. In addition, the plane terminal 600 is coupled to the MPU 400 in the IC card 500. The CPU 430 has a calculation section 431 and control section 432. The control section 432 is coupled to the MONONOS semiconductor memory 50, ROM 410, and RAM 420. It is desirable that the MPU 400 be molded on one of the surfaces of the IC card 500, and the plane terminal 600 be manufactured on the other surface of the IC card 500. As shown in FIG. 47, the semiconductor memory described in detail in the first through ninth embodiments of the present invention is applicable to the MONONOS semiconductor memory 50 or ROM 410. In addition, it is possible for the semiconductor memory to operate in page mode, byte mode, or ROM region included EEPROM mode.

APPLICATION EXAMPLE 12

Figure 48:
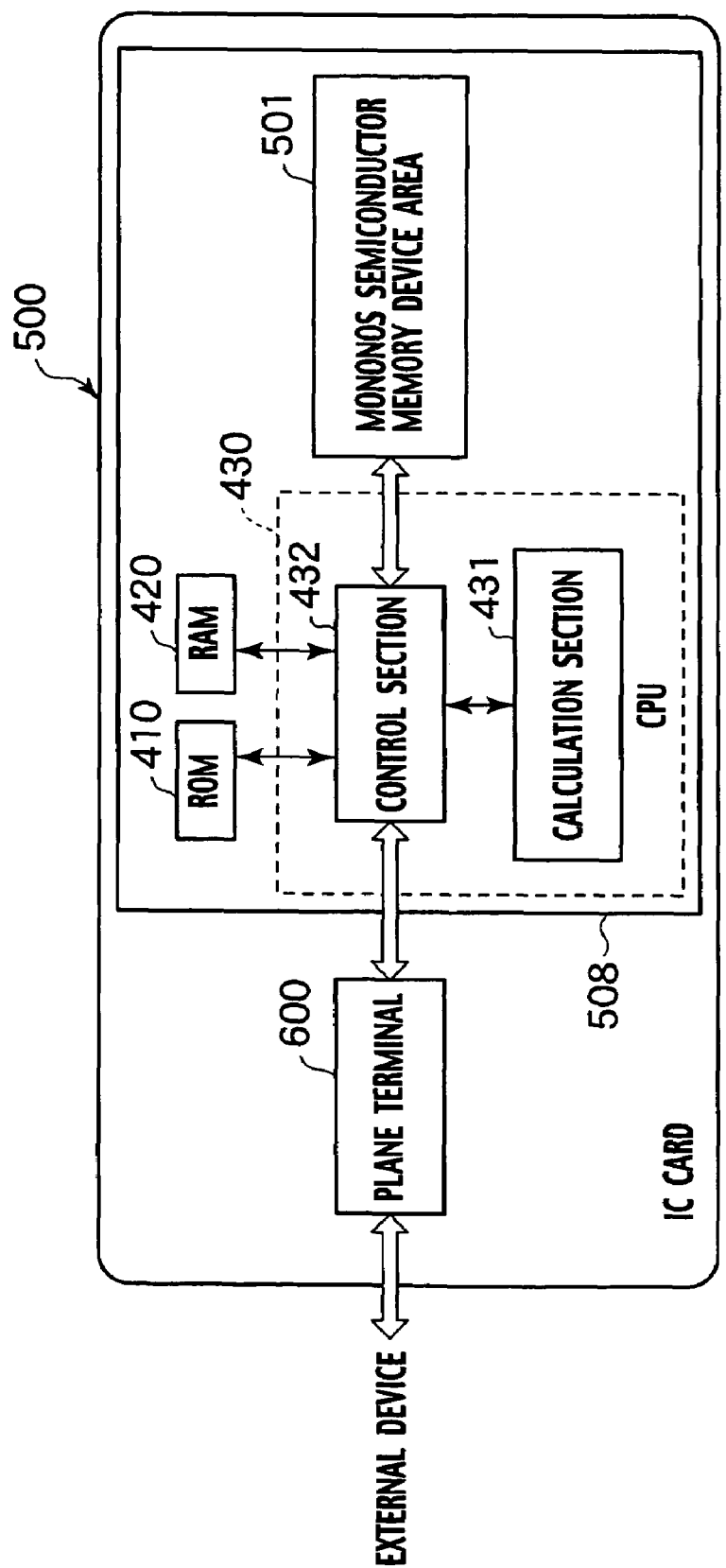
FIG. 48 is a schematic block diagram illustrating the internal structure of the IC card to which is applied the semiconductor memory system according to the tenth embodiment of the present invention.

Another exemplary structure of the IC card 500 includes, as shown in FIG. 48, a system LSI chip 508 with ROM 410, RAM 420, a CPU 430, and a MONONOS semiconductor memory region 501 integrated onto one chip. Such system LSI chip 508 is embedded in the IC card 500. As shown in FIG. 48, the semiconductor memory described in detail in the first through ninth embodiments of the present invention is applicable to the MONONOS semiconductor memory region 501 or ROM 410. In addition, it is possible for the semiconductor memory to operate in page mode, byte mode, or ROM region included EEPROM mode.

APPLICATION EXAMPLE 13

Figure 49:
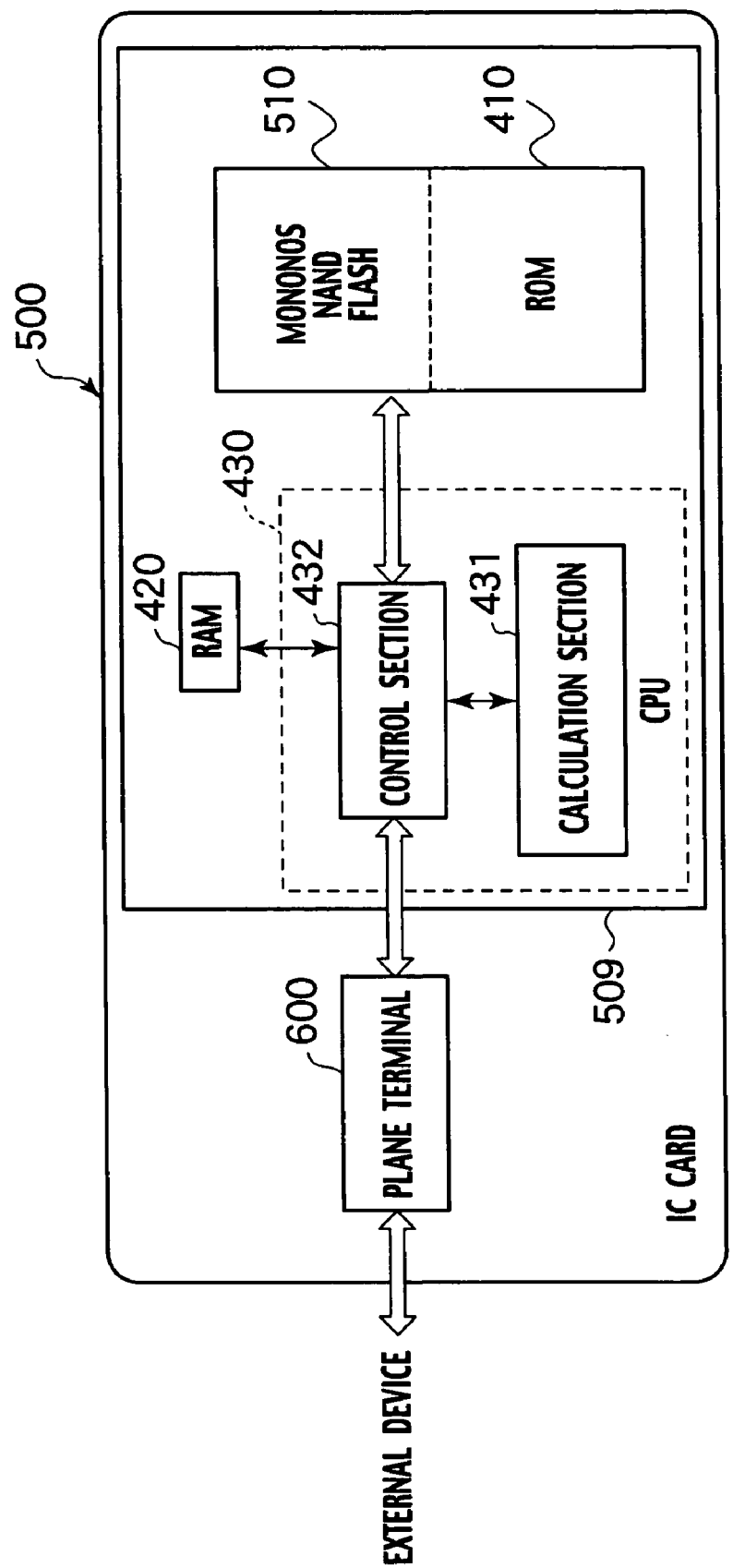
FIG. 49 is a schematic block diagram illustrating the internal structure of the IC card to which is applied the semiconductor memory system according to the tenth embodiment of the present invention.

Another exemplary structure of the IC card 500, as shown in FIG. 49, has an overall ROM region included EEPROM mode MONONOS flash memory 510 structure with an embedded ROM 410 in the MONONOS semiconductor memory region 501, and configures a system LSI chip 509 by integrating the ROM region included EEPROM mode MONONOS flash memory 510, RAM 420, and CPU 430 all onto one chip. Such system LSI chip 509 is embedded in the IC card 500.

APPLICATION EXAMPLE 14

Figure 50:
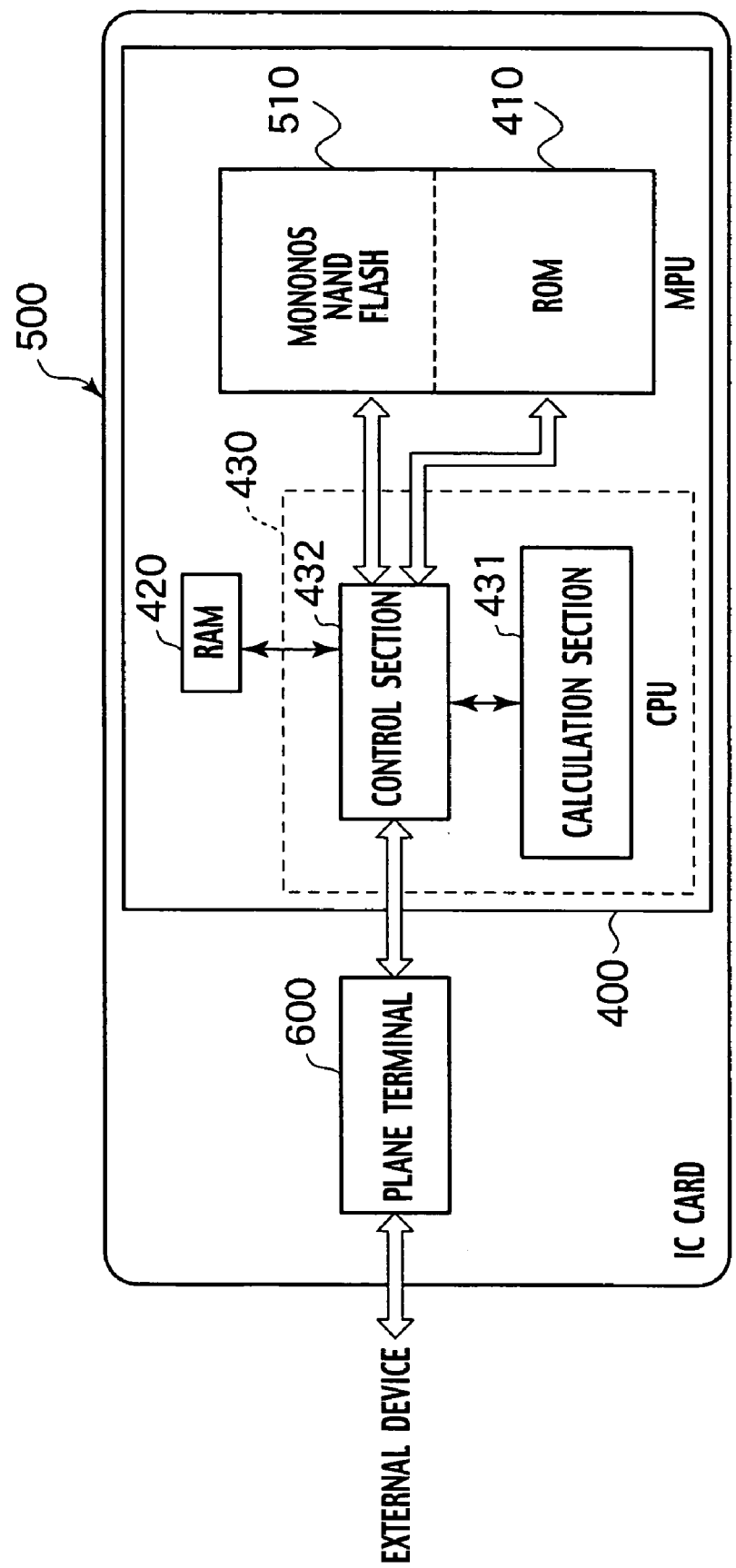
FIG. 50 is a schematic block diagram illustrating the internal structure of the IC card to which is applied the semiconductor memory system according to the tenth embodiment of the present invention.

Another exemplary structure of the IC card 500, as shown in FIG. 50, has an overall ROM region included EEPROM mode MONONOS flash memory 510 structure with an embedded ROM 410 in the MONONOS semiconductor memory 50 shown in FIG. 47. Such ROM region included EEPROM mode MONONOS flash memory 510 is embedded in the MPU 400 as with FIG. 47.

In addition to the foregoing application examples, the embodiments of the present invention can be modified and implemented in various ways as long as not deviating from the summary of the present invention.

Other Embodiments

As described above, the present invention is described according to embodiments, however, it should not be perceived that descriptions forming a part of this disclosure and drawings are intended to limit the present invention. Various alternative embodiments, working examples, and operational techniques will become apparent from this disclosure for those skills in the art. Accordingly, technical range of the present invention is determined only by specified features of the invention according to the above-mentioned descriptions and appropriate appended claims.

Various modifications will become possible for those skilled in the art after receiving the teachings of the present disclosure without departing from the scope thereof.

In this manner, the present invention naturally includes various embodiments not described herein. Accordingly, the technical range of the present invention is determined only by the above-described descriptions and appropriate appended claims.

According to the semiconductor memory of the present invention, it is possible to provide more control of electron injection from a control electrode to a charge storage layer than in the conventional example where a single layer block insulating film is used when an erase operation is performed using hole injection from a semiconductor substrate to the charge storage layer. At the same time, the thickness of a first gate insulating layer is constant, and the effective film thickness converted to a silicon oxide film in a block insulating film configured with a second insulating layer, a second charge storage layer, and a third insulating layer may be maintained constant. Accordingly, it is possible to maintain the applied electric field during programming constant as with the conventional example, and to prevent the programming speed from decreasing. Accordingly, isolation of the programming threshold voltage and the erasure threshold voltage may be secured, and the reliability of data may be further improved. Furthermore, even in the case of using the first silicon oxide film, thickness of which is equivalent to the conventional example, the absolute value of the gate voltage upon erasure may be further increased for providing the same erasure threshold voltage as that of the conventional example. Accordingly, the erase time may be reduced. In this case, since first silicon oxide film thickness is constant, the retention characteristics of the electrons can be preserved as with the conventional example without increasing the quantity of charge leaking through the first silicon oxide film thickness.

What is claimed is:

1. A semiconductor memory having an electrically writable/erasable memory cell comprising:
   a first gate insulating layer made from a compound containing at least silicon and oxygen;
   a first charge storage layer being in contact with the first gate insulating layer, and made from a silicon nitride film, a silicon oxynitride film, or an alumina film;
   a second insulating layer;
   a fourth insulating layer being in contact with the second insulating layer having a maximum volume density of boron that is greater than a maximum volume density of boron in the second insulating layer;
   a third insulating layer being in contact with the fourth insulating layer having a maximum volume density of boron that is less than the maximum volume density of boron in the fourth insulating layer; and
   a control electrode on the third insulating layer.

2. The semiconductor memory of claim 1, wherein the memory cell further comprises a memory cell transistor including;
   a first conductivity type semiconductor region; and
   first and second terminal regions, each of which comprises a second conductivity type semiconductor region formed on the first conductivity type semiconductor region.

3. The semiconductor memory of claim 2, wherein the first gate insulating layer is formed so as to contact with at least the first or the second terminal region,
   wherein a threshold voltage of the memory cell transistor is controlled by applying a negative voltage to the control electrode relative to the first terminal region, so as to provide a current flow between the fourth insulating layer and the control electrode.

4. The semiconductor memory of claim 2, wherein a threshold voltage of the memory cell transistor is controlled by applying a negative voltage to the control electrode relative to the first conductivity type semiconductor region so as to provide a current flow between the fourth insulating layer and the control electrode.

5. The semiconductor memory of claim 2 comprising:
   a data rewritable first memory cell unit implemented by a plurality of memory cells and a first select transistor;
   a data rewritable second memory cell unit implemented by a plurality of memory cells and a second select transistor; and
   a well of one conductivity type;
   wherein
   the first and the second memory cell units include the first terminal regions of the memory cell transistors connected to respective first terminal regions of the first and second select transistors,
   a second terminal region of the first select transistor in the first memory cell unit is electrically connected to a second terminal region of the second select transistor in the second memory cell unit, and
   the plurality of memory cell units are formed on the well.

6. The semiconductor memory of claim 5, wherein the first and second memory cell unit further comprises a plurality of data select lines formed in parallel in a direction orthogonal to data transfer lines,
   wherein,
   a memory matrix is formed by the data transfer lines and the data select lines, and
   a control input to the first and second select transistors is connected to control lines formed in parallel with the data select lines.

* * * * *